(12) United States Patent  
Yamanaka

(10) Patent No.: US 8,933,612 B2  
(45) Date of Patent: Jan. 13, 2015

(54) SURFACE ACOUSTIC WAVE RESONATOR, SURFACE ACOUSTIC WAVE OSCILLATOR, AND ELECTRONIC INSTRUMENT

(75) Inventor: Kunihito Yamanaka, Kamiina-gun (JP)

(73) Assignee: Seiko Epson Corporation, Tokyo (JP)

( * ) Notice: Subject to any disclaimer, the term of this patent is extended or adjusted under 35 U.S.C. 154(b) by 9 days.

(21) Appl. No.: 13/460,149

(22) Filed: Apr. 30, 2012

(65) Prior Publication Data

US 2012/0212301 A1    Aug. 23, 2012

Related U.S. Application Data

(63) Continuation of application No. 12/713,461, filed on Feb. 26, 2010.

(30) Foreign Application Priority Data

Feb. 27, 2009  (JP) ................ 2009-045359  
Mar. 4, 2009   (JP) ................ 2009-050112

(51) Int. Cl.
   *H03H 9/25*    (2006.01)  
   *H03H 9/02*    (2006.01)  
   *H03H 9/145*   (2006.01)

(52) U.S. Cl.  
   CPC ....... *H03H 9/14538* (2013.01); *H03H 9/02551* (2013.01); *H03H 9/14594* (2013.01)  
   USPC .................................... 310/313 A

(58) Field of Classification Search  
   USPC .................................... 310/313 A  
   See application file for complete search history.

(56) References Cited

U.S. PATENT DOCUMENTS

| | | | |
|---|---|---|---|
| 382,217 A | 5/1888 | Davies | |
| 4,130,813 A | 12/1978 | Sandy et al. | |
| 4,387,355 A | 6/1983 | Uno et al. | |
| 4,837,355 A | 6/1989 | Watson | |
| 5,179,310 A | 1/1993 | Satoh et al. | |
| 5,757,250 A | 5/1998 | Ichikawa et al. | |
| 5,895,996 A | 4/1999 | Takagi et al. | |
| 6,154,105 A | 11/2000 | Fujimoto et al. | |

(Continued)

FOREIGN PATENT DOCUMENTS

| CN | 1336036 A | 2/2002 |
|---|---|---|
| CN | 1434568 A | 8/2003 |

(Continued)

OTHER PUBLICATIONS

Shimizu, Yasutaka, et al. "A New Cut of Quartz for SAW With More Stable Temperature Characteristics", Tokyo Institute of Technology, Nippon Electric Co., Ltd., Mar. 26, 1982, pp. 558-564.

(Continued)

*Primary Examiner* — Thomas Dougherty  
(74) *Attorney, Agent, or Firm* — Harness, Dickey & Pierce, P.L.C.

(57) ABSTRACT

A SAW resonator which, using a quartz crystal substrate with Euler angles ($-1.5° \leq \phi \leq 1.5°$, $117° \leq \theta \leq 142°$, and $41.9° \leq |\psi| \leq 49.57°$), includes an IDT that excites a stop band upper end mode SAW, and an inter-electrode finger groove provided between electrode fingers configuring the IDT. When a wavelength of the SAW is $\lambda$, a first depth of the inter-electrode finger groove is G, a line occupation rate of the IDT is $\eta$, and an electrode film thickness of the IDT is H, $\lambda$, G, $\eta$ and H satisfy the relationship of $0 < H \leq 0.005\lambda$, $0.01\lambda \leq G \leq 0.09\lambda$, and $0.18 \leq \eta \leq 0.71$.

14 Claims, 50 Drawing Sheets

(56) References Cited

U.S. PATENT DOCUMENTS

| | | |
|---|---|---|
| 6,329,888 B1 | 12/2001 | Hirota |
| 6,414,414 B1 | 7/2002 | Wright |
| 6,674,215 B1 | 1/2004 | Yoshida et al. |
| 6,774,747 B2 | 8/2004 | Yamazaki et al. |
| 6,784,595 B2 | 8/2004 | Iizawa et al. |
| 6,856,218 B2 | 2/2005 | Yamazaki et al. |
| 6,946,930 B2 | 9/2005 | Kadota et al. |
| 7,027,921 B2 | 4/2006 | Kalantar-Zadeh et al. |
| 7,135,805 B2 | 11/2006 | Yamanouchi |
| 7,315,805 B2 | 1/2008 | Slater |
| 7,352,104 B2 | 4/2008 | Yamazaki et al. |
| 7,382,217 B2 | 6/2008 | Morita et al. |
| 7,589,451 B2 | 9/2009 | Morita et al. |
| 7,696,675 B2 | 4/2010 | Kanna |
| 8,063,534 B2 | 11/2011 | Iizawa |
| 8,084,918 B2 | 12/2011 | Iizawa |
| 8,237,326 B2 | 8/2012 | Iizawa |
| 8,305,162 B2 | 11/2012 | Yamanaka |
| 8,502,625 B2 | 8/2013 | Yamanaka |
| 8,598,766 B2 | 12/2013 | Owaki et al. |
| 2002/0171512 A1 | 11/2002 | Kadota et al. |
| 2003/0030513 A1 | 2/2003 | Yamazaki et al. |
| 2003/0052572 A1 | 3/2003 | Iizawa et al. |
| 2003/0111931 A1 | 6/2003 | Suzuki et al. |
| 2003/0146810 A1 | 8/2003 | Yamazaki et al. |
| 2003/0168932 A1 | 9/2003 | Shibata et al. |
| 2004/0135469 A1 | 7/2004 | Kanna |
| 2004/0174233 A1 | 9/2004 | Takayama et al. |
| 2004/0201306 A1 | 10/2004 | Yamanouchi |
| 2005/0122179 A1 | 6/2005 | Ogiso |
| 2005/0127781 A1 | 6/2005 | Yamazaki et al. |
| 2005/0168302 A1 | 8/2005 | Orito et al. |
| 2006/0108894 A1 | 5/2006 | Kanna |
| 2006/0145568 A1 | 7/2006 | Morita et al. |
| 2007/0103038 A1 | 5/2007 | Kamijo |
| 2007/0182278 A1 | 8/2007 | Kanna |
| 2007/0296522 A1 | 12/2007 | Takamine |
| 2008/0067891 A1 | 3/2008 | Matsuda et al. |
| 2008/0079512 A1 | 4/2008 | Nakazawa et al. |
| 2008/0084134 A1 | 4/2008 | Morita et al. |
| 2009/0021108 A1 | 1/2009 | Owaki et al. |
| 2009/0026955 A1 | 1/2009 | Otterstatter et al. |
| 2009/0206955 A1 | 8/2009 | Iizawa |
| 2010/0001617 A9 | 1/2010 | Kanna |
| 2010/0219913 A1 | 9/2010 | Yamanaka |
| 2010/0244626 A1 | 9/2010 | Yamanaka |
| 2011/0199163 A1 | 8/2011 | Yamanaka |
| 2011/0309897 A1 | 12/2011 | Yamanaka |
| 2012/0049969 A1 | 3/2012 | Owaki et al. |
| 2012/0049979 A1 | 3/2012 | Owaki et al. |
| 2012/0062069 A1 | 3/2012 | Yamanaka |
| 2012/0062070 A1 | 3/2012 | Yamanaka et al. |
| 2012/0062329 A1 | 3/2012 | Yamanaka |
| 2012/0068573 A1 | 3/2012 | Obata |
| 2012/0086308 A1 | 4/2012 | Obata et al. |
| 2012/0139652 A1 | 6/2012 | Yamanaka |
| 2012/0212301 A1 | 8/2012 | Yamanaka |
| 2012/0223411 A1 | 9/2012 | Cho et al. |
| 2013/0027147 A1 | 1/2013 | Yamanaka |
| 2014/0055207 A1 | 2/2014 | Owaki et al. |

FOREIGN PATENT DOCUMENTS

| | | |
|---|---|---|
| CN | 1619956 A | 5/2005 |
| CN | 101820265 A | 9/2010 |
| JP | 54-156455 | 12/1979 |
| JP | 57-005418 | 1/1982 |
| JP | 57-5418 | 1/1982 |
| JP | 57-99813 | 6/1982 |
| JP | 5799813 A | 6/1982 |
| JP | 58-033309 | 2/1983 |
| JP | 61-092011 | 5/1986 |
| JP | 6388910 | 4/1988 |
| JP | 01034411 A | 2/1989 |
| JP | 64-068114 A | 3/1989 |
| JP | 1-34411 | 7/1989 |
| JP | 01-231412 | 9/1989 |
| JP | 2-189011 | 7/1990 |
| JP | 03-284009 | 12/1991 |
| JP | 05-007124 | 1/1993 |
| JP | 05-090865 | 4/1993 |
| JP | 590865 | 4/1993 |
| JP | 08-307190 | 11/1996 |
| JP | 10-270974 | 10/1998 |
| JP | 11-214958 | 8/1999 |
| JP | 11-214958 A | 8/1999 |
| JP | 11-298290 | 10/1999 |
| JP | 2000-188521 | 7/2000 |
| JP | 2000-216632 A | 8/2000 |
| JP | 3216137 B2 | 10/2001 |
| JP | 2002-100959 | 4/2002 |
| JP | 2002-517933 | 6/2002 |
| JP | 2002-330051 | 11/2002 |
| JP | 2003-124780 | 4/2003 |
| JP | 2003-152487 | 5/2003 |
| JP | 2003-188675 A | 7/2003 |
| JP | 2003-258601 | 9/2003 |
| JP | 2003-283282 A | 10/2003 |
| JP | 2005-012736 | 1/2005 |
| JP | 2005-204275 | 7/2005 |
| JP | 2006-013576 A | 1/2006 |
| JP | 2006-074136 | 3/2006 |
| JP | 2006-148622 | 6/2006 |
| JP | 2006-186623 | 7/2006 |
| JP | 2006-203408 | 8/2006 |
| JP | 2006-295311 | 10/2006 |
| JP | 2006-339742 | 12/2006 |
| JP | 3851336 | 12/2006 |
| JP | 2007-028664 | 2/2007 |
| JP | 2007-074754 A | 3/2007 |
| JP | 3897229 B2 | 3/2007 |
| JP | 2007-093213 | 4/2007 |
| JP | 2007-134932 A | 5/2007 |
| JP | 2007-142794 | 6/2007 |
| JP | 2007-208871 | 8/2007 |
| JP | 2007-259414 | 10/2007 |
| JP | 2007-267033 | 10/2007 |
| JP | 2007-281701 | 10/2007 |
| JP | 2007-300174 | 11/2007 |
| JP | 2007/300287 | 11/2007 |
| JP | 2007-333500 | 12/2007 |
| JP | 2008-005151 A | 1/2008 |
| JP | 2008-078739 A | 4/2008 |
| JP | 2008-078984 | 4/2008 |
| JP | 2008-092017 A | 4/2008 |
| JP | 2008-177886 A | 7/2008 |
| JP | 2008-236295 | 10/2008 |
| JP | 2008-278349 A | 11/2008 |
| JP | 2008-286520 | 11/2008 |
| JP | 2008-286521 | 11/2008 |
| JP | 2009-225420 | 10/2009 |
| JP | 2010-016523 A | 1/2010 |
| JP | 2010-233203 | 10/2010 |
| JP | 2010-233203 A | 10/2010 |
| WO | 2005-099089 | 10/2005 |
| WO | WO-2006-137464 A1 | 12/2006 |
| WO | WO-2010047114 A1 | 4/2010 |
| WO | 2010-098139 | 9/2010 |

OTHER PUBLICATIONS

"Manufacturing conditions and Characteristics of Groove-type SAW Resonator", Technological Research Report of the Institute of Electronics and Communication Engineers of Japan MW82-59 (1982).

(56) References Cited

OTHER PUBLICATIONS

Uno, Takehiko et al., "Fabrication of SAW Resonators With Groove Gratings and Their Characteristics", Electrical Communication Laboratories, NTT, pp. 45-52.

Shigeo Kanna, Yook-Kong Yong (The Institute of Electronics, Information and Communication Engineers), "Frequency-Temperature Analysis of Surface Acoustic Waves Using Finite Element Method", (Jun. 1999) (pp. 37-42) with English Translation.

K. Yamanaka et al., "High-Stability Saw Oscillators with Cubic Frequency Temperature Curve and Excellent Aging Characteristics", 2010 IEEE International Ultrasonics Symposium Proceedings, pp. 868-871 and 1 page IEEE Xplore abstract, conference date Oct. 11-14, 2010.

S. Kanna et al., "Temperaure Stability of Surface Acoustic Wave Resonators on the In-Plane Rotated 33 Degree Y-Cut Quartz", 2002 IEEE Ultrasonics Symposium Proceedings, vol. 1, pp. 101-104 and 1 page IEEE Xplore abstract, conference date Oct. 8-11, 2002.

$\eta = L / (L+S)$

FIG.10A
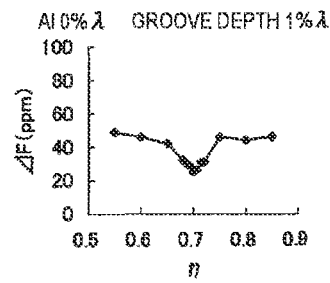
FIG.10B
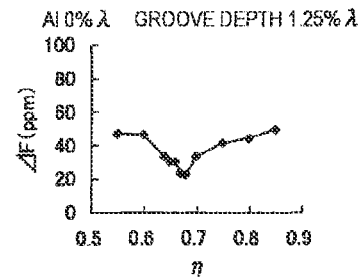
FIG.10C
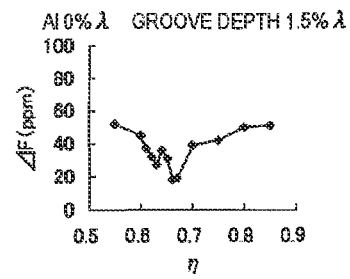
FIG.10D
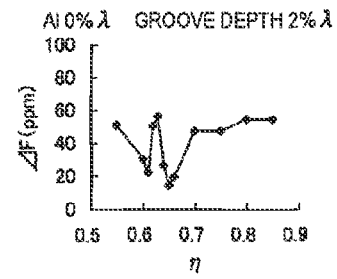
FIG.10E
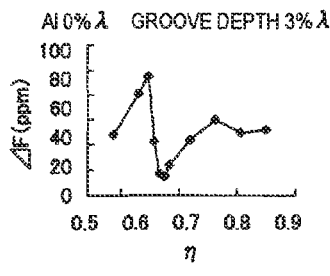
FIG.10F
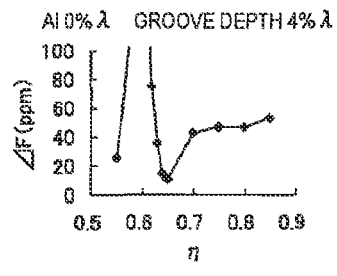
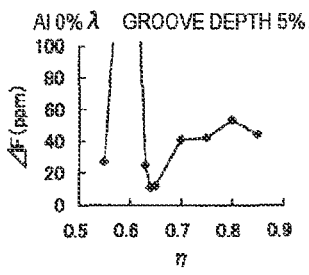
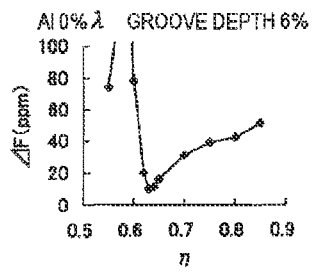
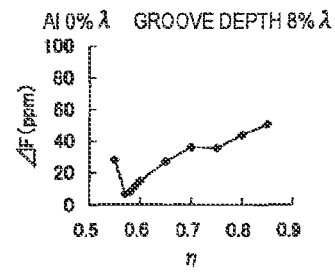
FIG.10G    FIG.10H    FIG.10I

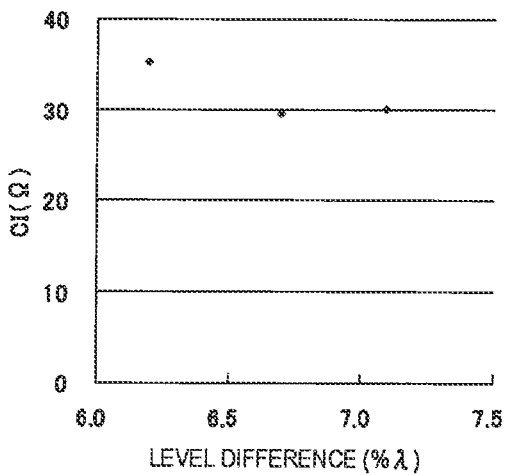
FIG.49
| | F | Q | γ | Cl | M |
|---|---|---|---|---|---|
| | MHz | | | Ω | |
| AVG | 318.25 | 13285 | 2476 | 21.8 | 5.4 |
FIG.50
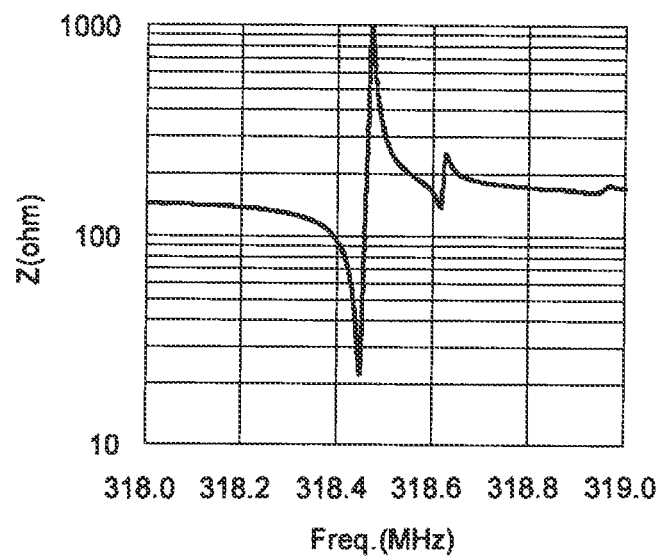
FIG.51

SURFACE ACOUSTIC WAVE RESONATOR, SURFACE ACOUSTIC WAVE OSCILLATOR, AND ELECTRONIC INSTRUMENT

CROSS-REFERENCE TO RELATED APPLICATIONS

This is a continuation application of U.S. application Ser. No. 12/713,461 filed Feb. 26, 2010, which claims priority to Japanese Patent Application No. 2009-050112 filed Mar. 4, 2009 and Japanese Patent Application No. 2009-045359 filed Feb. 27, 2009 all of which are expressly incorporated by reference in their entireties.

TECHNICAL FIELD

The present invention relates to a surface acoustic wave resonator, and to a surface acoustic wave oscillator in which the resonator is mounted, and in particular, relates to a type of surface acoustic wave resonator wherein grooves are provided in a substrate surface, and to a surface acoustic wave oscillator in which the resonator is mounted.

BACKGROUND ART

In a surface acoustic wave (SAW) device (for example, a SAW resonator), the effect of a SAW stop band, piezoelectric substrate (for example, quartz crystal substrate) cut angle, IDT (interdigital transducer) formation shape, and the like, on changes in frequency-temperature characteristics is considerable.

For example, a configuration exciting each of a SAW stop band upper end mode and lower end mode, the distribution of standing waves in each of the stop band upper end mode and lower end mode, and the like, are disclosed in JP-A-11-214958.

Also, points for which the SAW stop band upper end mode has better frequency-temperature characteristics than the stop band lower end mode are described in JP-A-2006-148622, JP-A-2007-208871, JP-A-2007-267033 and JP-A-2002-100959. Then, it is described in JP-A-2006-148622 and JP-A-2007-208871 that, in order to obtain good frequency-temperature characteristics in a SAW device utilizing a Rayleigh wave, as well as adjusting the cut angle of the quartz crystal substrate, the electrode standardizing film thickness (H/λ) is increased to around 0.1.

Also, it is described in JP-A-2007-267033 that, as well as adjusting the cut angle of the quartz crystal substrate in a SAW device utilizing a Rayleigh wave, the electrode standardizing film thickness (H/λ) is increased by around 0.045 or more.

Also, it is described in JP-A-2002-100959 that, by using a rotated Y-cut, X-propagating quartz crystal substrate, and utilizing the stop band upper end resonance, the frequency-temperature characteristics improve more than in the case of using the stop band lower end resonance.

Also, it is described in JP-A-57-5418 and "Manufacturing Conditions and Characteristics of Grooved SAW Resonators" (Institute of Electronics and Communication Engineers of Japan technical research report MW82-59 (1982)), that grooves (grooves) are provided between the electrode fingers configuring the IDT, and between the conductor strips configuring the reflectors, in a SAW device using an ST cut quartz crystal substrate. Also, it is described in "Manufacturing Conditions and Characteristics of Grooved SAW Resonators" that the frequency-temperature characteristics change depending on the depth of the grooves.

Also, in Japanese Patent No. 3,851,336, as well as describing a configuration for making a curve indicating the frequency-temperature characteristics a tertiary curve in a SAW device using an LST cut quartz crystal substrate, it is described that, in a SAW device using a Rayleigh wave, it has not been possible to find a cut angle substrate having the kind of temperature characteristics indicated by a tertiary curve.

Problems that the Invention is to Solve

As heretofore described, there is a wide range of elements for improving frequency-temperature characteristics, and it is thought that, particularly with a SAW device using a Rayleigh wave, increasing the film thickness of the electrodes configuring the IDT is one factor contributing to the frequency-temperature characteristics. However, the applicant has found experimentally that on increasing the film thickness of the electrodes, environmental resistance characteristics, such as temporal change characteristics and temperature and shock resistance characteristics, deteriorate. Also, when having the improvement of frequency-temperature characteristics as a principal object, it is necessary to increase the electrode film thickness, as previously described, and an accompanying deterioration of temporal change characteristics, temperature and shock resistance characteristics, and the like, is unavoidable. This also applying to the Q value, it is difficult to realize a higher Q without increasing the electrode film thickness.

Consequently, problems when providing the surface acoustic wave resonator and surface acoustic wave oscillator of the invention are, firstly, to realize good frequency-temperature characteristics, secondly, to improve the environmental resistance characteristics, and thirdly, to obtain a high Q value.

SUMMARY

The invention, having been contrived in order to solve at least one portion of the heretofore described problems, can be realized as the following embodiment or application examples.

APPLICATION EXAMPLE 1

A surface acoustic wave resonator provided on a quartz crystal substrate with Euler angles ($-1.5° \leq \phi \leq 1.5°$, $117° \leq \theta \leq 142°$, and $42.79° \leq |\psi| \leq 49.57°$) includes an IDT which excites a stop band upper end mode surface acoustic wave, and inter-electrode finger grooves hollowed out of the substrate positioned between electrode fingers configuring the IDT, wherein, when the wavelength of the surface acoustic wave is λ and the depth of the inter-electrode finger grooves is G, λ and G satisfy the relationship of

[Expression 1]

$$0.01\lambda \leq G \tag{1}$$

and wherein, when the line occupation rate of the IDT is η, the inter-electrode finger groove depth G and line occupation rate η satisfy the relationships of

[Expression 2]

$$-2.0000 \times G/\lambda + 0.7200 \leq \eta \leq -2.5000 \times G/\lambda + 0.7775 \tag{5}$$

provided that $$0.0100\lambda \leq G \leq 0.0500\lambda \tag{6}$$

[Expression 3]

$$-3.5898 \times G/\lambda + 0.7995 \leq \eta \leq -2.5000 \times G/\lambda + 0.7775$$

provided that $$0.0500\lambda < G \leq 0.0695\lambda \tag{6}$$

According to the surface acoustic wave resonator with these kinds of characteristic, it is possible to achieve an improvement in frequency-temperature characteristics.

APPLICATION EXAMPLE 2

With the surface acoustic wave resonator according to application example 1, the inter-electrode finger groove depth G satisfies the relationship of

[Expression 4]

$$0.01\lambda \leq G \leq -0.0695\lambda \tag{3}$$

According to the surface acoustic wave resonator with these kinds of characteristic, even in the event that the depth G of the inter-electrode finger grooves deviates due to manufacturing error, it is possible to keep the shift of resonance frequency between individual resonators within a correctable range.

APPLICATION EXAMPLE 3

With the surface acoustic wave resonator according to application example 1 or 2, when the electrode film thickness of the IDT is H, H satisfies the relationship of

[Expression 5]

$$0 < H \leq 0.035\lambda \tag{7}$$

According to the surface acoustic wave resonator with these kinds of characteristic, it is possible to realize an exhibition of good frequency-temperature characteristics in an operating temperature range. Also, by having these kinds of characteristic, it is possible to suppress the deterioration of environmental resistance characteristics accompanying an increase in the electrode film thickness.

APPLICATION EXAMPLE 4

With the surface acoustic wave resonator according to application example 3, the line occupation rate η satisfies the relationship of

[Expression 6]

$$\eta = -1963.06 \times (G/\lambda)^3 + 196.28 \times (G/\lambda)^2 - 6.53 \times (G/\lambda) - \\ 135.99 \times (H/\lambda)^2 + 5.817 \times (H/\lambda) + 0.732 - 99.99 \times (G/\lambda) \times (H/\lambda) \tag{8}$$

By fixing η in such a way as to satisfy Equation (8) in the range of the electrode film thickness in Application Example 3, it is possible to keep a secondary temperature coefficient substantially within ±0.01 ppm/° C.².

APPLICATION EXAMPLE 5

With the surface acoustic wave resonator according to application example 3 or 4, the sum of the inter-electrode finger groove depth G and electrode film thickness H satisfies the relationship of

[Expression 7]

$$0.0407\lambda \leq G + H$$

By fixing the sum of the inter-electrode finger groove depth G and electrode film thickness H as in the above equation, it is possible to obtain a higher Q value than with the heretofore known surface acoustic wave resonator.

APPLICATION EXAMPLE 6

With the surface acoustic wave resonator according to any one of application examples 1 to 5, ψ and θ satisfy the relationship of

[Expression 8]

$$\psi = 1.191 \times 10^{-3} \times \theta^3 - 4.490 \times 10^{-1} \times \theta^2 + 5.646 \times 10^1 \times \theta - 2.324 \times 10^3 \pm 1.0 \tag{31}$$

By manufacturing the surface acoustic wave resonator using a quartz crystal substrate cut out at cut angles with these kinds of characteristic, it is possible to obtain a surface acoustic wave resonator exhibiting good frequency-temperature characteristics in a wide range.

APPLICATION EXAMPLE 7

With the surface acoustic wave resonator according to any one of application examples 1 to 6, when a stop band upper end mode frequency in the IDT is ft2, a stop band lower end mode frequency in reflectors disposed in such a way as to sandwich the IDT in the propagation direction of the surface acoustic wave is fr1, and a stop band upper end mode frequency of the reflectors is fr2, ft2, fr1, and fr2 satisfy the relationship of

[Expression 9]

$$fr1 < ft2 < fr2 \tag{32}$$

By having these kinds of characteristic, a reflection coefficient |Γ| of the reflectors at the stop band upper end mode frequency ft2 of the IDT increases, and a stop band upper end mode surface acoustic wave excited with the IDT is reflected by the reflectors to the IDT side with a high reflection coefficient. Then, the stop band upper end mode surface acoustic wave energy confinement becomes stronger, and it is possible to realize a low-loss surface acoustic wave resonator.

APPLICATION EXAMPLE 8

With the surface acoustic wave resonator according to any one of application examples 1 to 7, inter-conductor strip grooves are provided between conductor strips configuring the reflectors, and the depth of the inter-conductor strip grooves is less than that of the inter-electrode finger grooves.

By having these kinds of characteristic, it is possible to make a frequency shift of the stop band of the reflectors to an area higher than the stop band of the IDT. For this reason, it is possible to realize the relationship of Equation (32).

APPLICATION EXAMPLE 9

A surface acoustic wave oscillator includes the surface acoustic wave resonator according to any one of application examples 1 to 8, and an IC for driving the IDT.

APPLICATION EXAMPLE 10

An electronic instrument includes the surface acoustic wave resonator according to application example 1 or 2.

APPLICATION EXAMPLE 11

An electronic instrument includes the surface acoustic wave resonator according to application example 3.

APPLICATION EXAMPLE 12

An electronic instrument includes the surface acoustic wave resonator according to application example 4.

APPLICATION EXAMPLE 13

An electronic instrument includes the surface acoustic wave resonator according to application example 5.

APPLICATION EXAMPLE 14

An electronic instrument includes the surface acoustic wave resonator according to application example 6.

APPLICATION EXAMPLE 15

An electronic instrument includes the surface acoustic wave resonator according to application example 7.

APPLICATION EXAMPLE 16

An electronic instrument includes the surface acoustic wave resonator according to application example 8.

APPLICATION EXAMPLE 17

An electronic instrument includes the surface acoustic wave resonator according to application example 9.

BRIEF DESCRIPTION OF THE DRAWINGS

FIG. 1A is a plan view of the configuration, FIG. 1B is a partial enlarged sectional view of a side surface, FIG. 1C is a partial enlarged view for describing details of FIG. 1B, and FIG. 1D, being the partial enlarged view of FIG. 1C, shows a sectional shape of a groove portion conceivable when manufacturing a SAW resonator using a photolithography technique and an etching technique;

FIG. 1A is an example of an appearance of tilting electrode fingers, making them perpendicular to an X' axis, and FIG. 1B is an example of the SAW device having an IDT in which bus bars connecting the electrode fingers are tilted;

FIG. 7A is a graph showing a displacement of a stop band upper end mode secondary temperature coefficient β when a groove depth G is 2% λ, FIG. 7B is a graph showing a displacement of a stop band lower end mode secondary temperature coefficient β when the groove depth G is 2% λ, FIG. 7C is a graph showing a displacement of the stop band upper end mode secondary temperature coefficient β when the groove depth G is 4% λ, and FIG. 7D is a graph showing a displacement of the stop band lower end mode secondary temperature coefficient β when the groove depth G is 4% λ;

FIG. 8A is a graph when the groove depth G is 1% λ, FIG. 8B is when the groove depth G is 1.25% λ, FIG. 8C is when the groove depth G is 1.5% λ, FIG. 8D is when the groove depth G is 2% λ, FIG. 8E is when the groove depth G is 3% λ, FIG. 8F is when the groove depth G is 4% λ, FIG. 8G is when the groove depth G is 5% λ, FIG. 8H is when the groove depth G is 6% λ, and FIG. 8I is when the groove depth G is 8% λ;

FIGS. 10A-10I are graphs showing a relationship between the line occupation rate η and a frequency fluctuation amount ΔF when changing the inter-electrode finger groove depth, with the electrode film thickness as 0, where FIG. 10A is a graph when the groove depth G is 1% λ, FIG. 10B is when the groove depth G is 1.25% λ, FIG. 10C is when the groove depth G is 1.5% λ, FIG. 10D is when the groove depth G is 2% λ, FIG. 10E is when the groove depth G is 3% λ, FIG. 10F is when the groove depth G is 4% λ, FIG. 10G is when the groove depth G is 5% λ, FIG. 10H is when the groove depth G is 6% λ, and FIG. 10I is when the groove depth G is 8% λ;

FIG. 12A is a graph when the electrode film thickness is 1% λ, FIG. 12B is when the electrode film thickness is 1.5% λ, FIG. 12C is when the electrode film thickness is 2% λ, FIG. 12D is when the electrode film thickness is 2.5% λ, FIG. 12E is when the electrode film thickness is 3% λ, and FIG. 12F is when the electrode film thickness is 3.5% λ;

FIG. 13A shows a relationship between the groove depth G and η1 when changing the electrode film thickness from 1% λ to 3.5% λ, and FIG. 13B is a diagram proving that an area in which |β|≤0.01 (ppm/° C.$^2$) is inside a polygon formed by linking points A to H;

FIG. 15A is a graph when the groove depth G is 0, FIG. 15B is when the groove depth G is 1% λ, FIG. 15C is when the groove depth G is 2% λ, FIG. 15D is when the groove depth G is 3% λ, FIG. 15E is when the groove depth G is 4% λ, and FIG. 15F is when the groove depth G is 5% λ;

FIG. 16A is a graph when the groove depth G is 0, FIG. 16B is when the groove depth G is 1% λ, FIG. 16C is when the groove depth G is 1.5% λ, FIG. 16D is when the groove depth G is 2.5% λ, FIG. 16E is when the groove depth G is 3.5% λ, and FIG. 16F is when the groove depth G is 4.5% λ;

FIG. 16A is a graph when the groove depth G is 0, FIG. 16B is when the groove depth G is 1% λ, FIG. 16C is when the groove depth G is 2% λ, FIG. 16D is when the groove depth G is 3% λ, FIG. 16E is when the groove depth G is 4% λ, and FIG. 16F is when the groove depth G is 5% λ;

FIG. 18A is a graph when the groove depth G is 0, FIG. 18B is when the groove depth G is 1% λ, FIG. 18C is when the groove depth G is 1.5% λ, FIG. 18D is when the groove depth G is 2.5% λ, FIG. 18E is when the groove depth G is 3.5% λ, and FIG. 18F is when the groove depth G is 4.5% λ;

FIG. 19B is when the groove depth G is 1% λ, FIG. 19C is when the groove depth G is 2% λ, FIG. 19D is when the groove depth G is 3% λ, FIG. 19E is when the groove depth G is 4% λ, and FIG. 19F is when the groove depth G is 5% λ;

FIG. 20A is a graph when the groove depth G is 0, FIG. 20B is when the groove depth G is 1% λ, FIG. 20C is when the groove depth G is 2% λ, FIG. 20D is when the groove depth G is 3% λ, FIG. 20E is when the groove depth G is 4% λ, and FIG. 20F is when the groove depth G is 5% λ;

FIG. 21A is a graph when the groove depth G is 0, FIG. 21B is when the groove depth G is 1% λ, FIG. 21C is when the groove depth G is 2% λ, FIG. 21D is when the groove depth G is 3% λ, FIG. 21E is when the groove depth G is 4% λ, and FIG. 21F is when the groove depth G is 5% λ;

FIG. 22A is a graph when the groove depth G is 0, FIG. 22B is when the groove depth G is 1% λ, FIG. 22C is when the groove depth G is 1.5% λ, FIG. 22D is when the groove depth G is 2.5% λ, FIG. 22E is when the groove depth G is 3.5% λ, and FIG. 22F is when the groove depth G is 4.5% λ;

FIG. 23A is a graph when the groove depth G is 0, FIG. 23B is when the groove depth G is 1% λ, (C) when the groove depth G is 2% λ, FIG. 23D is when the groove depth G is 3% λ, FIG. 23E is when the groove depth G is 4% λ, and FIG. 23F is when the groove depth G is 5% λ;

FIG. 24A is a graph when the groove depth G is 0, FIG. 24B is when the groove depth G is 1% λ, FIG. 24C is when the groove depth G is 1.5% λ, FIG. 24D is when the groove depth G is 2.5% λ, FIG. 24E is when the groove depth G is 3.5% λ, and FIG. 24F is when the groove depth G is 4.5% λ;

FIG. 25B is when the groove depth G is 1% λ, FIG. 25C is when the groove depth G is 2% λ, FIG. 25D is when the groove depth G is 3% λ, FIG. 25E is when the groove depth G is 4% λ, and FIG. 25F is when the groove depth G is 5% λ;

FIG. 26A is a graph when the groove depth G is 0, FIG. 26B is when the groove depth G is 1% λ, FIG. 26C is when the groove depth G is 2% λ, FIG. 26D is when the groove depth G is 3% λ, FIG. 26E is when the groove depth G is 4% λ, and FIG. 26F is when the groove depth G is 5% λ;

FIG. 27A shows the case of η1, and FIG. 27B is of η2;

FIG. 28A shows the case of η1, and FIG. 28B is of η2;

FIG. 29A shows the case of η1, and FIG. 29B is of η2;

FIG. 30A shows the case of η1, and FIG. 30B is of η2;

FIG. 31A shows the case of η1, and FIG. 31B is of η2;

FIG. 32A shows the case of η1, and FIG. 32B is of η2;

FIG. 33A shows the case of η1, and FIG. 33B is of η2;

FIG. 34A is a graph when the electrode film thickness is 1% λ, FIG. 34B is when the electrode film thickness is 1.5% λ, FIG. 34C is when the electrode film thickness is 2% λ, FIG. 34D is when the electrode film thickness is 2.5% λ, FIG. 34E is when the electrode film thickness is 3% λ, and FIG. 34F is when the electrode film thickness is 3.5% λ;

FIG. 38A is a graph showing a maximum value and minimum value of ψ, and FIG. 38B is a graph of an area of ψ which satisfies the requirement of β;

FIG. 39A is a graph showing a maximum value and minimum value of ψ, and FIG. 39B is a graph of an area of ψ which satisfies the requirement of β;

FIG. 40A is a graph showing a maximum value and minimum value of ψ, and FIG. 40B is a graph of an area of ψ which satisfies the requirement of β;

FIG. 41A is a graph showing a maximum value and minimum value of ψ, and FIG. 41B is a graph of an area of ψ which satisfies the requirement of β;

FIG. 42A is a graph showing a maximum value and minimum value of ψ, and FIG. 42B is a graph of an area of ψ which satisfies the requirement of β;

FIG. 43A is a graph showing a maximum value and minimum value of ψ, and FIG. 43B is a graph of an area of ψ which satisfies the requirement of β;

FIG. 44A is a graph showing a maximum value and minimum value of ψ, and FIG. 44B is a graph of an area of ψ which satisfies the requirement of β;

FIG. 49 is a graph showing a relationship between a level difference, which is the sum of the inter-electrode finger groove depth and electrode film thickness, and a CI value;

FIG. 50 is a table showing an example of an equivalent circuit constant and static characteristics of the SAW resonator according to the embodiment;

FIG. 51 is an impedance curve data of the SAW resonator according to the embodiment;

DETAILED DESCRIPTION

Figure 1A:
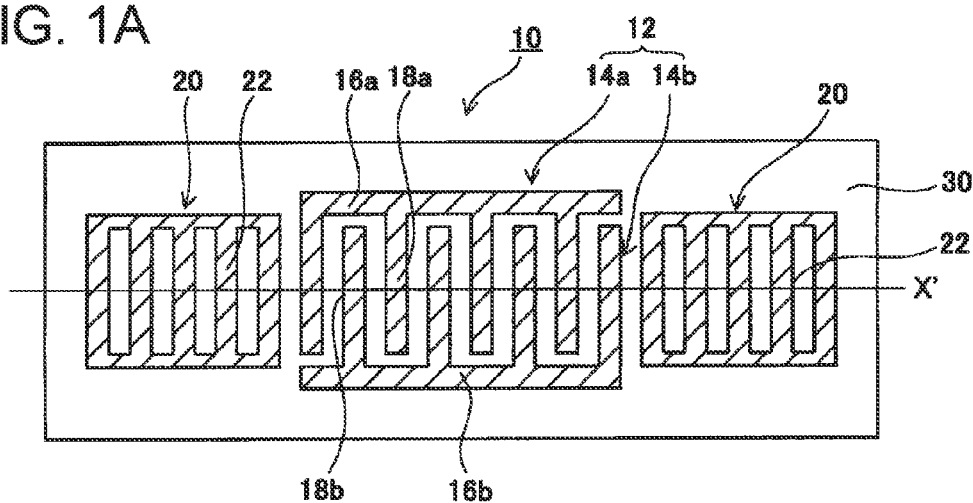
FIGS. 1A-1D are diagrams showing a configuration of a SAW device according to an embodiment, where

Hereafter, a detailed description will be given, while referring to the drawings, of an embodiment according to a surface acoustic wave resonator and surface acoustic wave oscillator of the invention.

Figure 1B:
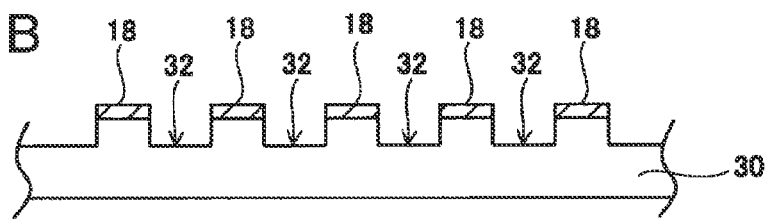
Figure 1C:
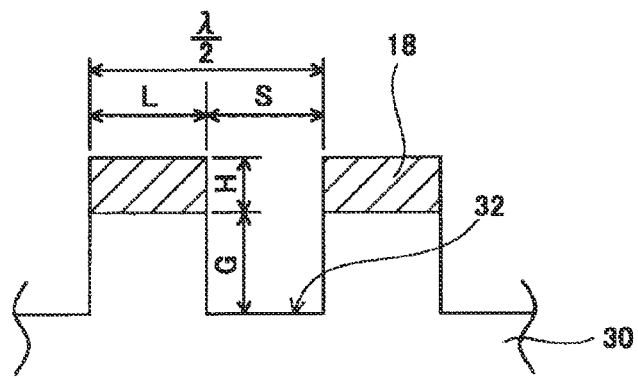
Figure 1D:
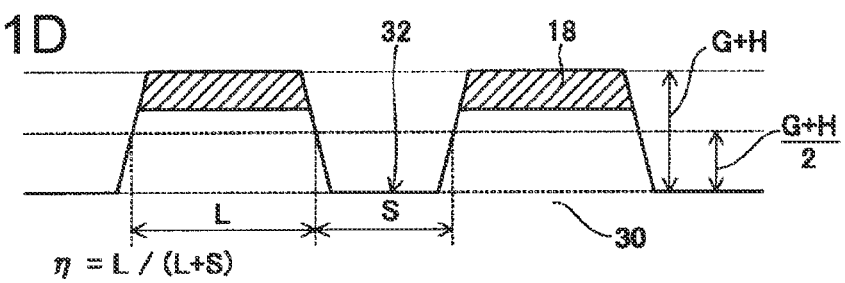

Firstly, referring to FIG. 1, a description will be given of a first embodiment according to the surface acoustic wave (SAW) resonator of the invention. Of FIG. 1, FIG. 1(A) is a plan view of the SAW resonator, FIG. 1(B) is a partial enlarged sectional view, FIG. 1(C) is an enlarged view for describing details of FIG. 1(B), and FIG. 1(D) is a diagram which, relating to the partial enlarged view of FIG. 1(C), is for describing an IDT electrode finger line occupation rate η identification method in the event that the sectional shape is not rectangular but trapezoidal, which is a conceivable sectional shape when the SAW resonator according to the invention is manufactured using a photolithography technique and an etching technique. It is appropriate that the line occupation rate η is a proportion occupied by a width L of a value (L+S), wherein a protrusion width L and a width S of a groove 32 are added, at a height from the bottom of the groove 32 which is ½ of (G+H), which is a value wherein a depth (bump height) G of the groove 32 and an electrode film thickness H are added.

The SAW resonator 10 according to the embodiment is basically configured of a quartz crystal substrate 30, IDT 12, and reflectors 20.

Figure 2:
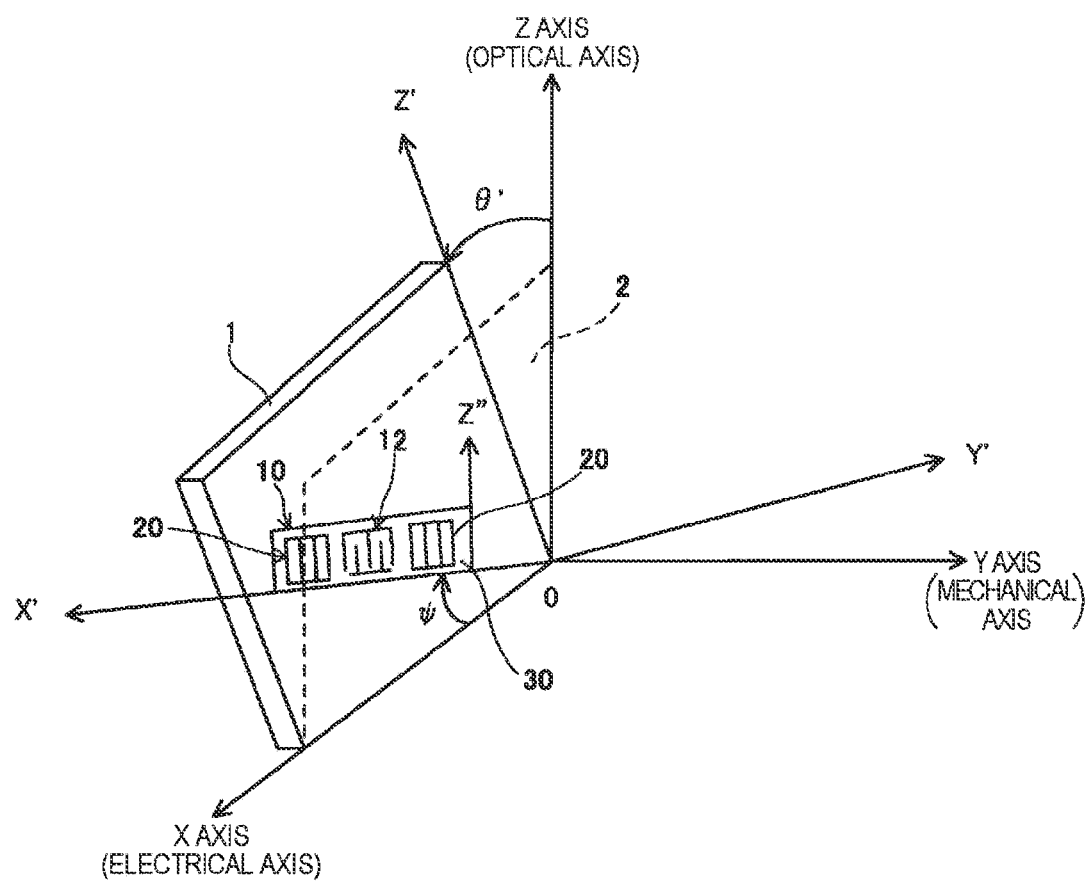
FIG. 2 is a diagram showing an orientation of a wafer which is a base material of a quartz crystal substrate used in the invention.

FIG. 2 is a diagram showing an orientation of a wafer 1, which is a base material of the quartz crystal substrate 30 used in the invention. In FIG. 2, an X axis is an electrical axis of the quartz crystal, a Y axis is a mechanical axis of the quartz crystal, and a Z axis is an optical axis of the quartz crystal. The wafer 1 has a surface wherein a surface 2 perpendicular to the Y axis is caused to rotate, with the X axis as a rotation axis, an angle of θ' degrees (degrees) in a direction rotating from a +Z axis toward a −Y axis. An axis perpendicular to the rotated surface is a Y' axis, and an axis parallel to the rotated surface, and perpendicular to the X axis, is a Z' axis. Furthermore, the IDT 12 and reflectors 20 configuring the SAW resonator 10 are disposed along an X' axis wherein the X axis of the quartz crystal is rotated, with the Y' axis as a rotation axis, +ψ degrees (or −ψ degrees), with a direction rotating from a +X axis toward a +Z' axis as positive. The quartz crystal substrate 30 configuring the SAW resonator 10 is diced by being cut out of the wafer 1. Although the shape in plan view of the quartz crystal substrate 30 is not particularly limited, it may, for example, be a rectangle which has short sides parallel to a Z'' axis, wherein the Z' axis is rotated +ψ degrees with the Y' axis as a rotation axis, and has long sides parallel to the X' axis. A relationship between θ' and an Euler angle θ is θ'=θ−90°.

In the embodiment, an in-plane rotation ST cut quartz crystal substrate expressed by Euler angles (−1°≤φ≤1°, 117°≤θ≤142°, and 42.79°≤|ψ|≤49.57°) is employed as the quartz crystal substrate 30. Herein, a description will be given of the Euler angles. A substrate expressed by Euler angles (0°, 0°, and 0°) is a Z cut substrate which has a main surface perpendicular to the Z axis. Herein, φ of Euler angles (φ, θ, and ψ), relating to a first rotation of the Z cut substrate, is a first rotation angle, with the Z axis as a rotation axis, and with a direction rotating from the +X axis to a +Y axis side as a positive rotation angle. The Euler angle θ, relating to a second rotation carried out after the first rotation of the Z cut substrate, is a second rotation angle, with the X axis after the first rotation as a rotation axis, and with a direction rotating from the +Y axis after the first rotation to the +Z axis as a positive rotation angle. The cut surface of a piezoelectric substrate is determined by the first rotation angle φ and second rotation angle θ. The Euler angle ψ, relating to a third rotation carried out after the second rotation of the Z cut substrate, is a third rotation angle, with the Z axis after the second rotation as a rotation axis, and with a direction rotating from the +X axis after the second rotation to the +Y axis side after the second rotation as a positive rotation angle. A propagation direction of the SAW is expressed by the third rotation angle ψ with respect to the X axis after the second rotation.

The IDT 12 including a pair of pectinate electrodes 14a and 14b wherein the base end portions of a plurality of electrode fingers 18a and 18b are connected by bus bars 16a and 16b respectively, the electrode finger 18a configuring one of the pectinate electrodes 14a, and the electrode finger 18b configuring the other pectinate electrode 14b, are alternately disposed with a predetermined space between them. Furthermore, the electrode fingers 18a and 18b are disposed in such a way that the extension direction of the electrode fingers 18a and 18b is perpendicular to the X' axis, which is the propagation direction of the surface acoustic wave, as shown in FIG. 1(A). A SAW excited by the SAW resonator 10 configured in this way, being a Rayleigh type (Rayleigh type) SAW, has oscillatory displacement elements on both the Y' axis and X' axis. Then, by displacing the SAW propagation direction from the X axis, which is the crystal axis of the quartz crystal, in this way, it is possible to excite a stop band upper end mode SAW.

Figure 3A:
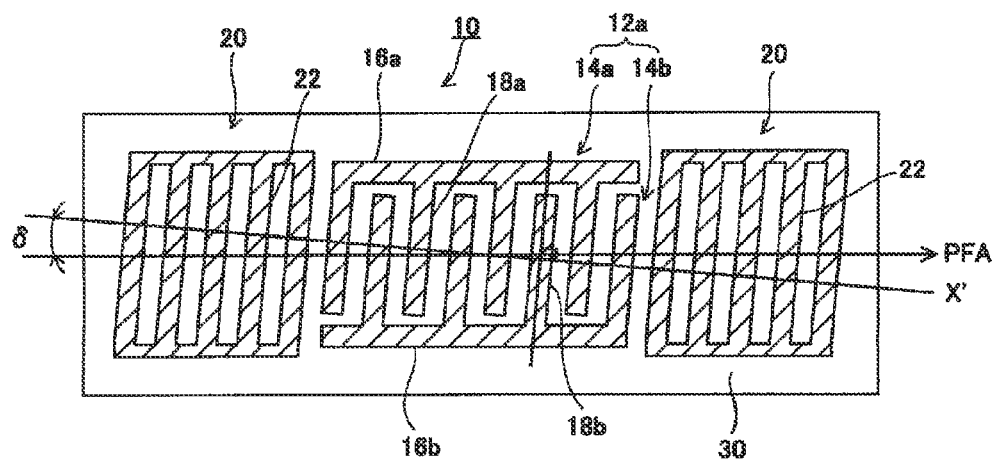
FIGS. 3A and 3B are diagrams showing configuration examples of the SAW device when employing a tilted type IDT, where

Also, furthermore, it is possible to give the SAW resonator 10 according to the invention the kinds of shape shown in FIG. 3. That is, even in the case of applying an IDT which is tilted by a power flow angle (hereafter called a PFA) δ from the X' axis, as shown in FIG. 3, it is possible to achieve a high Q by fulfilling the following requirements. FIG. 3(A) being a plan view showing a working example of a tilted type IDT 12a, the disposition conformation of the electrode fingers 18a and 18b in the tilted type IDT 12a is tilted in such a way that the X' axis, which is the SAW propagation direction determined by the Euler angles, and the direction of the electrode fingers 18a and 18b of the tilted type IDT 12a are in a perpendicular relationship.

Figure 3B:
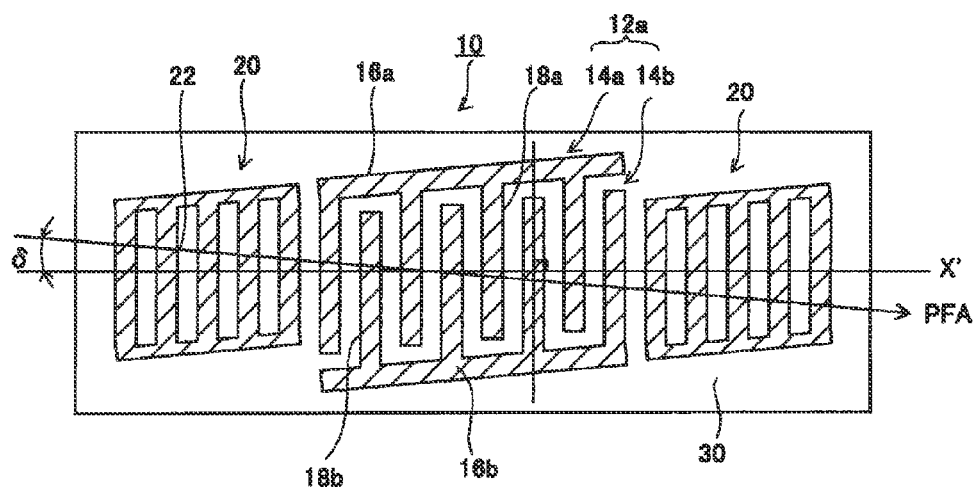

FIG. 3(B) is a plan view showing another working example of the tilted type IDT 12a. In the example, the electrode finger array direction is disposed tilted with respect to the X' axis by tilting the bus bars 16a and 16b connecting the electrode fingers 18a and 18b respectively, but the configuration is such that the X' axis and the extension direction of the electrode fingers 18a and 18b are in a perpendicular relationship, in the same way as in FIG. 3(A).

Whichever kind of tilted type IDT is used, by disposing the electrode fingers in such a way that a direction perpendicular to the X' axis is the extension direction of the electrode fingers, as in the working examples, it is possible to realize a low-loss SAW resonator, while maintaining good temperature characteristics in the invention.

Figure 4:
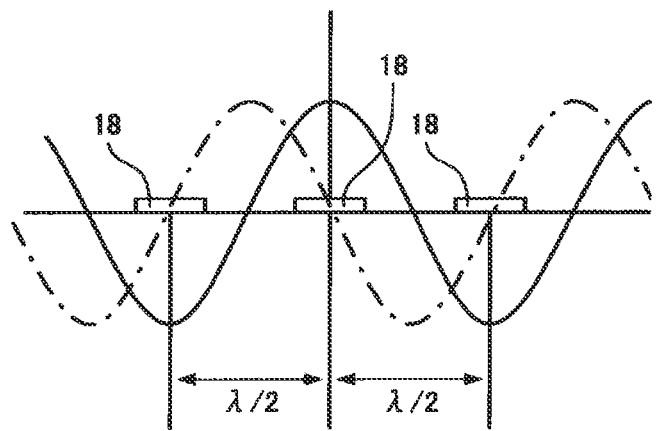
FIG. 4 is a diagram showing a relationship between a stop band upper end mode and lower end mode.

Herein, a description will be given of the relationship between a stop band upper end mode SAW and a lower end mode SAW. In the stop band lower end mode and upper end mode SAWs formed by the kind of normal IDT 12 shown in FIG. 4 (what are shown in FIG. 4 are the electrode fingers 18 configuring the IDT 12), the positions of the anti-nodes (or nodes) of each standing wave are apart from each other by π/2. FIG. 4 is a diagram showing the distribution of the stop band upper end mode and lower end mode standing waves in the normal IDT 12.

According to FIG. 4, as heretofore described, the anti-nodes of the stop band lower end mode standing wave shown by the solid line exist in the central position of the electrode fingers 18, that is, in the reflection center position, and the nodes of the stop band upper end mode standing wave shown by the dashed-dotted line exist in the reflection center position. In this kind of mode in which the nodes exist in the central positions between the electrode fingers, it is not possible to efficiently convert the oscillation of the SAW to a charge with the electrode fingers 18 (18a and 18b), and it is often the case that it is not possible to excite or receive the mode as an electrical signal. However, with the method described in the application, by making the Euler angle ψ other than zero, and displacing the SAW propagation direction from the X axis, which is the crystal axis of the quartz crystal, it is possible to shift the standing wave of the stop band upper end mode to the position of the solid line in FIG. 4, that is, to shift the standing wave anti-nodes of the mode to the central position of the electrode fingers 18, and it is possible to excite the SAW of the stop band upper end mode.

Also, one pair of the reflectors 20 are provided in such a way as to sandwich the IDT 12 in the SAW propagation direction. As a specific configuration example, both ends of each of a plurality of conductor strips 22, provided parallel to the electrode fingers 18 configuring the IDT 12, are connected.

With an edge reflection type SAW resonator which actively utilizes a reflected wave from the SAW propagation direction end face of the quartz crystal substrate, or a long IDT type SAW resonator which excites the SAW standing wave with the IDT itself by increasing the number of pairs of IDT electrode fingers, the reflectors are not absolutely necessary.

As the material of the electrode film configuring the IDT 12 and reflectors 20 configured in this way, it is possible to use aluminum (Al), or a metal alloy with Al as its base.

By making the electrode thickness of the electrode film configuring the IDT 12 and reflectors 20 extremely small, the effect of the temperature characteristics possessed by the electrodes is kept to a minimum. Furthermore, making the depth of the quartz crystal substrate portion grooves large, good frequency-temperature characteristics are derived from the performance of the quartz crystal substrate portion grooves, that is, by utilizing the good temperature characteristics of the quartz crystal. Because of this, it is possible to reduce the effect of the electrode temperature characteristics on the temperature characteristics of the SAW resonator and, provided that the fluctuation of the electrode mass is within 10%, it is possible to maintain good temperature characteristics.

For the above-mentioned reasons, in the event of using an alloy as the electrode film material, the ratio by weight of metals other than the main element aluminum should be 10% or less, and preferably 3% or less. In the event of using electrodes with a metal other than Al as a base, the electrode film thickness should be adjusted so that the mass of the electrodes is within ±10% of that when using Al. By so doing, good temperature characteristics equivalent to those when using Al can be obtained.

The quartz crystal substrate 30 in the SAW resonator 10 with the heretofore described kind of basic configuration is such that the grooves (inter-electrode finger grooves) 32 are provided between the electrode fingers of the IDT 12 and between the conductor strips of the reflectors 20.

When the SAW wavelength in the stop band upper end mode is $\lambda$, and the groove depth is G, the groves 32 provided in the quartz crystal substrate 30 should be such that

[Expression 10]

$$0.01\lambda \leq G \quad (1)$$

When fixing an upper limit for the groove depth G, it should be within the range of

Figure 5:
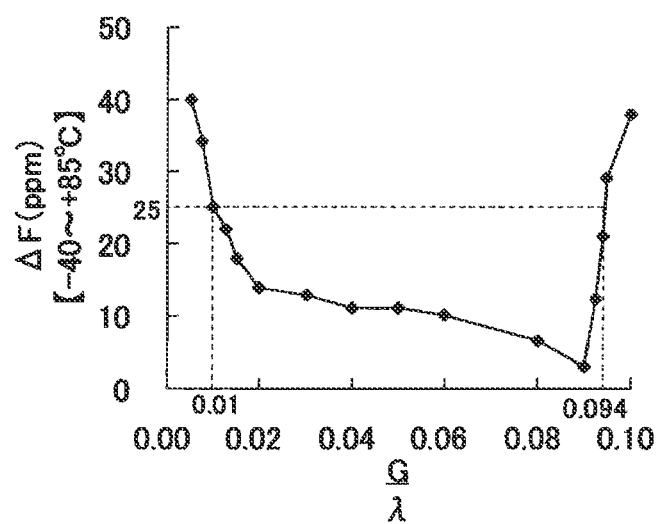
FIG. 5 is a graph showing a relationship between the depth of an inter-electrode finger groove and a frequency fluctuation amount in an operating temperature range.

[Expression 11]

$$0.012\lambda \leq G \leq 0.094\lambda \quad (2)$$

as can be seen by referring to FIG. 5. This is because, by fixing the groove depth G within this kind of range, it is possible to keep the frequency fluctuation amount within the operating temperature range (−40° C. to +85° C.) at or below the target value of 25 ppm, to be described in detail hereafter. Also, it is preferable that the groove depth G is within the range of

[Expression 12]

$$0.012\lambda \leq G \leq 0.0695\lambda \quad (3)$$

By fixing the groove depth G within this kind of range, even in the event that manufacturing variation occurs in the groove depth G, it is possible to keep the shift amount of resonance frequency between individual SAW resonators 10 within a correctable range.

Also, the line occupation rate $\eta$ is a value wherein the line width L of the electrode finger 18 (in the case of the quartz crystal protrusion only, the width of the protrusion) is divided by the pitch $\lambda/2$ (=L+S) between the electrode fingers 18, as shown in FIGS. 1C and 1D. Consequently, the line occupation rate $\eta$ can be expressed by Equation (4).

[Expression 13]

$$\eta = \frac{L}{L+S} \quad (4)$$

Herein, with the SAW resonator 10 according to the embodiment, the line occupation rate $\eta$ should be fixed within the kind of range which satisfies Equations (5) and (6). As can also be understood from Expressions (5) and (6), $\eta$ can be derived by fixing the depth G of the grooves 32.

[Expression 14]

$$-2.0000 \times G/\lambda + 0.7200 \leq \eta \leq -2.5000 \times G/\lambda + 0.7775$$

provided that $$0.0100\lambda \leq G \leq 0.0500\lambda \quad (5)$$

[Expression 15]

$$-3.5898 \times G/\lambda + 0.7995 \leq \eta \leq -2.5000 \times G/\lambda + 0.7775$$

provided that $$0.0500\lambda < G \leq 0.0695\lambda \quad (6)$$

Also, it is preferable that the film thickness of the electrode film material (IDT 12, reflectors 20, and the like) in the SAW resonator 10 according to the embodiment is within the range of

[Expression 16]

$$0 < H \leq 0.035\lambda \quad (7)$$

Furthermore, when taking into consideration the thickness of the electrode film shown in Equation (7) with regard to the line occupation rate $\eta$, $\eta$ can be obtained from Equation (8).

[Expression 17]

$$\eta = -1963.05 \times (G/\lambda)^2 + 196.28 \times (G/\lambda)^2 - 6.53 \times (G/\lambda) - \\ 135.99 \times (H/\lambda)^2 + 5.817 \times (H/\lambda) + 0.732 - 99.99 \times (G/\lambda) \times (H/\lambda) \quad (8)$$

The manufacturing variation of the electrical characteristics (particularly the resonance frequency) being greater the greater the electrode film thickness, it is highly likely that the manufacturing variation of the line occupation rate $\eta$ is ±0.04 or less when the electrode film thickness H is within the range of Equations (5) and (6), and that a manufacturing variation greater than ±0.04 occurs when H>0.035$\lambda$. However, provided that the electrode film thickness H is within the range of Equations (5) and (6), and the variation of the line occupation rate $\eta$ is ±0.04 or less, it is possible to realize a SAW device with a low secondary temperature coefficient $\beta$. That is, a line occupation rate η up to the range of Equation (9), wherein a tolerance of ±0.04 is added to Equation (8), is allowable.

[Expression 18]

$$\eta = -1963.05 \times (G/\lambda)^3 + 196.28 \times (G/\lambda)^2 - \\ 6.53 \times (G/\lambda) - 135.99 \times (H/\lambda)^2 + 5.817 \times (H/\lambda) + \\ 0.732 - 99.99 \times (G/\lambda) \times (H/\lambda) \pm 0.04 \quad (9)$$

With the SAW resonator 10 according to the embodiment with the heretofore described kind of configuration, in the event that the secondary temperature coefficient β is within ±0.01 (ppm/° C.$^2$), and preferably the SAW operating temperature range is −40° C. to +85° C., the object is to improve the frequency-temperature characteristics to a degree whereby it is possible to keep a frequency fluctuation amount ΔF in the operating temperature range at or under 25 ppm.

Generally, however, the temperature characteristics of a surface acoustic wave resonator are expressed by the following equation.

$$\Delta f = \alpha \times (T-T_0) + \beta \times (T-T_0)^2$$

Herein, Δf represents the frequency change amount (ppm) between the temperature T and the peak temperature $T_0$, α the primary temperature coefficient (ppm/° C.), β the secondary temperature coefficient (ppm/° C.$^2$), T the temperature, and $T_0$ the temperature at which the frequency is highest (the peak temperature).

Figure 6:
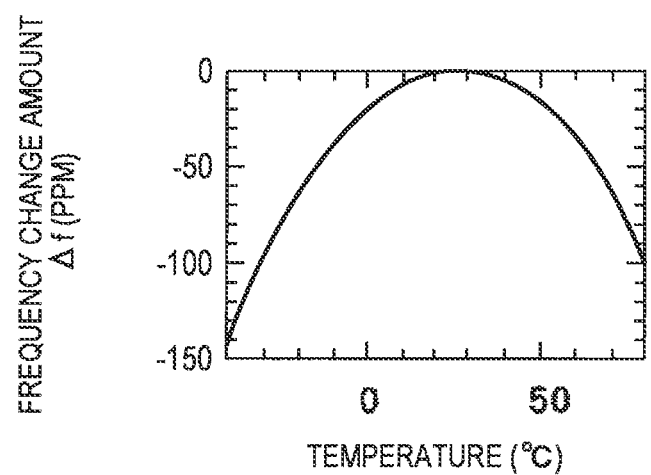
FIG. 6 is a diagram showing temperature characteristics in an ST cut quartz crystal substrate.

For example, in the event that the piezoelectric substrate is formed of a so-called ST cut (Euler angles (φ, θ, and ψ)=(0°, 120° to 130°, and 0°) quartz crystal substrate, the primary constant α=0.0, and the secondary constant β=−0.034, which when expressed in a graph is as in FIG. 6. In FIG. 6, the temperature characteristics describe an upwardly convex parabola (quadratic curve).

With the kind of SAW resonator shown in FIG. 6, the frequency fluctuation amount with respect to the temperature change is extremely large, and it is necessary to suppress the frequency change amount Δf with respect to the temperature change. Consequently, there is a need to realize a surface acoustic wave resonator based on new knowledge, so that the secondary temperature coefficient β shown in FIG. 6 is brought closer to 0, and the frequency change amount Δf with respect to the temperature (operating temperature) change when the SAW resonator is actually used comes closer to 0.

Consequently, one object of the invention is to solve the heretofore described kind of problem, making the frequency-temperature characteristics of the surface acoustic wave device extremely good ones, and realizing a surface acoustic wave device which operates with a stable frequency, even though the temperature changes.

How a solution to the heretofore described kind of problem may be realized with a SAW device to be configured including the heretofore described kind of technical thought (technical components), that is, how the inventor arrived at the knowledge according to the invention by repeatedly carrying out simulations and experiments, will be described in detail and proved hereafter.

With a SAW resonator using the previously described quartz crystal substrate called an ST cut, with the propagation direction the crystal X axis direction, in the event that the operating temperature range is the same, the frequency fluctuation amount ΔF in the operating temperature range is approximately 133 (ppm), and the secondary temperature coefficient β is about −0.034 (ppm/° C.$^2$). Also, in the event of utilizing a stop band lower end mode excitation in a SAW resonator using an in-plane rotation ST cut quartz crystal substrate with the same operating temperature range, with the quartz crystal substrate cut angles and SAW propagation direction (0, 123°, and 45°) in Euler angle representation, the frequency fluctuation amount ΔF is approximately 63 ppm, and the secondary temperature coefficient β is about −0.016 (ppm/° C.$^2$).

The SAW resonators using the ST cut quartz crystal substrate and in-plane rotation ST cut quartz crystal substrate both utilizing surface acoustic waves called Rayleigh waves, the variation of frequency and frequency-temperature characteristics with respect to the machining accuracy of the quartz crystal substrate and electrodes is extremely small in comparison with the surface acoustic wave, called a Leaky wave, of an LST cut quartz crystal substrate, meaning that they are most suitable for mass production, and are used in various kinds of SAW device. However, with the SAW resonators using the ST cut quartz crystal substrate, in-plane rotation ST cut quartz crystal substrate, or the like utilized to date, as previously described, the secondary temperature characteristics being such that the curve indicating the frequency-temperature characteristics is a quadratic curve, and furthermore, the absolute value of the secondary temperature coefficient of the secondary temperature characteristics being large, the frequency fluctuation amount in the operating temperature range is large, and they cannot be utilized in a SAW device such as a resonator or oscillator used in a wired communication device or wireless communication device which requires a stability of frequency. For example, in the event that it is possible to obtain frequency-temperature characteristics which have secondary temperature characteristics wherein the secondary temperature coefficient β is ±0.01 (ppm/° C.$^2$) or less, corresponding to an improvement in the ST cut quartz crystal substrate secondary temperature coefficient β of ⅓ or less, and in the in-plane rotation ST cut quartz crystal substrate secondary temperature coefficient β of 37% or more, it is possible to realize a device which requires that kind of frequency stability. Furthermore, in the event that it is possible to obtain tertiary temperature characteristics, wherein the secondary temperature coefficient β is substantially zero, and the curve indicating the frequency-temperature characteristics is a tertiary curve, it is more preferable, as the frequency stability in the operating temperature range further increases. With tertiary temperature characteristics such as these, it is possible to obtain an extremely high frequency stability of ±25 ppm or less, which has not been realizable with the heretofore known kind of SAW device, even in the broad operating temperature range of −40° C. to +85° C.

The fact that the electrode finger 18 line occupation rate η in the IDT 12, electrode film thickness H, groove depth G, and the like, are related to the change in the frequency-temperature characteristics of the SAW resonator 10, as heretofore described, has been made clear by knowledge based on the simulations and experiments carried out by the inventor. Then, the SAW resonator 10 according to the embodiment utilizes the excitation of the stop band upper end mode.

Figure 7A:
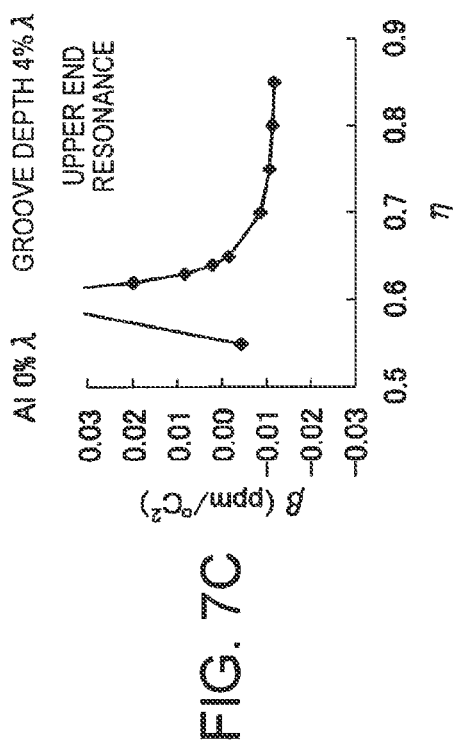
FIGS. 7A-7D are graphs showing differences in a change in a secondary temperature coefficient accompanying a change in a line occupation rate η at a stop band upper end mode resonance point and a stop band lower end mode resonance point, where
Figure 7C:
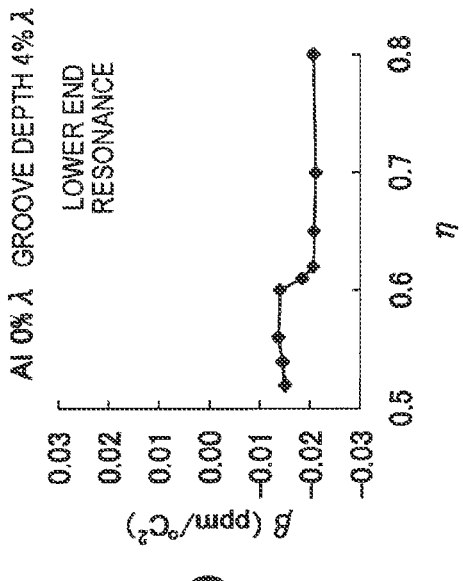
Figure 7B:
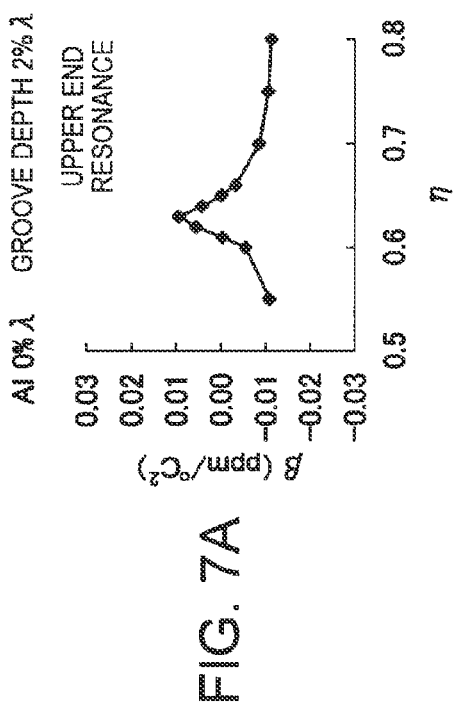
Figure 7D:
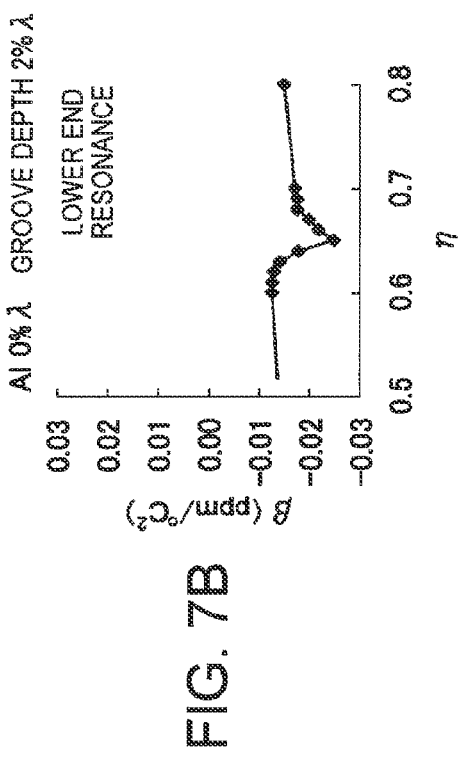
Figure 8A:
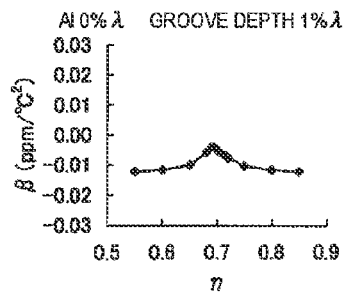
FIGS. 8A-8I are graphs showing a relationship between the line occupation rate η and secondary temperature coefficient β when changing the inter-electrode finger groove depth, with an electrode film thickness as 0, where
Figure 8B:
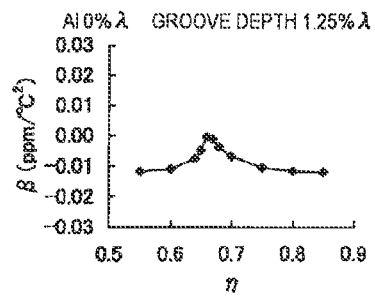
Figure 8C:
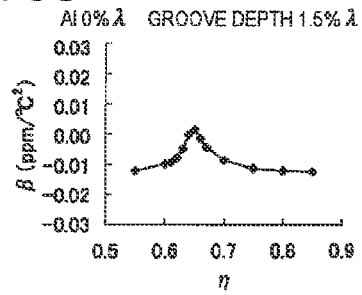
Figure 8D:
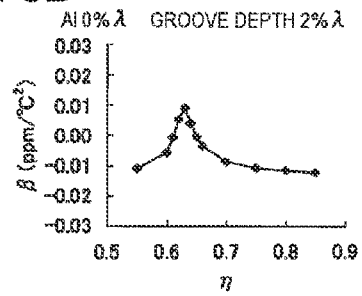
Figure 8E:
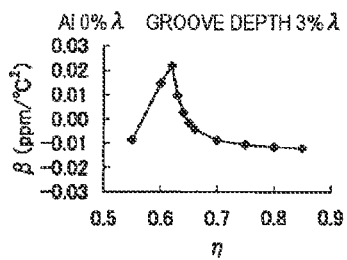
Figure 8F:
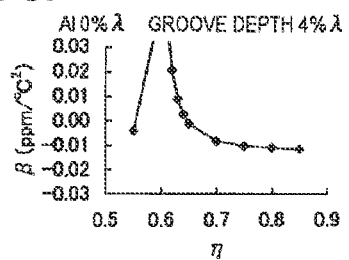
Figure 8G:
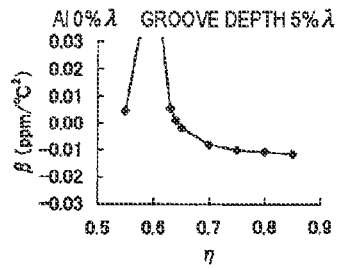
Figure 8H:
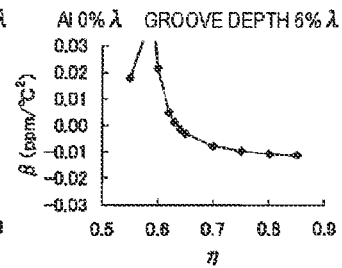
Figure 8I:
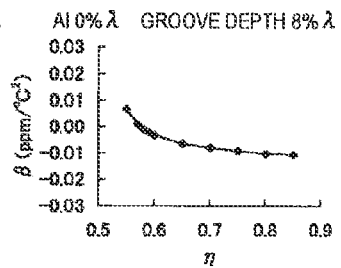

FIGS. 7A to 7D are graphs showing the change in the secondary temperature coefficient β with respect to the change in the line occupation rate η in a case of exciting and propagating a SAW on the surface of the quartz crystal substrate 30, with the electrode film thickness H in FIG. 1(C) as zero (H=0% λ), that is, in a condition in which the grooves 32 configured of uneven quartz crystal are formed in the surface of the quartz crystal substrate 30. Of FIG. 7, FIG. 7(A) shows the secondary temperature coefficient β for the stop band upper end mode resonance when the groove depth G is 0.02λ, and FIG. 7(B) shows the secondary temperature coefficient β for the stop band lower end mode resonance when the groove depth G is 0.02λ. Also, of FIG. 7, FIG. 7(C) shows the secondary temperature coefficient β for the stop band upper end mode resonance when the groove depth G is 0.04λ, and FIG. 7(D) shows the secondary temperature coefficient β for the stop band lower end mode resonance when the groove depth G is 0.04λ. The simulations shown in FIG. 7 show examples of cases in which a SAW is propagated in some way in a quartz crystal substrate 30 on which no electrode film is provided, in order to reduce factors causing the frequency-temperature characteristics to fluctuate. Also, Euler angles (0°, 123°, and ψ) are used for the cut angles of the quartz crystal substrate 30. With regard to ψ, a value which is the minimum absolute value of the secondary temperature coefficient β is selected as appropriate.

From FIG. 7, it can be seen that, both in the case of the stop band upper end mode and in the case of the lower end mode, the secondary temperature coefficient β changes considerably in the area in which the line occupation rate η is 0.6 to 0.7. Then, when comparing the change in the secondary temperature coefficient β in the stop band upper end mode and the change in the secondary temperature coefficient β in the stop band lower end mode, the following points can be seen. That is, the change in the secondary temperature coefficient β in the stop band lower end mode is such that the characteristics deteriorate due to the secondary temperature coefficient β changing from the minus side to farther on the minus side (the absolute value of the secondary temperature coefficient β increases). As opposed to this, the change in the secondary temperature coefficient β in the stop band upper end mode is such that the characteristics improve due to the secondary temperature coefficient β changing from the minus side to the plus side (a point exists at which the absolute value of the secondary temperature coefficient β decreases).

From this, it is clear that in order to obtain good frequency-temperature characteristics in a SAW device, it is preferable to use the oscillation of the stop band upper end mode.

Next, the inventor investigated the relationship between the line occupation rate η and secondary temperature coefficient β when propagating a stop band upper end mode SAW in quartz crystal substrates with variously changed groove depths G.

FIG. 8 is graphs showing evaluation results when simulating the relationship between the line occupation rate η and secondary temperature coefficient β when changing the groove depth G from 0.01λ (1% λ) to 0.08λ (8% λ), with the electrode film thickness H as zero (H=0% λ), as in FIG. 7. From the evaluation results, it can be seen that a point at which β=0, that is, a point at which the approximate curve indicating the frequency-temperature characteristics describes a tertiary curve, begins to appear from around the point at which the groove depth G is made 0.0125λ (1.25% λ), as shown in FIG. 8(B). Then, it is also clear from FIG. 8 that η at which β=0 exists in two places (a point η1) at which β=0 where η is larger, and a point (η2) at which β=0 where η is smaller). Furthermore, it can also be seen from the evaluation results shown in FIG. 8 that the fluctuation amount of the line occupation rate η with respect to the change in the groove depth G is greater at η2 than at η1.

Figure 9:
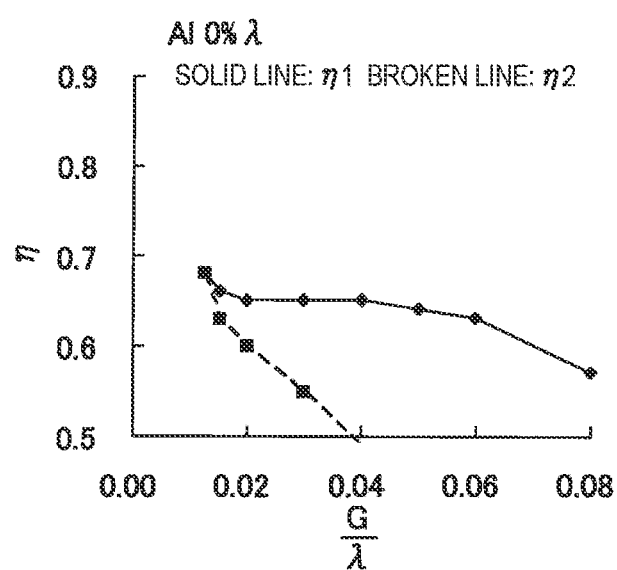
FIG. 9 is a graph showing a relationship between an inter-electrode finger groove depth at which the secondary temperature coefficient becomes 0 and the line occupation rate η, when the electrode film thickness is 0.

Regarding this point, it is possible to increase an understanding thereof by referring to FIG. 9. FIG. 9 is a graph plotting η1 and η2, at which the secondary temperature coefficient β becomes 0, in the case of changing the groove depth G. From FIG. 9, it can be seen that η1 and η2 both become smaller as the groove depth G increases, but the fluctuation amount of η2 is so great that, on a graph in which the scale of the vertical axis η is shown in a range of 0.5λ to 0.9λ, it goes off the scale around the point at which the groove depth G=0.04λ. That is, it can be said that the fluctuation amount of η2 with respect to the change in the groove depth G is large.

FIG. 10 is graphs with the electrode film thickness H as zero (H=0% λ), as in FIGS. 7 and 8, and with the vertical axis of FIG. 8 shown as the frequency fluctuation amount ΔF instead of the secondary temperature coefficient β. From FIG. 10, it can of course be seen that the frequency fluctuation amount ΔF decreases at the two points (η1 and η2) at which β=0. Furthermore, it can be seen from FIG. 10 that of the two points at which β=0, the frequency fluctuation amount ΔF is kept smaller at the point corresponding to η1 in every graph in which the groove depth G is changed.

According to the heretofore described tendency, it can be supposed that it is preferable to employ the β=0 point at which the frequency fluctuation amount with respect to the fluctuation in the groove depth G is smaller, that is, η1, for a mass production article in which discrepancies are liable to occur when manufacturing. FIG. 5 shows a graph of the relationship between the frequency fluctuation amount ΔF at the point (η1) at which the secondary temperature coefficient β is smallest and the groove depth G, for each groove depth G. According to FIG. 5, the lower limit value of the groove depth G for which the frequency fluctuation amount ΔF is the target value of 25 ppm or less being the groove depth G of 0.01λ, the range of the groove depth G is that or greater, that is, 0.01≤G.

In FIG. 5, examples are also added of cases in which, by simulation, the groove depth G is 0.08 or more. According to the simulation, the frequency fluctuation amount ΔF is 25 ppm or less when the groove depth G is 0.01λ or more, and subsequently, the frequency fluctuation amount ΔF decreases every time the groove depth G increases. However, when the groove depth G becomes approximately 0.09λ or more, the frequency fluctuation amount ΔF increases again, and on the groove depth G exceeding 0.094λ, the frequency fluctuation amount ΔF exceeds 25 ppm.

The graph shown in FIG. 5 is of a simulation in a condition in which no electrode film is formed on the IDT 12, reflectors 20, and the like, on the quartz crystal substrate 30 but, as can be understood by referring to FIGS. 21 to 26, whose details are shown hereafter, it is supposed that it is possible to reduce the frequency fluctuation amount ΔF more in a SAW resonator 10 on which an electrode film is provided. Therefore, when fixing the upper limit value of the groove depth G, it should be made the maximum value in the condition in which no electrode film is formed, that is, G≤0.94λ, and it is possible to represent the preferred range of the groove depth G for achieving the target as

[Expression 19]

$$0.01\lambda \leq G \leq 0.094\lambda \quad (2)$$

Figure 11:
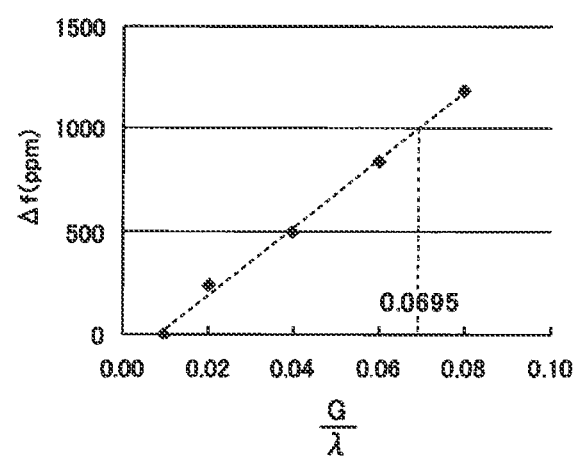
FIG. 11 is a graph showing a relationship between the inter-electrode finger groove depth and the frequency fluctuation amount when the inter-electrode finger groove depth deviates by ±0.001λ.
Figure 12A:
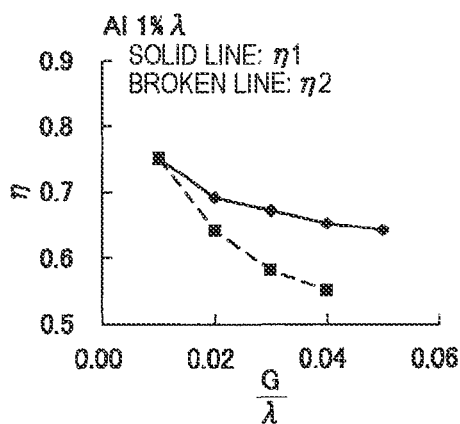
FIGS. 12A-12F are graphs showing a relationship between the inter-electrode finger groove depth at which the secondary temperature coefficient becomes 0 and the line occupation rate η, when the electrode film thickness is changed, where
Figure 12B:
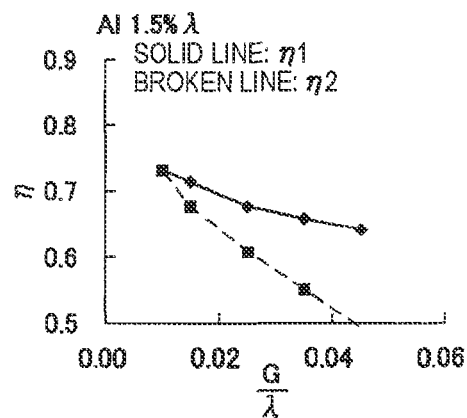
Figure 12C:
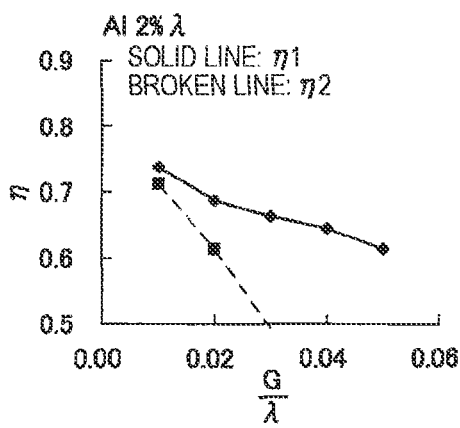
Figure 12D:
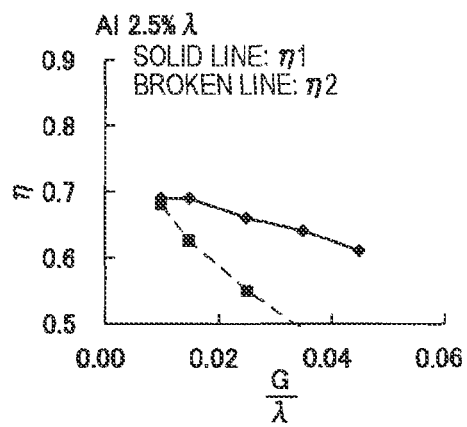
Figure 12E:
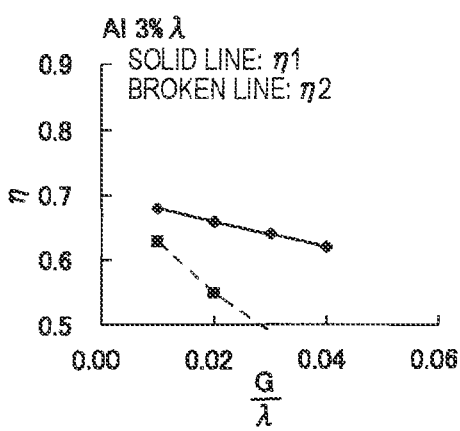
Figure 12F:
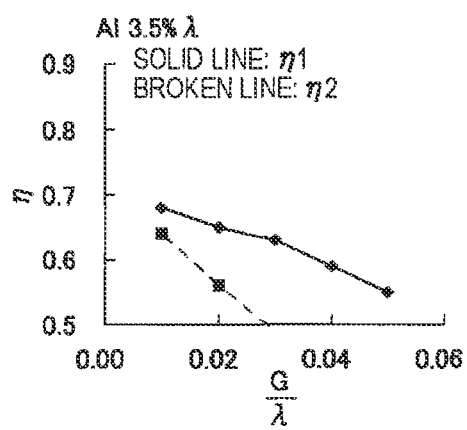

The groove depth G has a maximum variation of around ±0.001λ in the mass production process. Therefore, the individual frequency fluctuation amounts Δf of the SAW resonator 10 in a case in which the groove depth G deviates by ±0.001λ, when the line occupation rate η is taken to be a constant, are shown in FIG. 11. According to FIG. 11, it can be seen that in a case in which the groove depth G deviates by ±0.001λ when G=0.04λ, that is, when the groove depth is in a range of 0.039λ≤G≤0.041λ, the frequency fluctuation amount Δf is around ±500 ppm.

Herein, in the event that the frequency fluctuation amount Δf is less than ±1000 ppm, frequency adjustment is possible using various frequency fine adjustment methods. However, in the event that the frequency fluctuation amount Δf is ±1000 ppm or more, adjusting the frequency has an effect on static characteristics such as the Q value and CI (crystal impedance) value, and on long-term reliability, leading to a reduction in the yield rate as the SAW resonator 10.

By deriving an approximate equation indicating the relationship between the frequency fluctuation amount Δf (ppm) and groove depth G for the straight line linking the plots shown in FIG. 11, it is possible to obtain Equation (10).

[Expression 20]

$$\Delta f = 16334(G/\lambda) - 137 \quad (10)$$

Herein, on calculating the values of G at which Δf<1000 ppm, it is found that G≤0.0695λ. Consequently, it can be said that it is preferable that the range of the groove depth G according to the embodiment is optimally

[Expression 21]

$$0.01\lambda \leq G \leq 0.0695\lambda \quad (3)$$

Next, FIG. 12 is graphs showing evaluation results when simulating the relationship between η at which the secondary temperature coefficient β=0, that is, the line occupation rate η indicating the tertiary temperature characteristics, and the groove depth G. The quartz crystal substrate 30 has Euler angles of (0°, 123°, and ψ). Herein, ψ is appropriately selected as the angle at which the frequency-temperature characteristics indicate the tendency of the tertiary curve, that is, the angle at which the secondary temperature coefficient β=0. The relationship between the Euler angle ψ and the groove depth G when obtaining η at which β=0, under the same conditions as in FIG. 12, is shown in FIG. 34. Of FIG. 34, in the graph (FIG. 34 (C)) in which the electrode film thickness H=0.02λ, although the plots of η<42° are not shown, the η2 plot of the graph is η=41.9° at G=0.03λ. The plots of the relationship between the groove depth G and line occupation rate η for each electrode film thickness are obtained based on FIG. 15 to FIG. 20, which will be described in detail hereafter.

Figure 13A:
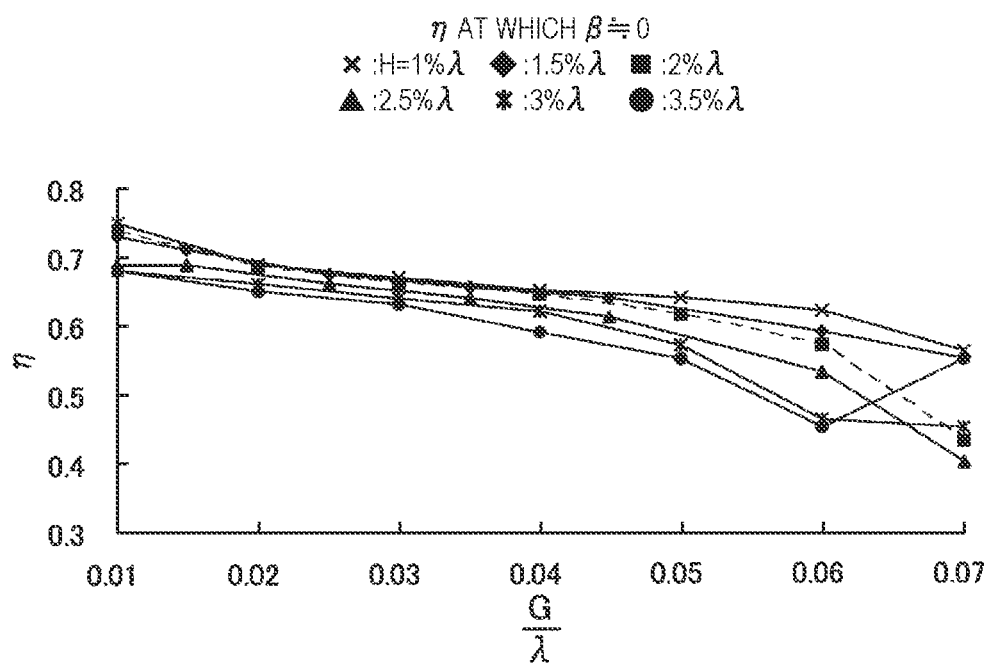
FIGS. 13A-13B are diagrams in which relationships between η1 at which the secondary temperature coefficient β ≈0 (ppm/° C.$^2$) and the inter-electrode finger groove depth for each electrode film thickness are summarized in graphs, where

From the evaluation results shown in FIG. 12, it can be seen that for every film thickness, as heretofore described, the fluctuation of η1 due to the change in the groove depth G is small in comparison with that of η2. For this reason, η1 has been extracted from the graphs showing the relationship between the groove depth G and line occupation rate η for each film thickness in FIG. 12, and summarized by plotting points at which β≈0 in FIG. 13(A). In contrast, on evaluating an area in which, although not reaching β≈0, |β|≤0.01 is satisfied, it becomes clear that η1 are concentrated in the polygon indicated by the solid line, as shown in FIG. 13(B).

Figure 13B:
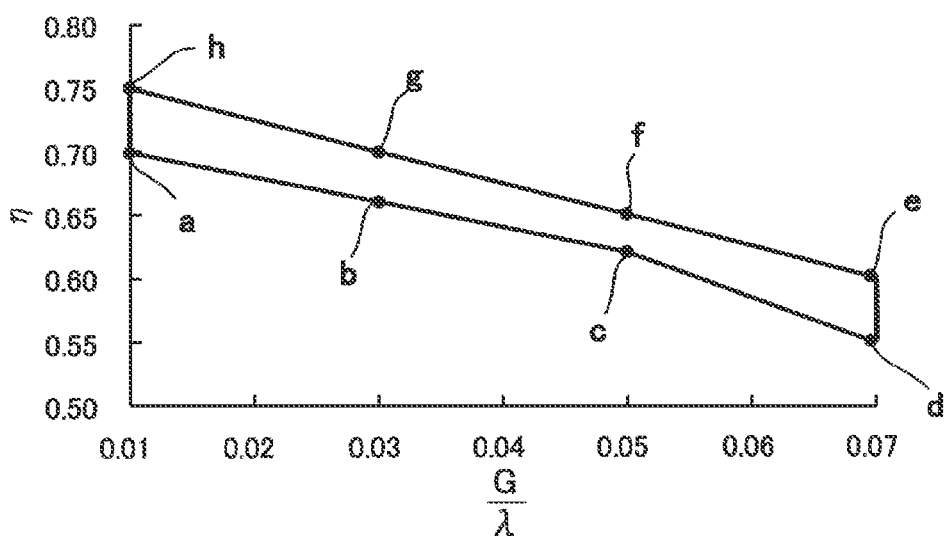

The coordinates of points a to h in FIG. 13(B) are shown in Table 1 below.

TABLE 1

| Point | G/λ | η |
|---|---|---|
| a | 0.01 | 0.70 |
| b | 0.03 | 0.66 |
| c | 0.05 | 0.62 |
| d | 0.07 | 0.55 |
| e | 0.07 | 0.60 |
| f | 0.05 | 0.65 |
| g | 0.03 | 0.70 |
| h | 0.01 | 0.75 |

FIG. 13(B) shows that, provided that it is inside the polygon surrounded by points a to h, |β|≤0.01 is guaranteed regardless of the size of the electrode film thickness H, and good frequency-temperature characteristics can be obtained.

A range within which the good frequency-temperature characteristics can be obtained is a range which satisfies both Equations (11) and (12), and Equation (13), shown below.

[Expression 22]

$$\eta \leq -2.5000 \times G/\lambda + 0.7775$$

provided that $$0.0100\lambda \leq G \leq 0.0695\lambda \quad (11)$$

[Expression 23]

$$\eta = -2.0000 \times G/\lambda + 0.7200$$

provided that $$0.0100\lambda \leq G \leq 0.0500\lambda \quad (12)$$

[Expression 24]

$$\eta \geq -3.5898 \times G/\lambda + 0.7995$$

provided that $$0.0500\lambda < G \leq 0.0695\lambda \quad (13)$$

From Equations (11), (12), and (13), it can be said that it is possible to specify the line occupation rates η in the range surrounded by the solid line in FIG. 13(B) as a range satisfying both Equation (5) and Equation (6).

[Expression 25]

$$-2.0000 \times G/\lambda + 0.7200 \leq \eta \leq -2.5000 \times G/\lambda + 0.7775$$

provided that $$0.0100\lambda \leq G \leq 0.0500\lambda \quad (5)$$

[Expression 26]

$$-3.5898 \times G/\lambda + 0.7995 \leq \eta \leq -2.5000 \times G/\lambda + 0.7775$$

provided that $$0.0500\lambda < G \leq 0.0695\lambda \quad (6)$$

Herein, in the case of allowing the secondary temperature coefficient β to within ±0.01 (ppm/° C.$^2$), it is confirmed that by configuring in such a way as to satisfy both Equation (3) and Equation (5) when 0.0100λ≤G≤0.0500λ, and satisfy both Equation (3) and Equation (6) when 0.0500λ≤G≤0.0695λ, the secondary temperature coefficient β comes within ±0.01 (ppm/° C.$^2$).

The values of the secondary temperature coefficient β for each electrode film thickness H at the points a to h are shown in Table 2 below. From Table 2, it can be confirmed that |β|≤0.01 at all of the points.

TABLE 2

| | Electrode Film Thickness H | | | | | |
|---|---|---|---|---|---|---|
| Point | 1% λ | 1.5% λ | 2% λ | 2.5% λ | 3% λ | 3.5% λ |
| a | −0.0099 | −0.0070 | −0.0030 | 0.0030 | −0.0050 | −0.0060 |
| b | 0.0040 | 0.0030 | 0.0000 | 0.0000 | −0.0020 | −0.0040 |
| c | 0.0070 | −0.0040 | 0.0010 | −0.0036 | −0.0040 | −0.0057 |
| d | 0.0067 | −0.0022 | −0.0070 | −0.0080 | −0.0090 | −0.0099 |
| e | −0.0039 | −0.0060 | −0.0090 | −0.0080 | −0.0090 | −0.0094 |
| f | −0.0023 | −0.0070 | −0.0050 | −0.0062 | −0.0060 | −0.0070 |

TABLE 2-continued

| | Electrode Film Thickness H | | | | | |
|---|---|---|---|---|---|---|
| Point | 1% λ | 1.5% λ | 2% λ | 2.5% λ | 3% λ | 3.5% λ |
| g | −0.0070 | −0.0060 | −0.0090 | −0.0070 | −0.0070 | −0.0070 |
| h | −0.0099 | −0.0030 | −0.0091 | −0.0080 | −0.0080 | −0.0080 |

Figure 14:
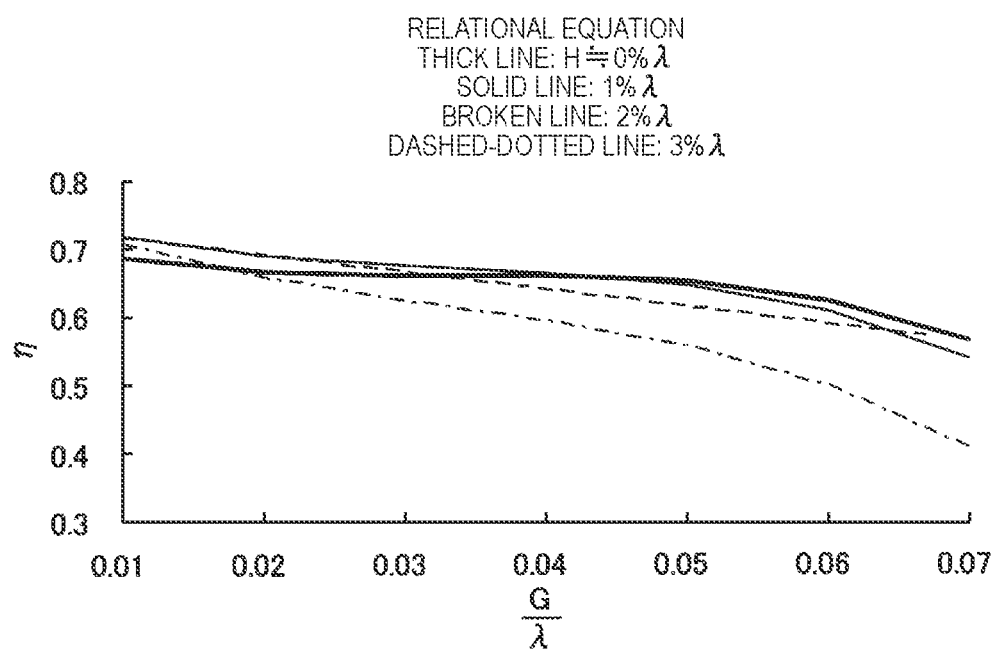
FIG. 14 is a diagram showing in an approximate curve a relationship between the inter-electrode finger groove depth and line occupation rate η for electrode film thicknesses from H≈0 to H=0.035λ.
Figure 15A:
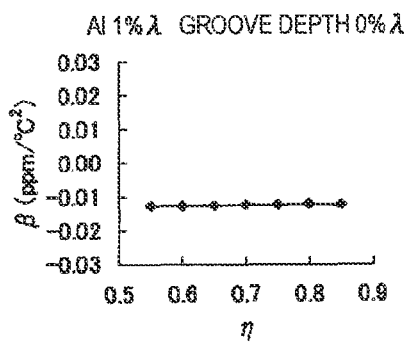
FIGS. 15A-15F are graphs showing the relationship between the line occupation rate η and secondary temperature coefficient β when changing the inter-electrode finger groove depth, with the electrode film thickness as 0.01λ, where
Figure 15B:
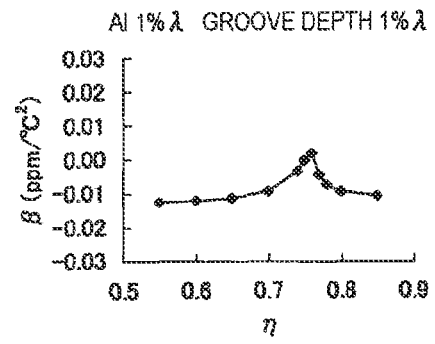
Figure 15C:
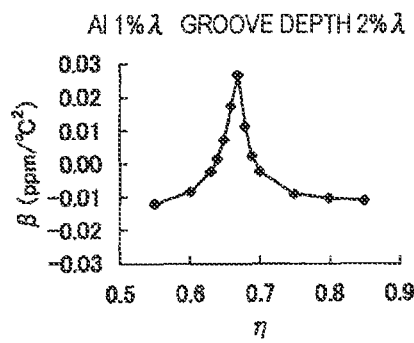
Figure 15D:
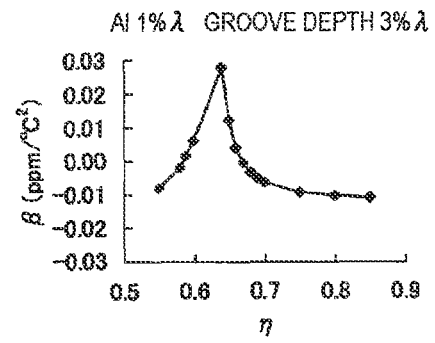
Figure 15E:
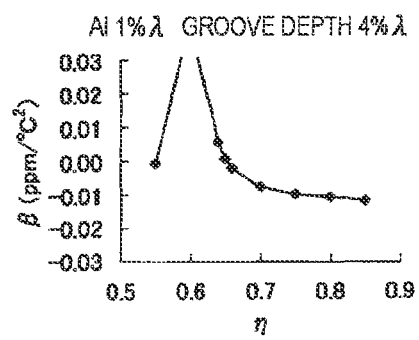
Figure 15F:
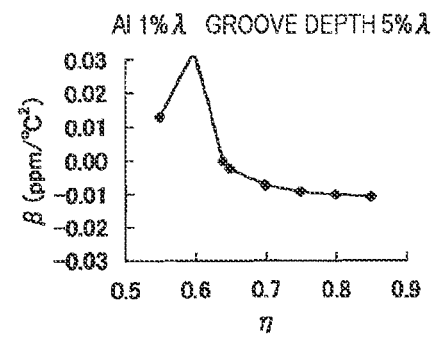
Figure 16A:
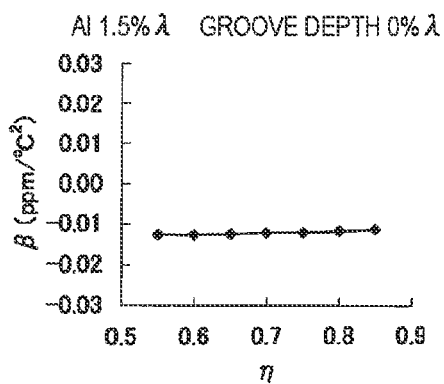
FIGS. 16A-16F are graphs showing the relationship between the line occupation rate η and secondary temperature coefficient β when changing the inter-electrode finger groove depth, with the electrode film thickness as 0.015λ, where
Figure 16B:
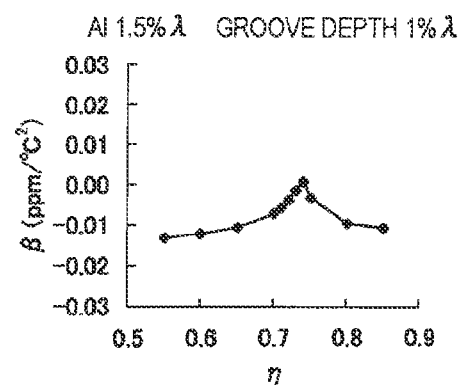
Figure 16C:
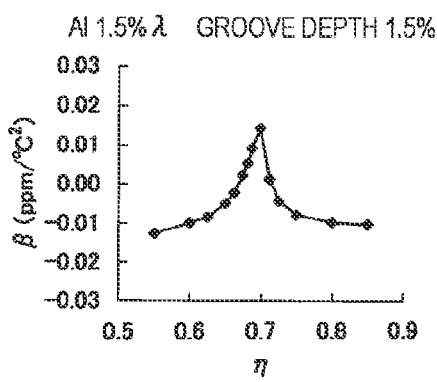
Figure 16D:
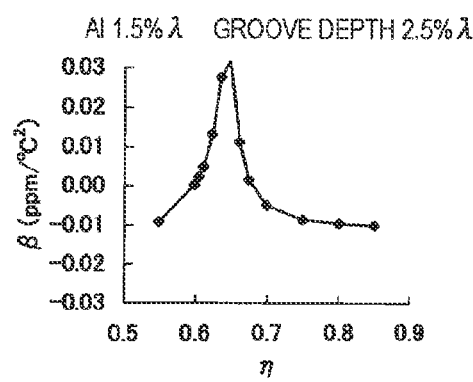
Figure 16E:
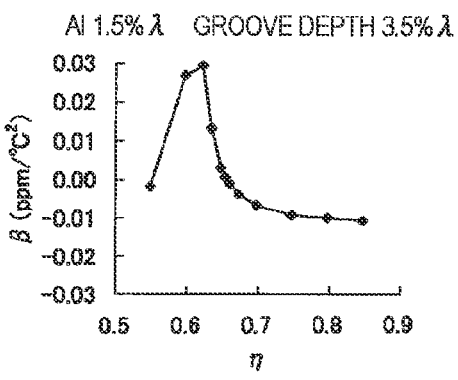
Figure 16F:
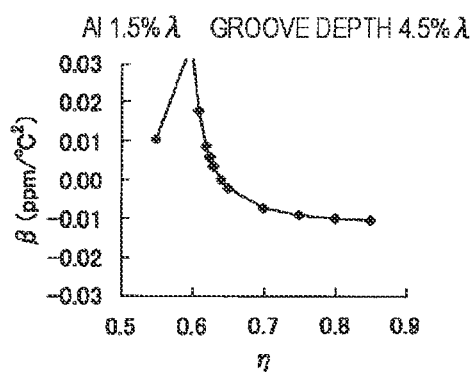
Figure 17A:
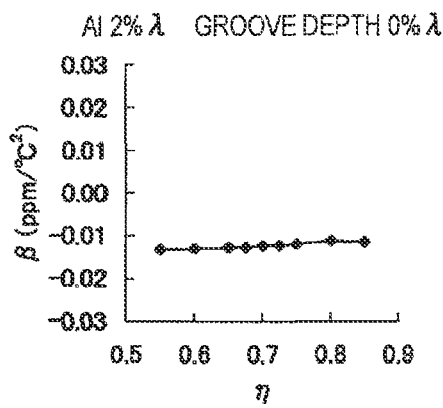
FIGS. 17A-17F are graphs showing the relationship between the line occupation rate η and secondary temperature coefficient β when changing the inter-electrode finger groove depth, with the electrode film thickness as 0.02λ, where
Figure 17B:
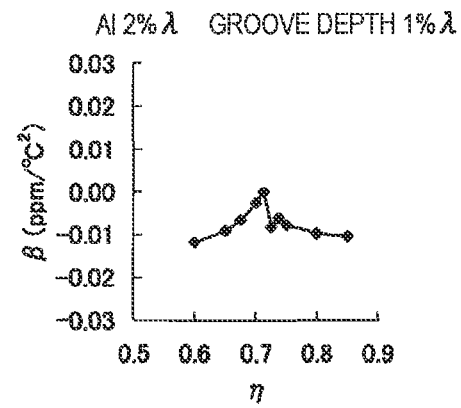
Figure 17C:
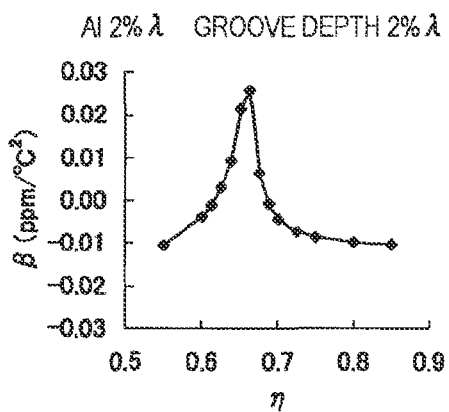
Figure 17D:
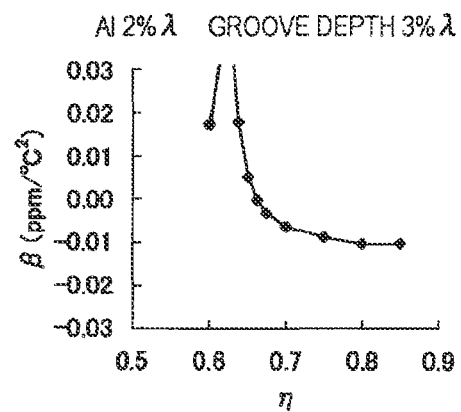
Figure 17E:
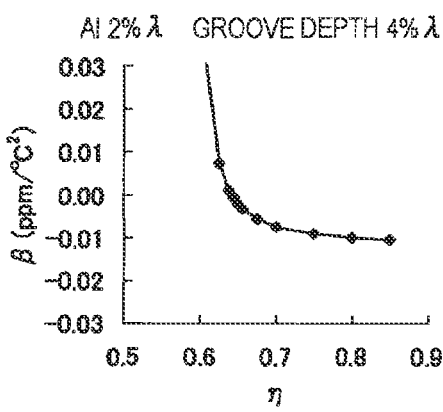
Figure 17F:
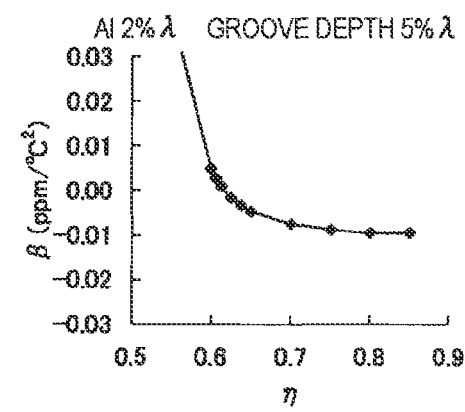
Figure 18A:
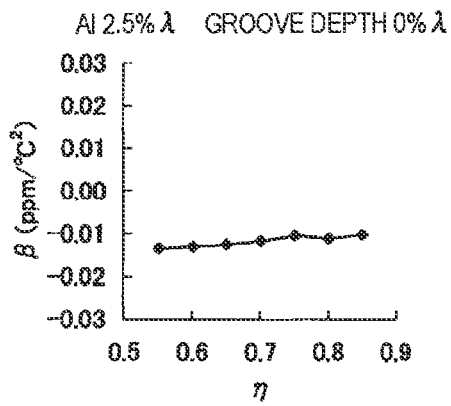
FIGS. 18A-18F are graphs showing the relationship between the line occupation rate η and secondary temperature coefficient β when changing the inter-electrode finger groove depth, with the electrode film thickness as 0.025λ, where
Figure 18B:
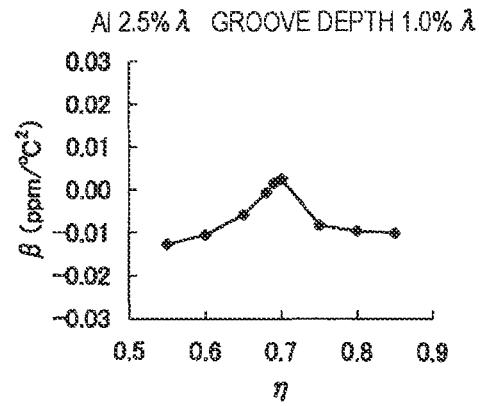
Figure 18C:
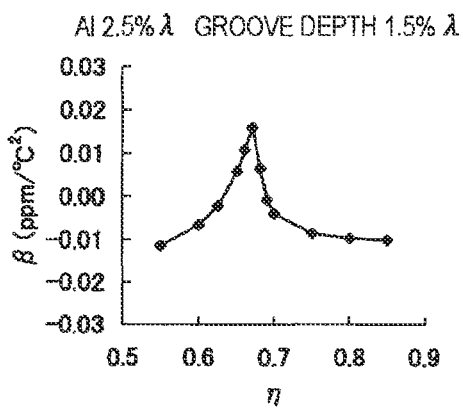
Figure 18D:
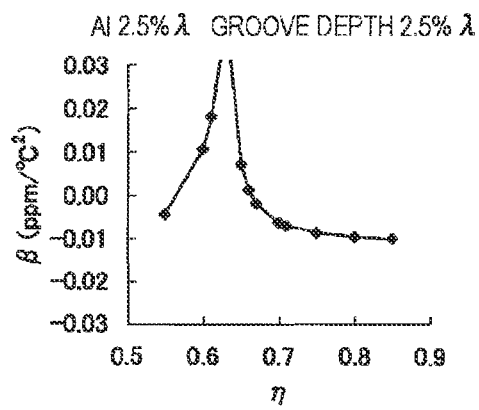
Figure 18E:
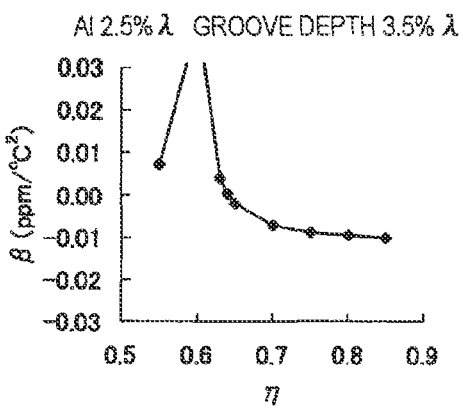
Figure 18F:
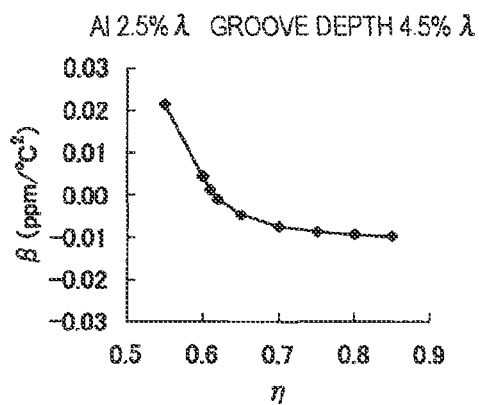
Figure 19A:
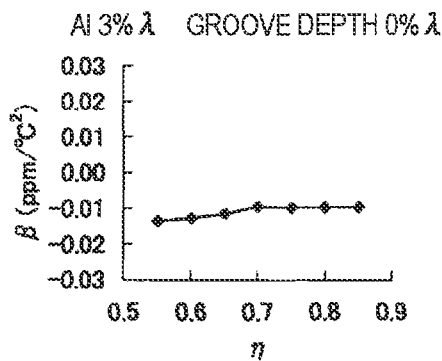
FIGS. 19A-19F are graphs showing the relationship between the line occupation rate η and secondary temperature coefficient β when changing the inter-electrode finger groove depth, with the electrode film thickness as 0.003λ, where (A) is a graph when the groove depth G is 0.
Figure 19B:
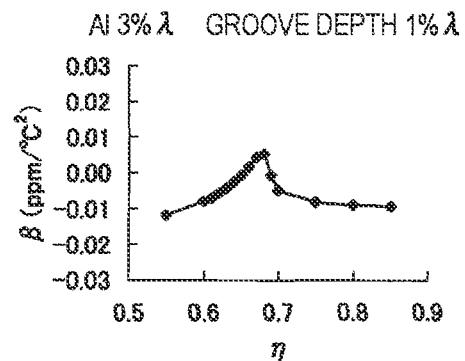
Figure 19C:
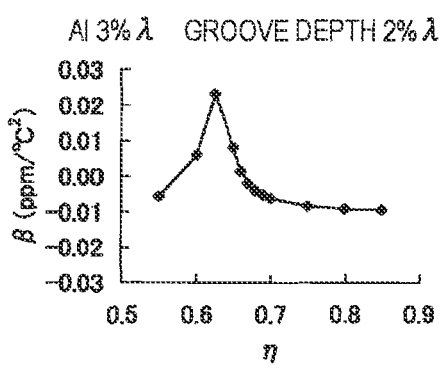
Figure 19D:
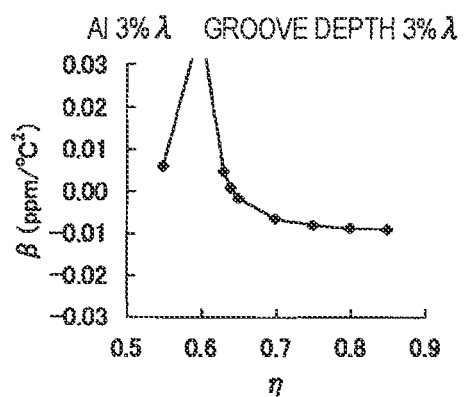
Figure 19E:
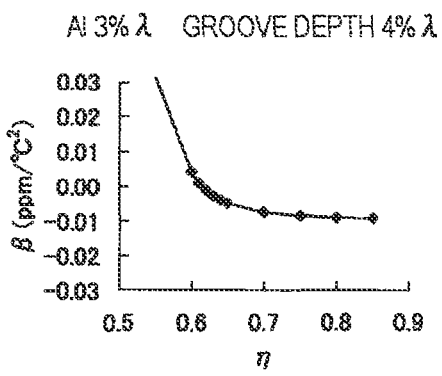
Figure 19F:
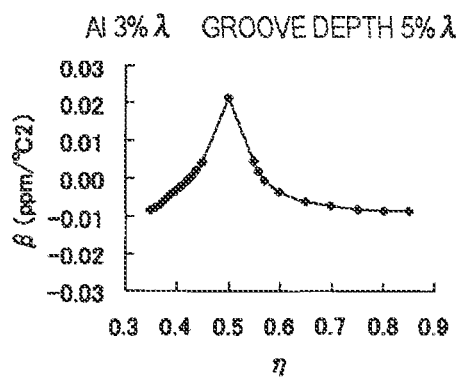
Figure 20A:
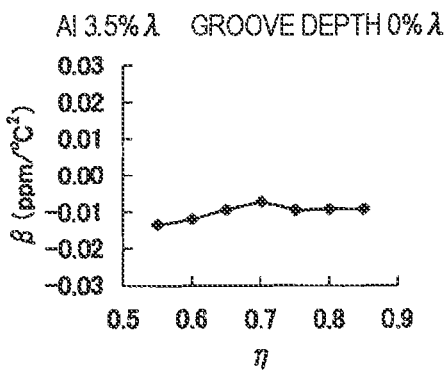
FIGS. 20A-20F are graphs showing the relationship between the line occupation rate η and secondary temperature coefficient β when changing the inter-electrode finger groove depth, with the electrode film thickness as 0.035λ, where
Figure 20B:
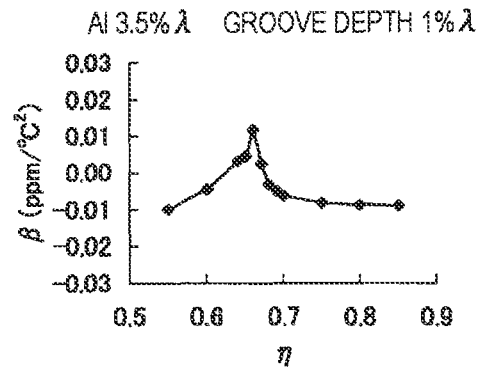
Figure 20C:
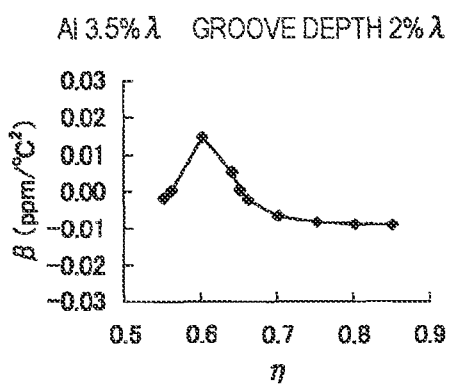
Figure 20D:
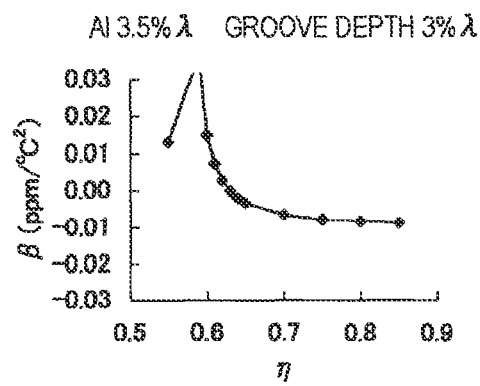
Figure 20E:
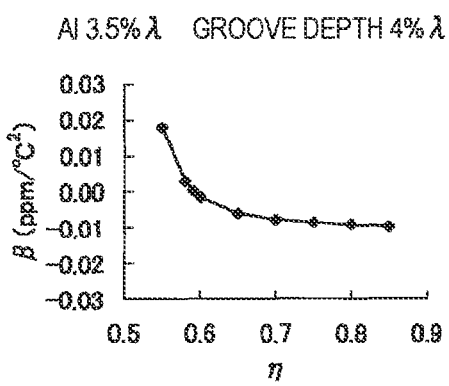
Figure 20F:
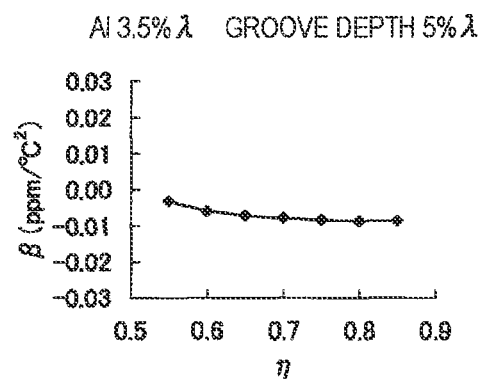
Figure 21A:
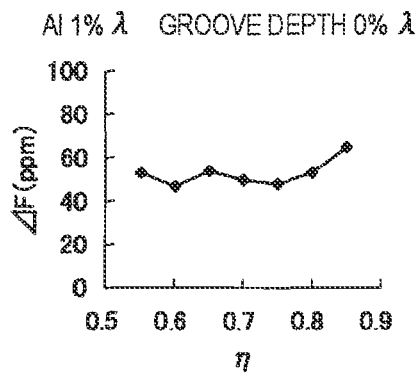
FIGS. 21A-21F are graphs showing the relationship between the line occupation rate η and frequency fluctuation amount ΔF when changing the inter-electrode finger groove depth, with the electrode film thickness as 0.01λ, where
Figure 21B:
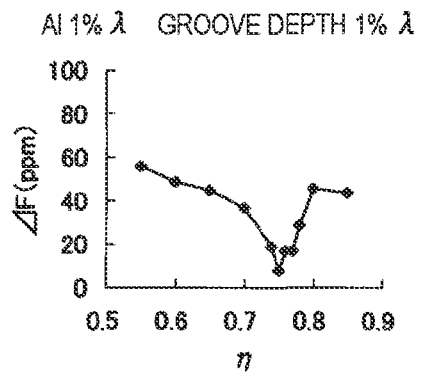
Figure 21C:
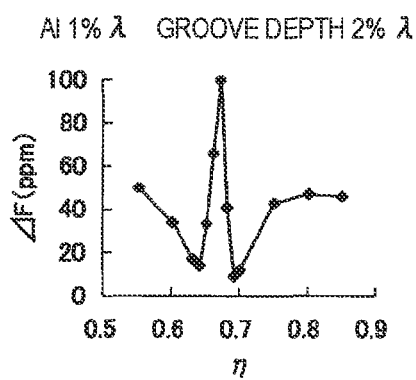
Figure 21D:
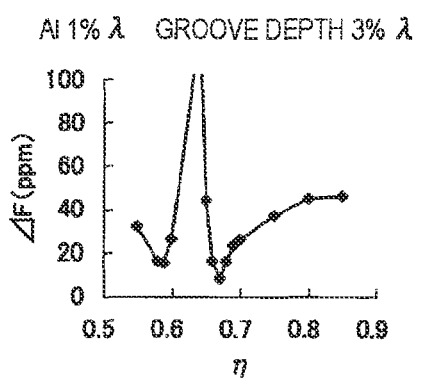
Figure 21E:
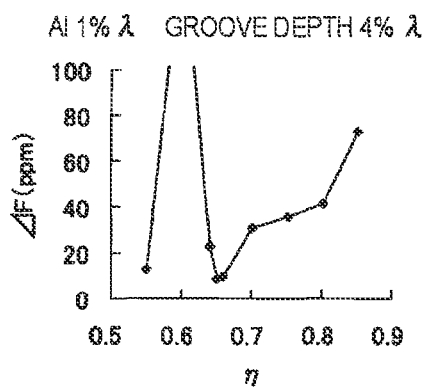
Figure 21F:
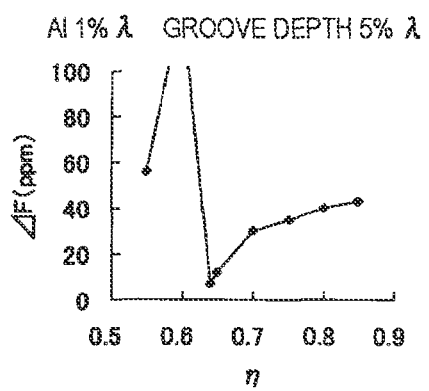
Figure 22A:
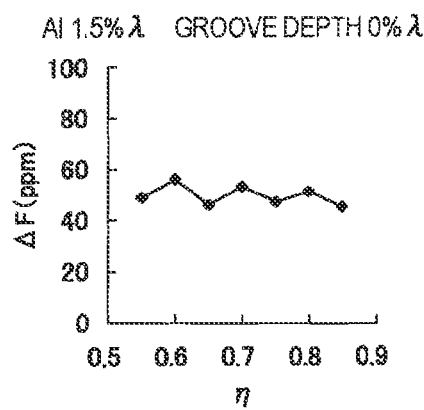
FIGS. 22A-22F are graphs showing the relationship between the line occupation rate η and frequency fluctuation amount ΔF when changing the inter-electrode finger groove depth, with the electrode film thickness as 0.015λ, where
Figure 22B:
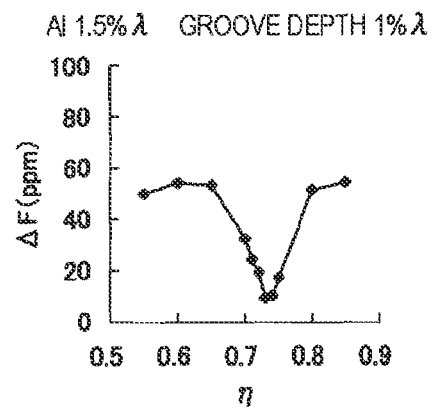
Figure 22C:
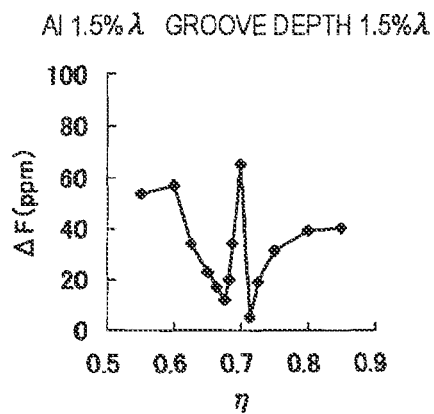
Figure 22D:
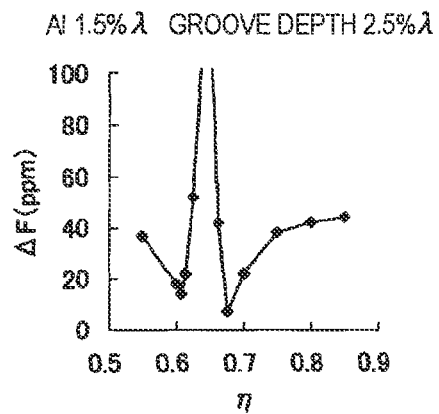
Figure 22E:
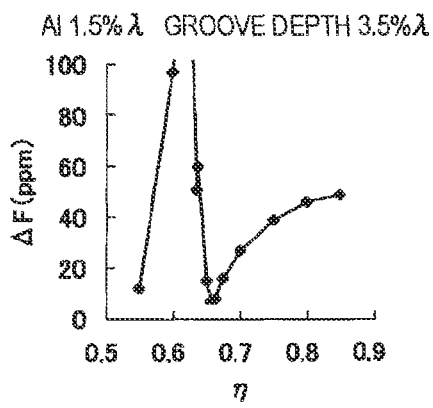
Figure 22F:
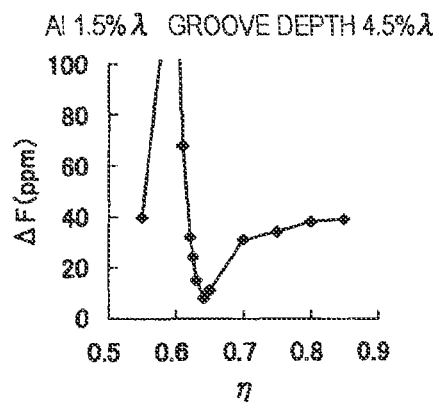
Figure 23A:
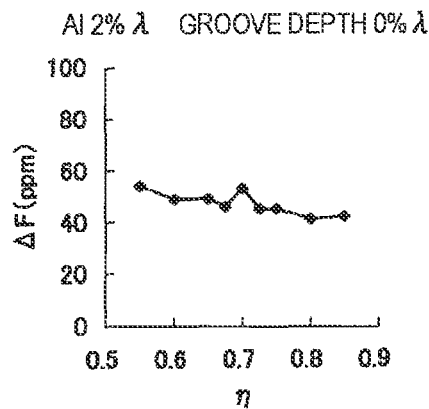
FIGS. 23A-23F are graphs showing the relationship between the line occupation rate η and frequency fluctuation amount ΔF when changing the inter-electrode finger groove depth, with the electrode film thickness as 0.02λ, where
Figure 23B:
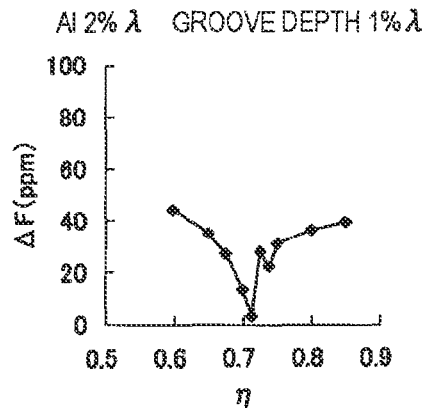
Figure 23C:
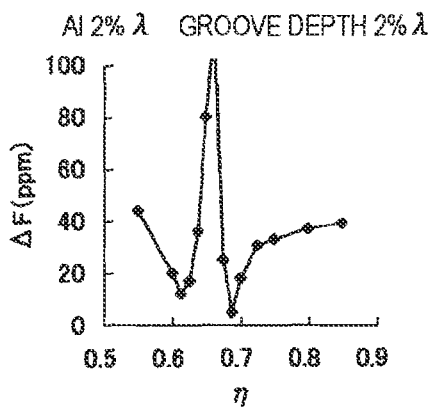
Figure 23D:
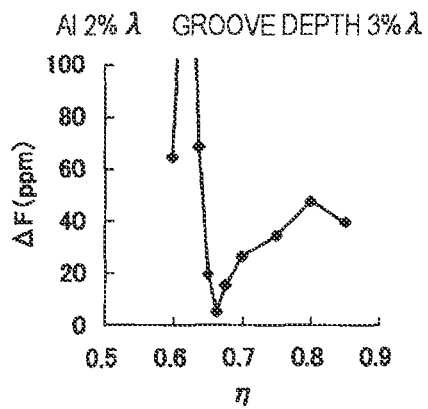
Figure 23E:
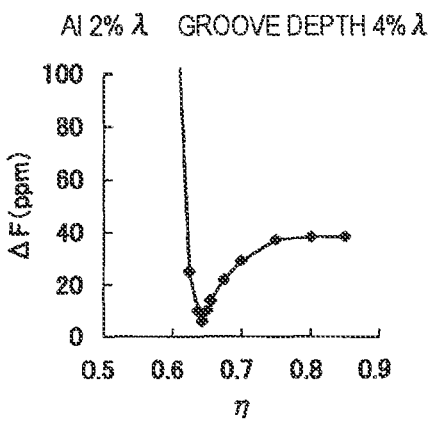
Figure 23F:
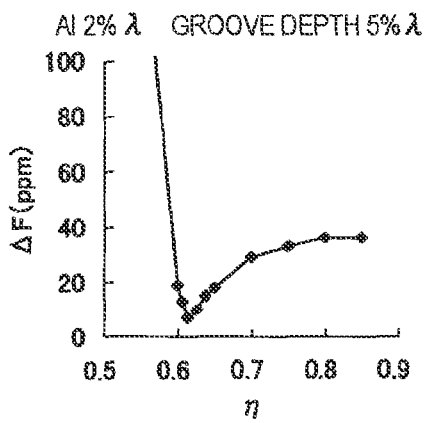
Figure 24A:
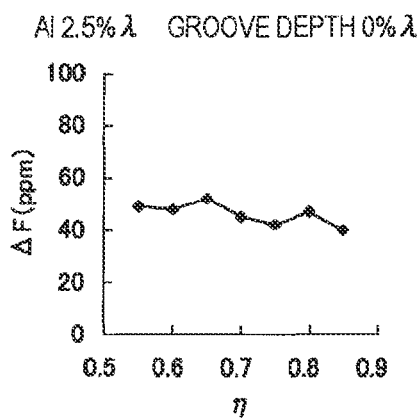
FIGS. 24A-24F are graphs showing the relationship between the line occupation rate η and frequency fluctuation amount ΔF when changing the inter-electrode finger groove depth, with the electrode film thickness as 0.025λ, where
Figure 24B:
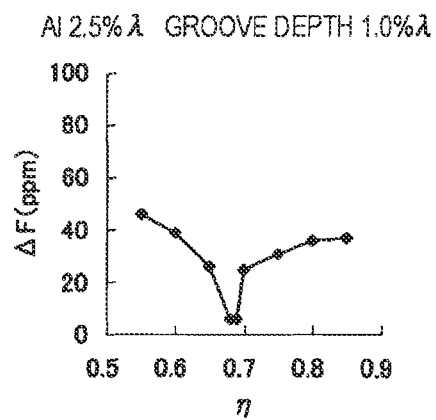
Figure 24C:
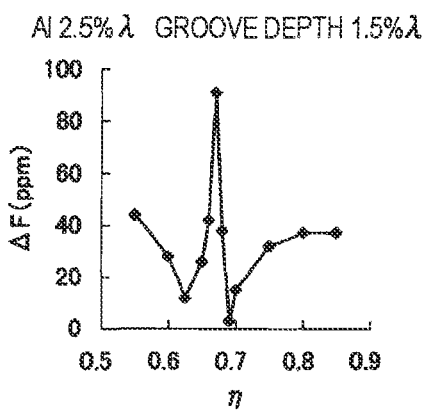
Figure 24D:
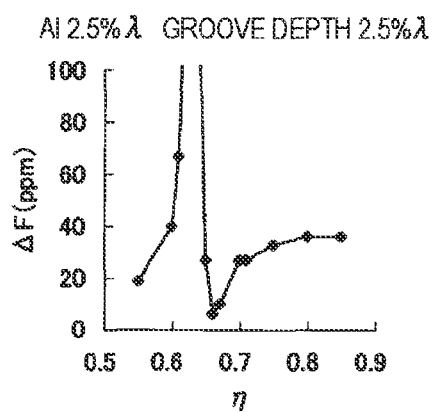
Figure 24E:
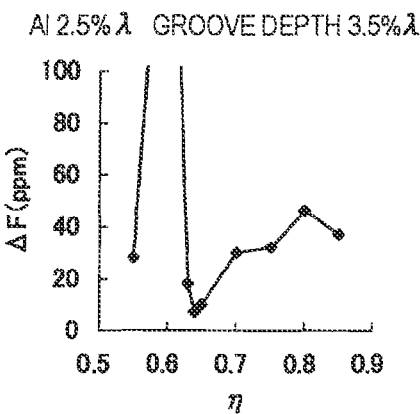
Figure 24F:
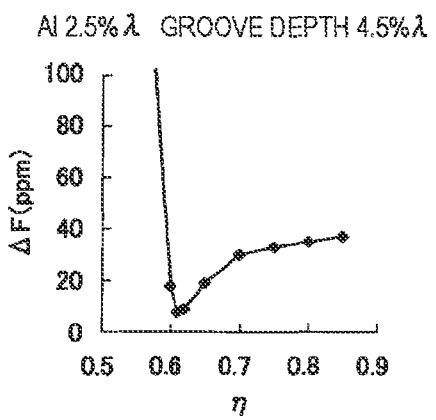
Figure 25A:
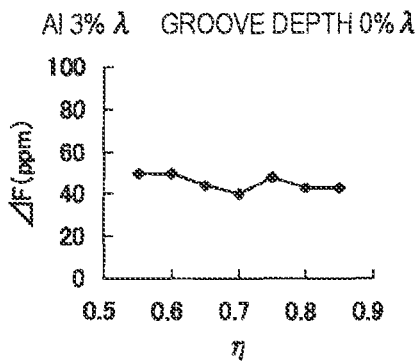
FIGS. 25A-25F are graphs showing the relationship between the line occupation rate η and frequency fluctuation amount ΔF when changing the inter-electrode finger groove depth, with the electrode film thickness as 0.03λ, where FIG. 25 A is a graph when the groove depth G is 0.
Figure 25B:
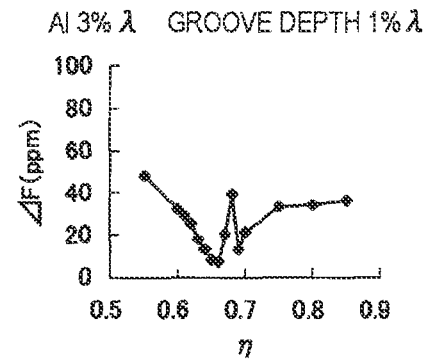
Figure 25C:
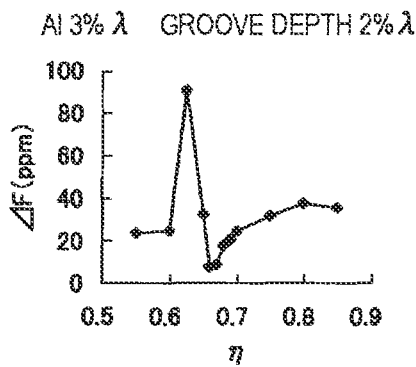
Figure 25D:
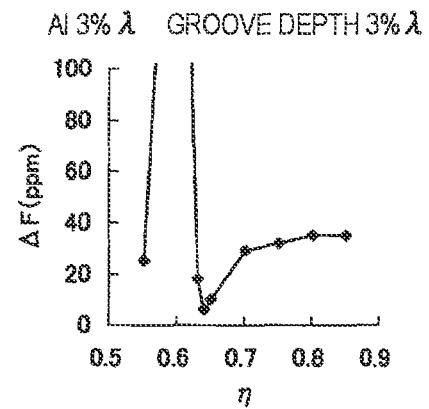
Figure 25E:
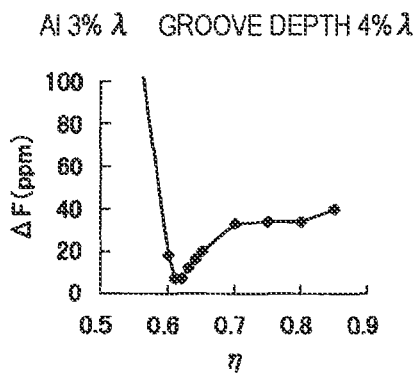
Figure 25F:
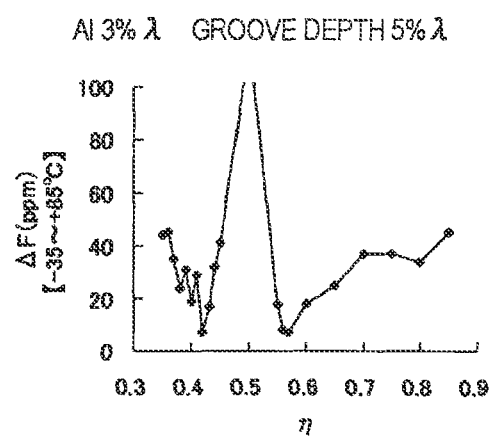
Figure 26A:
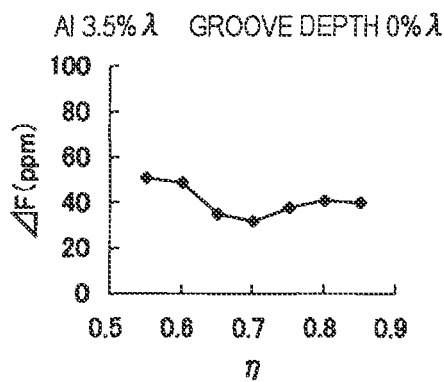
FIGS. 26A-26F are graphs showing the relationship between the line occupation rate η and frequency fluctuation amount ΔF when changing the inter-electrode finger groove depth, with the electrode film thickness as 0.035λ, where
Figure 26B:
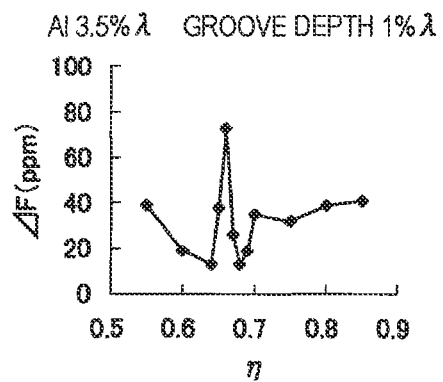
Figure 26C:
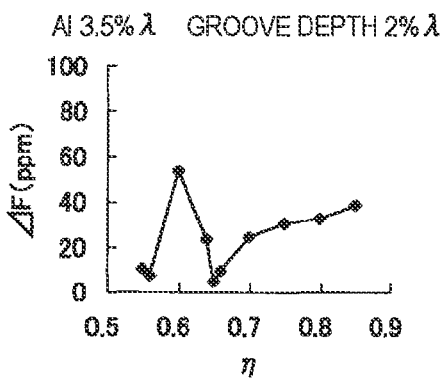
Figure 26D:
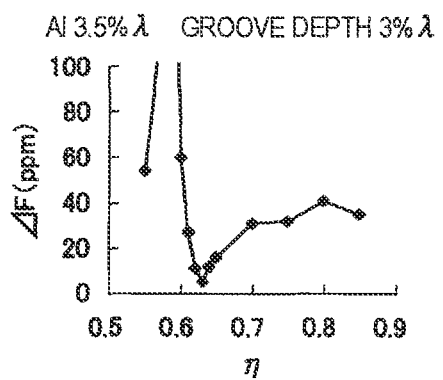
Figure 26E:
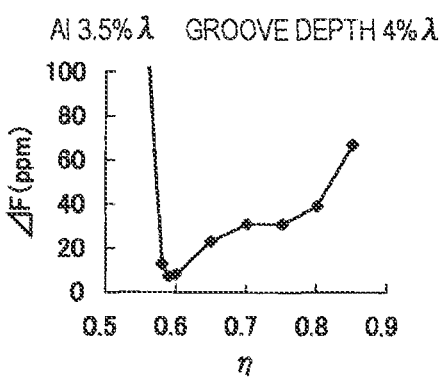
Figure 26F:
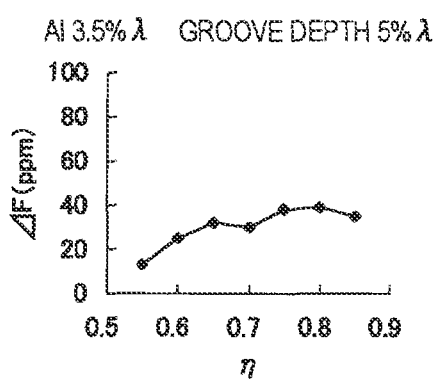

Also, when the relationship between the groove depth G and line occupation rate η at each point at which β=0 for SAW resonators 10 in which the electrode film thickness H≈0, 0.01λ, 0.02λ, 0.03λ, or 0.035λ, based on Equations (11) to (13) and Equations (5) and (6) derived therefrom, is indicated by an approximate line, the result is as in FIG. 14. The relationship between the groove depth G and line occupation rate η in the quartz crystal substrate 30 on which no electrode film is provided is as shown in FIG. 9.

When changing the electrode film thickness H at 3.0% λ (0.030λ) or less, the frequency-temperature characteristics of β=0, that is, the tertiary curve, can be obtained. At this time, a relational equation for G and η when the frequency-temperature characteristics are good can be expressed by Equation (8).

[Expression 27]

$$\eta = -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda) \quad (8)$$

Herein, the units of G and H are λ.

It should be noted that Equation (8) is established when the electrode film thickness H is in the range of 0<H≤0.030λ.

The manufacturing variation of the electrical characteristics (particularly the resonance frequency) being greater the greater the electrode film thickness, it is highly likely that the manufacturing variation of the line occupation rate η is ±0.04 or less when the electrode film thickness H is within the range of Equations (5) and (6), and that a manufacturing variation greater than ±0.04 occurs when H>0.035λ. However, provided that the electrode film thickness H is within the range of Equations (5) and (6), and the variation of the line occupation rate η is ±0.04 or less, it is possible to realize a SAW device with a low secondary temperature coefficient β. That is, when taking into consideration the manufacturing variation of the line occupation rate, and keeping the secondary temperature coefficient β within ±0.01 ppm/° C.², a line occupation rate η up to the range of Equation (9), wherein a tolerance of ±0.04 is added to Equation (8), is allowable.

[Expression 28]

$$\eta = -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda) \pm 0.04 \quad (9)$$

FIGS. 15 to 20 show graphs of the relationship between the line occupation rate η and secondary temperature coefficient β when the groove depth G is changed, in cases in which the electrode film thickness is 0.01λ (1% λ), 0.015λ (1.5% λ), 0.02λ (2% λ), 0.025λ (2.5% λ), 0.03λ (3% λ), and 0.035λ (3.5% λ), respectively.

Also, FIGS. 21 to 26 show graphs of the relationship between the line occupation rate η and frequency fluctuation amount ΔF in the SAW resonator 10 corresponding to each of the FIGS. 15 to 20. The quartz crystal substrates used are all ones with Euler angles (0°, 123°, and ψ), and with regard to ψ, an angle at which ΔF is smallest is appropriately selected.

Herein, FIG. 15 are diagrams showing the relationship between the line occupation rate η and secondary temperature coefficient β when the electrode film thickness H is 0.01λ, and FIG. 21 are diagrams showing the relationship between the line occupation rate η and frequency fluctuation amount ΔF when the electrode film thickness H is 0.01λ.

Also, FIG. 16 are diagrams showing the relationship between the line occupation rate η and secondary temperature coefficient β when the electrode film thickness H is 0.015λ, and FIG. 22 are diagrams showing the relationship between the line occupation rate η and frequency fluctuation amount ΔF when the electrode film thickness H is 0.015λ.

Also, FIG. 17 are diagrams showing the relationship between the line occupation rate η and secondary temperature coefficient β when the electrode film thickness H is 0.02λ, and FIG. 23 are diagrams showing the relationship between the line occupation rate η and frequency fluctuation amount ΔF when the electrode film thickness H is 0.02λ.

Also, FIG. 18 are diagrams showing the relationship between the line occupation rate η and secondary temperature coefficient β when the electrode film thickness H is 0.025λ, and FIG. 24 are diagrams showing the relationship between the line occupation rate η and frequency fluctuation amount ΔF when the electrode film thickness H is 0.025λ.

Also, FIG. 19 are diagrams showing the relationship between the line occupation rate η and secondary temperature coefficient β when the electrode film thickness H is 0.03λ, and FIG. 25 are diagrams showing the relationship between the line occupation rate η and frequency fluctuation amount ΔF when the electrode film thickness H is 0.03λ.

Also, FIG. 20 are diagrams showing the relationship between the line occupation rate η and secondary temperature coefficient β when the electrode film thickness H is 0.035λ, and FIG. 26 are diagrams showing the relationship between the line occupation rate η and frequency fluctuation amount ΔF when the electrode film thickness H is 0.035λ.

Although there are slight differences in all of the graphs in these diagrams (FIGS. 15 to 26), regarding the change tendencies thereof, it is seen that they are similar to those in FIGS. 8 and 10, which are graphs showing the relationship between the line occupation rate η and secondary temperature coefficient β, and line occupation rate η and frequency fluctuation amount ΔF, in the quartz crystal substrate 30 only.

That is, it can be said that an advantage according to the invention is that it can be accomplished even when propagating a surface acoustic wave on an individual quartz crystal substrate 30 from which the electrode film is omitted.

For each of the two points η1 and η2 at which the secondary temperature coefficient β becomes zero, a simulation is performed for each of the range of η1 and η2 when the range of β is expanded to |β|≤0.01, and the case in which the range of the electrode film thickness H is fixed, and the groove depth G is changed. Of η1 and η2, the larger η at which |β|≤0.01 is taken to be η1, and the smaller η at which |β|≤0.01 is η2. The quartz crystal substrates used are all ones with Euler angles (0°, 123°, and ψ), and with regard to ψ, an angle at which ΔF is smallest is appropriately selected.

Figure 27A:
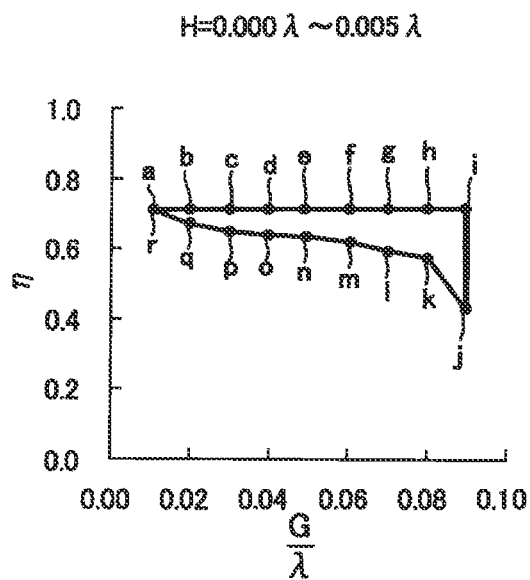
FIGS. 27A-27B are diagrams showing a range in which $|\beta| \leq 0.01$ by means of graphs showing a relationship between the line occupation rate η and groove depth G when the electrode film thickness H is $0 \leq H < 0.005\lambda$, where

FIG. 27(A) is a graph showing the relationship between η1 which satisfies the heretofore described range of β and the groove depth G, when the electrode film thickness H is 0.000λ<H≤0.005λ, and Table 3 is a table showing the coordinates (G/λ, η) of principal measurement points for fixing the range shown in FIG. 27(A), and the value of β at the measurement points.

TABLE 3

| Point | G/λ | η | β |
|---|---|---|---|
| a | 0.0100 | 0.7100 | −0.0098 |
| b | 0.0200 | 0.7100 | −0.0099 |
| c | 0.0300 | 0.7100 | −0.0095 |
| d | 0.0400 | 0.7100 | −0.0100 |
| e | 0.0500 | 0.7100 | −0.0100 |
| f | 0.0600 | 0.7100 | −0.0098 |
| g | 0.0700 | 0.7100 | −0.0099 |
| h | 0.0800 | 0.7100 | −0.0097 |
| i | 0.0900 | 0.7100 | −0.0100 |
| j | 0.0900 | 0.4200 | 0.0073 |
| k | 0.0800 | 0.5700 | 0.0086 |
| l | 0.0700 | 0.5900 | 0.0093 |
| m | 0.0600 | 0.6150 | 0.0077 |
| n | 0.0500 | 0.6300 | 0.0054 |
| o | 0.0400 | 0.6350 | 0.0097 |
| p | 0.0300 | 0.6500 | 0.0097 |
| q | 0.0200 | 0.6700 | 0.0074 |
| r | 0.0100 | 0.7100 | 0.0091 |

From FIG. 27(A) and Table 3, it can be seen that when the electrode film thickness H at η1 is within the heretofore described range, and when the groove depth G is in the range 0.01λ≤G≤0.09λ, β satisfies the heretofore described requirement in the area surrounded by the measurement points a to r.

Figure 27B:
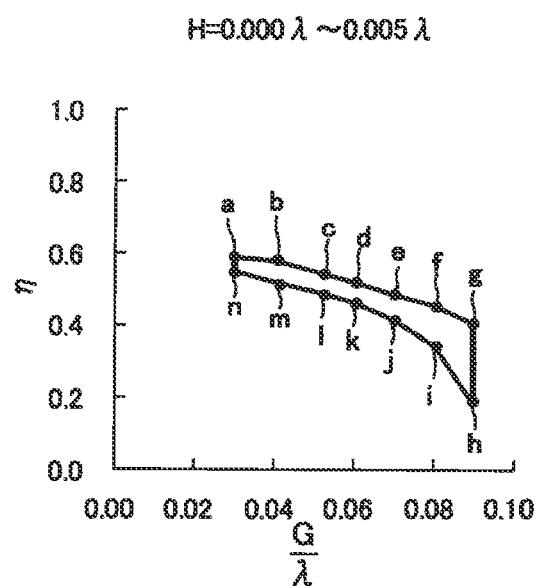

FIG. 27(B) is a graph showing the relationship between η2 which satisfies the heretofore described range of β and the groove depth G, when the electrode film thickness H is 0.000λ<H≤0.005λ, and Table 4 is a table showing the coordinates (G/λ, η) of principal measurement points for fixing the range shown in FIG. 27(B), and the value of β at the measurement points.

TABLE 4

| Point | G/λ | η | β |
|---|---|---|---|
| a | 0.0300 | 0.5900 | 0.0097 |
| b | 0.0400 | 0.5800 | 0.0097 |
| c | 0.0500 | 0.5500 | 0.0054 |
| d | 0.0600 | 0.5200 | 0.0077 |
| e | 0.0700 | 0.4800 | 0.0093 |
| f | 0.0800 | 0.4500 | 0.0086 |
| g | 0.0900 | 0.4000 | 0.0073 |
| h | 0.0900 | 0.1800 | 0.0056 |
| i | 0.0800 | 0.3400 | 0.0093 |
| j | 0.0700 | 0.4100 | 0.0078 |
| k | 0.0600 | 0.4600 | 0.0094 |
| l | 0.0500 | 0.4900 | 0.0085 |
| m | 0.0400 | 0.5200 | 0.0099 |
| n | 0.0300 | 0.5500 | 0.0098 |

From FIG. 27(B) and Table 4, it can be seen that when the electrode film thickness H at η2 is within the heretofore described range, and when the groove depth G is in the range of 0.03λ≤G≤0.09λ, β satisfies the heretofore described requirement in the area surrounded by the measurement points a to n.

Figure 28A:
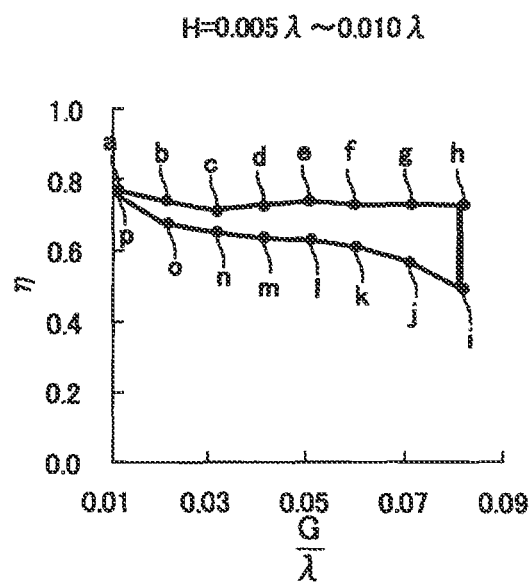
FIGS. 28A-28B are diagrams showing a range in which $|\beta| \leq 0.01$ by means of graphs showing a relationship between the line occupation rate η and groove depth G when the electrode film thickness H is $0.005\lambda \leq H < 0.010\lambda$, where

FIG. 28(A) is a graph showing the relationship between η1 which satisfies the heretofore described range of β and the groove depth G, when the electrode film thickness H is 0.005λ<H≤0.010λ, and Table 5 is a table showing the coordinates (G/λ, η) of principal measurement points for fixing the range shown in FIG. 28(A), and the value of β at the measurement points.

TABLE 5

| Point | G/λ | η | β |
|---|---|---|---|
| a | 0.0100 | 0.7700 | −0.0099 |
| b | 0.0200 | 0.7400 | −0.0100 |
| c | 0.0300 | 0.7150 | −0.0100 |
| d | 0.0400 | 0.7300 | −0.0098 |
| e | 0.0500 | 0.7400 | −0.0100 |
| f | 0.0600 | 0.7300 | −0.0098 |
| g | 0.0700 | 0.7300 | −0.0100 |
| h | 0.0800 | 0.7300 | −0.0100 |
| i | 0.0800 | 0.5000 | 0.0086 |
| j | 0.0700 | 0.5700 | 0.0100 |
| k | 0.0600 | 0.6100 | 0.0095 |
| l | 0.0500 | 0.6300 | 0.0100 |
| m | 0.0400 | 0.6350 | 0.0097 |
| n | 0.0300 | 0.6550 | 0.0070 |
| o | 0.0200 | 0.6800 | 0.0100 |
| p | 0.0100 | 0.7600 | 0.0016 |

From FIG. 28(A) and Table 5, it can be seen that when the electrode film thickness H at η1 is within the heretofore described range, and when the groove depth G is in the range of 0.01λ≤G≤0.08λ, β satisfies the heretofore described requirement in the area surrounded by the measurement points a to p.

Figure 28B:
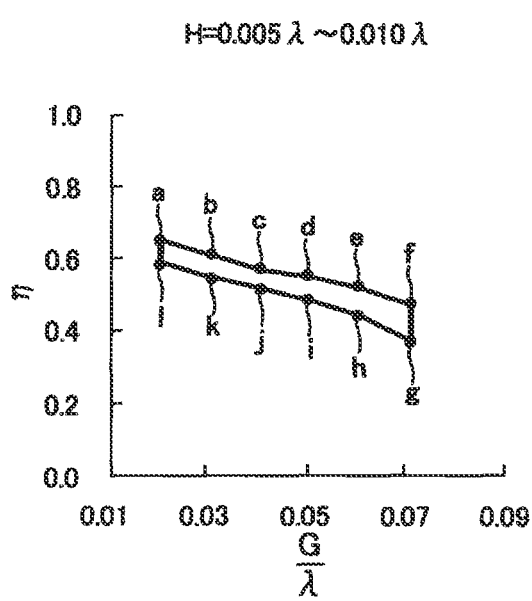

FIG. 28(B) is a graph showing the relationship between η2 which satisfies the heretofore described range of β and the groove depth G, when the electrode film thickness H is 0.005λ<H≤0.010λ, and Table 6 is a table showing the coordinates (G/λ, η) of principal measurement points for fixing the range shown in FIG. 28(B), and the value of β at the measurement points.

TABLE 6

| Point | G/λ | η | β |
|---|---|---|---|
| a | 0.0200 | 0.6500 | 0.0090 |
| b | 0.0300 | 0.6100 | 0.0098 |
| c | 0.0400 | 0.5700 | 0.0097 |
| d | 0.0500 | 0.5500 | 0.0040 |
| e | 0.0600 | 0.5200 | 0.0066 |
| f | 0.0700 | 0.4700 | 0.0070 |
| g | 0.0700 | 0.3700 | −0.0094 |
| h | 0.0600 | 0.4400 | −0.0096 |
| i | 0.0500 | 0.4800 | −0.0096 |
| j | 0.0400 | 0.5200 | −0.0095 |
| k | 0.0300 | 0.5500 | −0.0099 |
| l | 0.0200 | 0.5900 | −0.0100 |

From FIG. 28(B) and Table 6, it can be seen that when the electrode film thickness H at η2 is within the heretofore described range, and when the groove depth G is in the range of 0.02λ≤G≤0.07λ, β satisfies the heretofore described requirement in the area surrounded by the measurement points a to l.

Figure 29A:
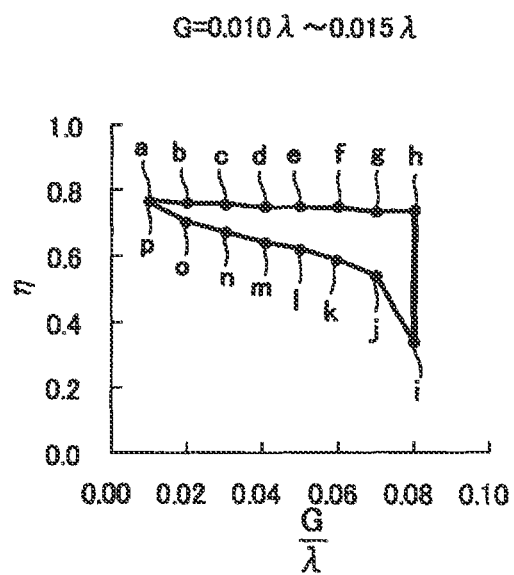
FIGS. 29A-29B are diagrams showing a range in which $|\beta| \leq 0.01$ by means of graphs showing a relationship between the line occupation rate η and groove depth G when the electrode film thickness H is $0.010\lambda \leq H < 0.015\lambda$, where

FIG. 29(A) is a graph showing the relationship between η1 which satisfies the heretofore described range of β and the groove depth G, when the electrode film thickness H is 0.010λ<H≤0.015λ, and Table 7 is a table showing the coordinates (G/λ, η) of principal measurement points for fixing the range shown in FIG. 29(A), and the value of β at the measurement points.

TABLE 7

| Point | G/λ | η | β |
|---|---|---|---|
| a | 0.0100 | 0.770 | −0.0099 |
| b | 0.0200 | 0.760 | −0.0099 |
| c | 0.0300 | 0.760 | −0.0099 |

TABLE 7-continued

| Point | G/λ | η | β |
|---|---|---|---|
| d | 0.0400 | 0.750 | −0.0099 |
| e | 0.0500 | 0.750 | −0.0099 |
| f | 0.0600 | 0.750 | −0.0099 |
| g | 0.0700 | 0.740 | −0.0099 |
| h | 0.0800 | 0.740 | −0.0098 |
| i | 0.0800 | 0.340 | 0.0088 |
| j | 0.0700 | 0.545 | 0.0088 |
| k | 0.0600 | 0.590 | 0.0099 |
| l | 0.0500 | 0.620 | 0.0090 |
| m | 0.0400 | 0.645 | 0.0060 |
| n | 0.0300 | 0.670 | 0.0030 |
| o | 0.0200 | 0.705 | 0.0076 |
| p | 0.0100 | 0.760 | 0.0010 |

From FIG. 29(A) and Table 7, it can be seen that when the electrode film thickness H at η1 is within the heretofore described range, and when the groove depth G is in the range of 0.01λ≤G≤0.08λ, β satisfies the heretofore described requirement in the area surrounded by the measurement points a to p.

Figure 29B:
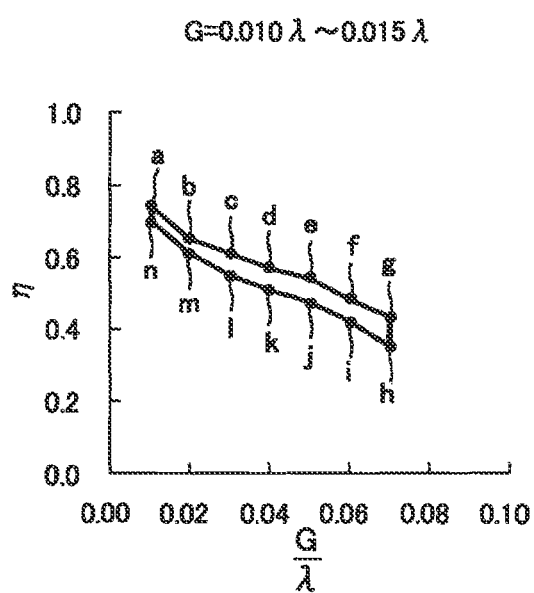

FIG. 29(B) is a graph showing the relationship between η2 which satisfies the heretofore described range of β and the groove depth G, when the electrode film thickness H is 0.010λ<H≤0.015λ, and Table 8 is a table showing the coordinates (G/λ, η) of principal measurement points for fixing the range shown in FIG. 29(B), and the value of β at the measurement points.

TABLE 8

| Point | G/λ | η | β |
|---|---|---|---|
| a | 0.0100 | 0.740 | 0.0099 |
| b | 0.0200 | 0.650 | 0.0090 |
| c | 0.0300 | 0.610 | 0.0090 |
| d | 0.0400 | 0.570 | 0.0080 |
| e | 0.0500 | 0.540 | 0.0060 |
| f | 0.0600 | 0.480 | 0.0060 |
| g | 0.0700 | 0.430 | 0.0099 |
| h | 0.0700 | 0.3500 | −0.0099 |
| i | 0.0600 | 0.4200 | −0.0090 |
| j | 0.0500 | 0.4700 | −0.0090 |
| k | 0.0400 | 0.5100 | −0.0090 |
| l | 0.0300 | 0.5500 | −0.0090 |
| m | 0.0200 | 0.6100 | −0.0099 |
| n | 0.0100 | 0.7000 | −0.0099 |

From FIG. 29(B) and Table 8, it can be seen that when the electrode film thickness H at η2 is within the heretofore described range, and when the groove depth G is in the range of 0.01λ≤G≤0.07λ, β satisfies the heretofore described requirement in the area surrounded by the measurement points a to n.

Figure 30A:
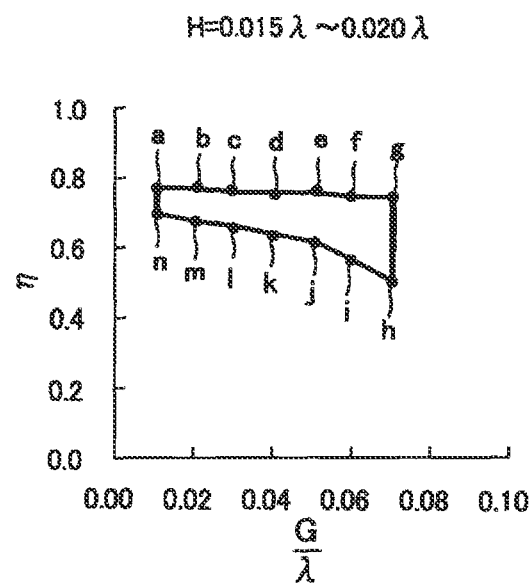
FIGS. 30A-30B are diagrams showing a range in which $|\beta| \leq 0.01$ by means of graphs showing a relationship between the line occupation rate η and groove depth G when the electrode film thickness H is $0.015\lambda \leq H < 0.020\lambda$, where

FIG. 30(A) is a graph showing the relationship between η1 which satisfies the heretofore described range of β and the groove depth G, when the electrode film thickness H is 0.015λ<H≤0.020λ, and Table 9 is a table showing the coordinates (G/λ, η) of principal measurement points for fixing the range shown in FIG. 30(A), and the value of β at the measurement points.

TABLE 9

| Point | G/λ | η | β |
|---|---|---|---|
| a | 0.010 | 0.770 | −0.0100 |
| b | 0.020 | 0.770 | −0.0100 |
| c | 0.030 | 0.760 | −0.0100 |
| d | 0.040 | 0.760 | −0.0100 |

TABLE 9-continued

| Point | G/λ | η | β |
|---|---|---|---|
| e | 0.050 | 0.760 | −0.0100 |
| f | 0.060 | 0.750 | −0.0100 |
| g | 0.070 | 0.750 | −0.0100 |
| h | 0.070 | 0.510 | 0.0100 |
| i | 0.060 | 0.570 | 0.0099 |
| j | 0.050 | 0.620 | 0.0097 |
| k | 0.040 | 0.640 | 0.0096 |
| l | 0.030 | 0.660 | 0.0080 |
| m | 0.020 | 0.675 | 0.0076 |
| n | 0.010 | 0.700 | 0.0010 |

From FIG. 30(A) and Table 9, it can be seen that when the electrode film thickness H at η1 is within the heretofore described range, and when the groove depth G is in the range of 0.01λ≤G≤0.07λ, β satisfies the heretofore described requirement in the area surrounded by the measurement points a to n.

Figure 30B:
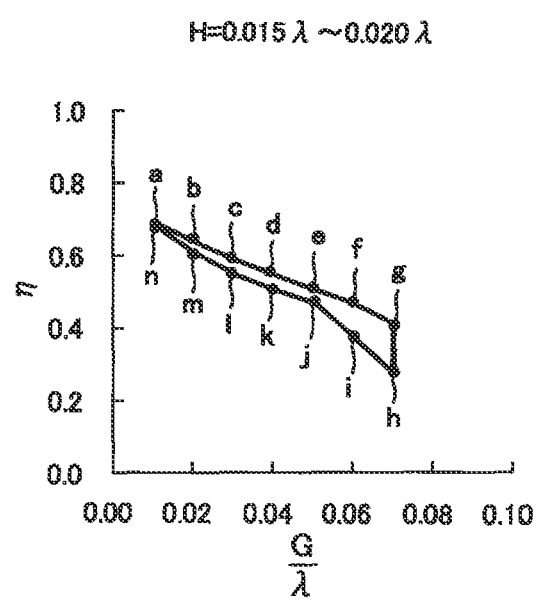

FIG. 30(B) is a graph showing the relationship between η2 which satisfies the heretofore described range of β and the groove depth G, when the electrode film thickness H is 0.015λ<H≤0.020λ, and Table 10 is a table showing the coordinates (G/λ, η) of principal measurement points for fixing the range shown in FIG. 30(B), and the value of β at the measurement points.

TABLE 10

| Point | G/λ | η | β |
|---|---|---|---|
| a | 0.010 | 0.690 | 0.0010 |
| b | 0.020 | 0.640 | 0.0090 |
| c | 0.030 | 0.590 | 0.0090 |
| d | 0.040 | 0.550 | 0.0080 |
| e | 0.050 | 0.510 | 0.0080 |
| f | 0.060 | 0.470 | 0.0090 |
| g | 0.070 | 0.415 | 0.0100 |
| h | 0.070 | 0.280 | −0.0100 |
| i | 0.060 | 0.380 | −0.0090 |
| j | 0.050 | 0.470 | −0.0090 |
| k | 0.040 | 0.510 | −0.0090 |
| l | 0.030 | 0.550 | −0.0090 |
| m | 0.020 | 0.610 | −0.0100 |
| n | 0.010 | 0.680 | −0.0100 |

From FIG. 30(B) and Table 10, it can be seen that when the electrode film thickness H at η2 is within the heretofore described range, and when the groove depth G is in the range of 0.01λ≤G≤0.07λ, β satisfies the heretofore described requirement in the area surrounded by the measurement points a to n.

Figure 31A:
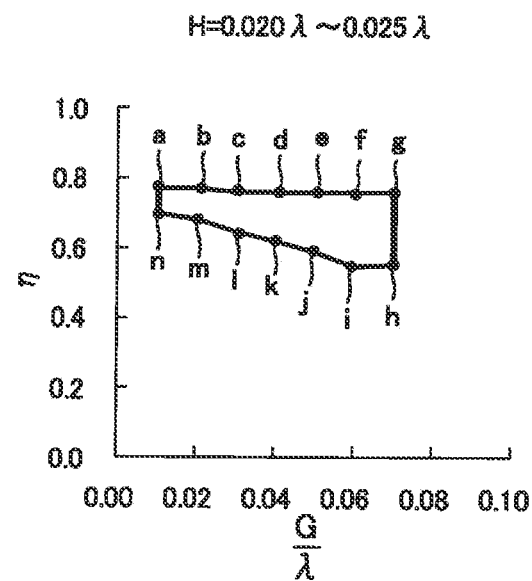
FIGS. 31A-31B are diagrams showing a range in which $|\beta| \leq 0.01$ by means of graphs showing a relationship between the line occupation rate η and groove depth G when the electrode film thickness H is $0.020\lambda \leq H < 0.025\lambda$, where

FIG. 31(A) is a graph showing the relationship between η1 which satisfies the heretofore described range of β and the groove depth G, when the electrode film thickness H is 0.020λ<H≤0.025λ, and Table 11 is a table showing the coordinates (G/λ, η) of principal measurement points for fixing the range shown in FIG. 31(A), and the value of β at the measurement points.

TABLE 11

| Point | G/λ | η | β |
|---|---|---|---|
| a | 0.010 | 0.770 | −0.0100 |
| b | 0.020 | 0.770 | −0.0100 |
| c | 0.030 | 0.760 | −0.0100 |
| d | 0.040 | 0.760 | −0.0100 |
| e | 0.050 | 0.760 | −0.0096 |
| f | 0.060 | 0.760 | −0.0100 |
| g | 0.070 | 0.760 | −0.0100 |

TABLE 11-continued

| Point | G/λ | η | β |
|---|---|---|---|
| h | 0.070 | 0.550 | 0.0100 |
| i | 0.060 | 0.545 | 0.0090 |
| j | 0.050 | 0.590 | 0.0097 |
| k | 0.040 | 0.620 | 0.0100 |
| l | 0.030 | 0.645 | 0.0100 |
| m | 0.020 | 0.680 | 0.0070 |
| n | 0.010 | 0.700 | 0.0030 |

From FIG. 31(A) and Table 11, it can be seen that when the electrode film thickness H at η1 is within the heretofore described range, and when the groove depth G is in the range of 0.01λ≤G≤0.07λ, β satisfies the heretofore described requirement in the area surrounded by the measurement points a to n.

Figure 31B:
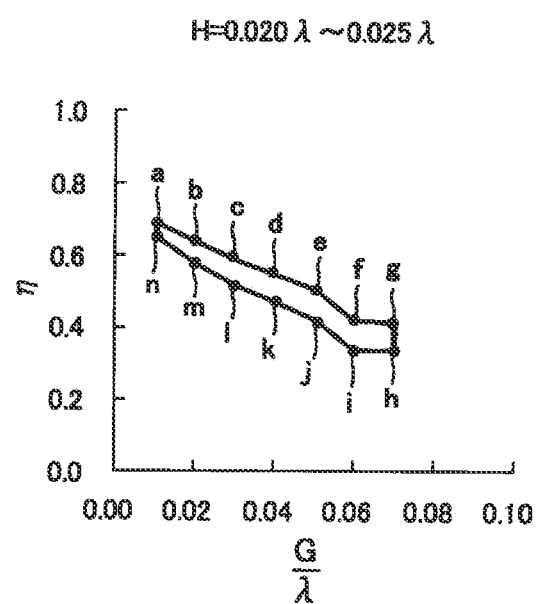

FIG. 31(B) is a graph showing the relationship between η2 which satisfies the heretofore described range of β and the groove depth G, when the electrode film thickness H is 0.020λ<H≤0.025λ, and Table 12 is a table showing the coordinates (G/λ, η) of principal measurement points for fixing the range shown in FIG. 31(B), and the value of β at the measurement points.

TABLE 12

| Point | G/λ | η | β |
|---|---|---|---|
| a | 0.010 | 0.690 | 0.0030 |
| b | 0.020 | 0.640 | 0.0090 |
| c | 0.030 | 0.590 | 0.0090 |
| d | 0.040 | 0.550 | 0.0090 |
| e | 0.050 | 0.510 | 0.0080 |
| f | 0.060 | 0.420 | 0.0090 |
| g | 0.070 | 0.415 | 0.0080 |
| h | 0.070 | 0.340 | −0.0098 |
| i | 0.060 | 0.340 | −0.0100 |
| j | 0.050 | 0.420 | −0.0100 |
| k | 0.040 | 0.470 | −0.0100 |
| l | 0.030 | 0.520 | −0.0093 |
| m | 0.020 | 0.580 | −0.0100 |
| n | 0.010 | 0.650 | −0.0090 |

From FIG. 31(B) and Table 12, it can be seen that when the electrode film thickness H at η2 is within the heretofore described range, and when the groove depth G is in the range of 0.01λ≤G≤0.07λ, β satisfies the heretofore described requirement in the area surrounded by the measurement points a to n.

Figure 32A:
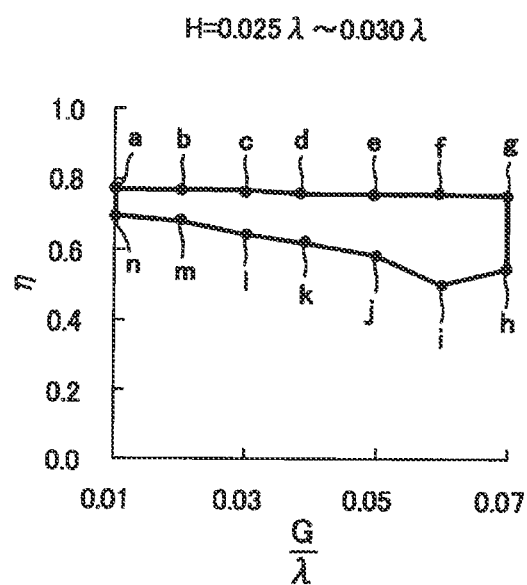
FIGS. 32A-32B are diagrams showing a range in which $|\beta| \leq 0.01$ by means of graphs showing a relationship between the line occupation rate η and groove depth G when the electrode film thickness H is $0.025\lambda \leq H<0.030\lambda$, where

FIG. 32(A) is a graph showing the relationship between η1 which satisfies the heretofore described range of β and the groove depth G, when the electrode film thickness H is 0.025λ<H≤0.030λ, and Table 13 is a table showing the coordinates (G/λ, η) of principal measurement points for fixing the range shown in FIG. 32(A), and the value of β at the measurement points.

TABLE 13

| Point | G/λ | η | β |
|---|---|---|---|
| a | 0.010 | 0.770 | −0.0098 |
| b | 0.020 | 0.770 | −0.0100 |
| c | 0.030 | 0.770 | −0.0100 |
| d | 0.040 | 0.760 | −0.0100 |
| e | 0.050 | 0.760 | −0.0099 |
| f | 0.060 | 0.760 | −0.0100 |
| g | 0.070 | 0.760 | −0.0100 |
| h | 0.070 | 0.550 | 0.0080 |
| i | 0.060 | 0.505 | 0.0087 |
| j | 0.050 | 0.590 | 0.0090 |

TABLE 13-continued

| Point | G/λ | η | β |
|---|---|---|---|
| k | 0.040 | 0.620 | 0.0100 |
| l | 0.030 | 0.645 | 0.0100 |
| m | 0.020 | 0.680 | 0.0083 |
| n | 0.010 | 0.700 | 0.0052 |

From FIG. 32(A) and Table 13, it can be seen that when the electrode film thickness H at η1 is within the heretofore described range, and when the groove depth G is in the range of 0.01λ≤G≤0.07λ, β satisfies the heretofore described requirement in the area surrounded by the measurement points a to n.

Figure 32B:
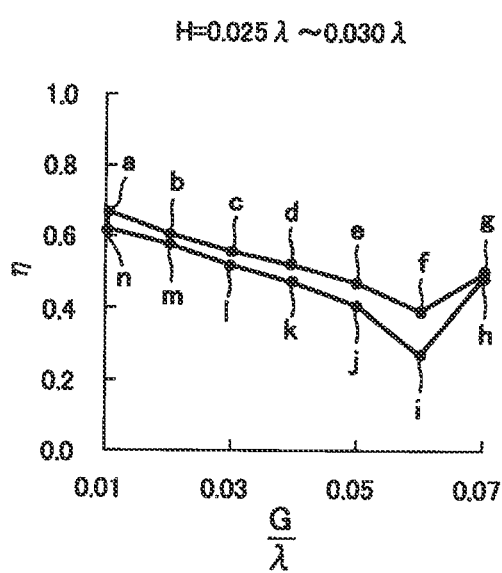

FIG. 32(B) is a graph showing the relationship between η2 which satisfies the heretofore described range of β and the groove depth G, when the electrode film thickness H is 0.025λ<H≤0.030λ, and Table 14 is a table showing the coordinates (G/λ, η) of principal measurement points for fixing the range shown in FIG. 32(B), and the value of β at the measurement points.

TABLE 14

| Point | G/λ | η | β |
|---|---|---|---|
| a | 0.010 | 0.670 | 0.0052 |
| b | 0.020 | 0.605 | 0.0081 |
| c | 0.030 | 0.560 | 0.0092 |
| d | 0.040 | 0.520 | 0.0099 |
| e | 0.050 | 0.470 | 0.0086 |
| f | 0.060 | 0.395 | 0.0070 |
| g | 0.070 | 0.500 | 0.0080 |
| h | 0.070 | 0.490 | −0.0100 |
| i | 0.060 | 0.270 | −0.0100 |
| j | 0.050 | 0.410 | −0.0100 |
| k | 0.040 | 0.470 | −0.0100 |
| l | 0.030 | 0.520 | −0.0093 |
| m | 0.020 | 0.580 | −0.0099 |
| n | 0.010 | 0.620 | −0.0090 |

From FIG. 32(B) and Table 14, it can be seen that when the electrode film thickness H at η2 is within the heretofore described range, and when the groove depth G is in the range of 0.01λ≤G≤0.07λ, β satisfies the heretofore described requirement in the area surrounded by the measurement points a to n.

Figure 33A:
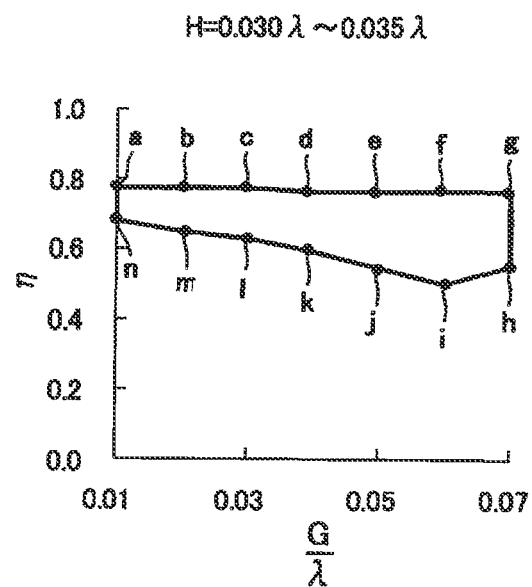
FIGS. 33A-33B are diagrams showing a range in which $|\beta| \leq 0.01$ by means of graphs showing a relationship between the line occupation rate η and groove depth G when the electrode film thickness H is $0.030\lambda \leq H<0.035\lambda$, where

FIG. 33(A) is a graph showing the relationship between η1 which satisfies the heretofore described range of β and the groove depth G, when the electrode film thickness H is 0.030λ<H≤0.035λ, and Table 15 is a table showing the coordinates (G/λ, η) of principal measurement points for fixing the range shown in FIG. 33(A), and the value of β at the measurement points.

TABLE 15

| Point | G/λ | η | β |
|---|---|---|---|
| a | 0.010 | 0.770 | −0.0100 |
| b | 0.020 | 0.770 | −0.0098 |
| c | 0.030 | 0.770 | −0.0100 |
| d | 0.040 | 0.760 | −0.0100 |
| e | 0.050 | 0.760 | −0.0100 |
| f | 0.060 | 0.760 | −0.0100 |
| g | 0.070 | 0.760 | −0.0100 |
| h | 0.070 | 0.550 | 0.0090 |
| i | 0.060 | 0.500 | 0.0087 |
| j | 0.050 | 0.545 | 0.0090 |
| k | 0.040 | 0.590 | 0.0091 |
| l | 0.030 | 0.625 | 0.0080 |

TABLE 15-continued

| Point | G/λ | η | β |
|-------|-----|---|---|
| m | 0.020 | 0.650 | 0.0083 |
| n | 0.010 | 0.680 | 0.0093 |

From FIG. 33(A) and Table 15, it can be seen that when the electrode film thickness H at η1 is within the heretofore described range, and when the groove depth G is in the range of 0.01λ≤G≤0.07λ, β satisfies the heretofore described requirement in the area surrounded by the measurement points a to n.

Figure 33B:
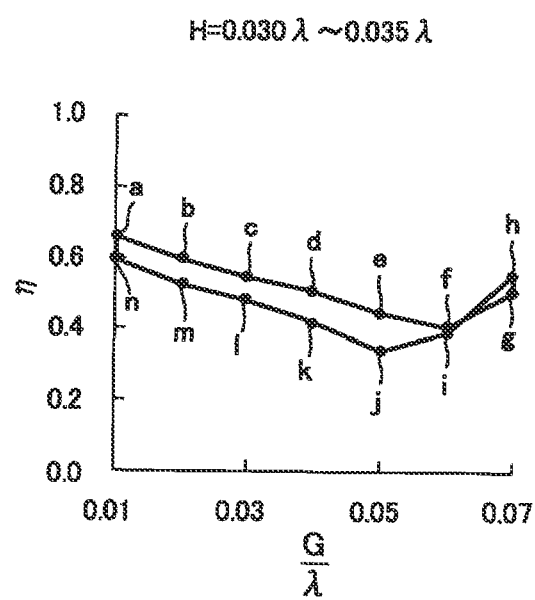
Figure 34A:
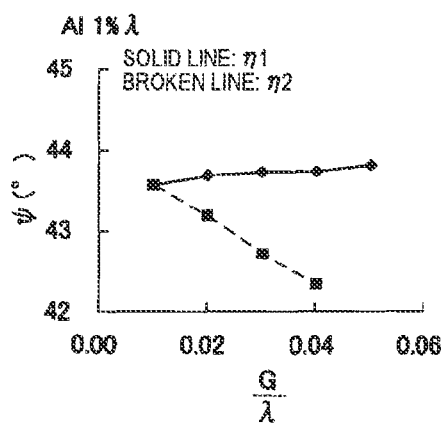
FIGS. 34A-34F are graphs showing relationships between the inter-electrode finger groove depth and an Euler angle ψ when the electrode film thickness and line occupation rate η (η1: solid line, η2: broken line) are fixed, where
Figure 34B:
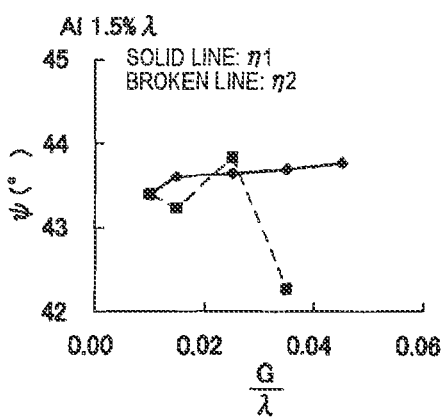
Figure 34C:
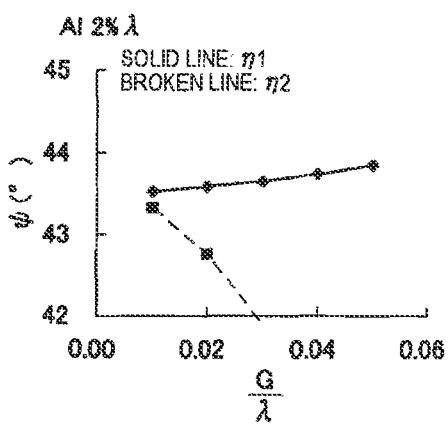
Figure 34D:
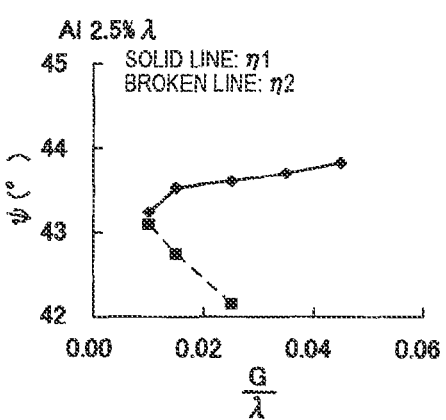
Figure 34E:
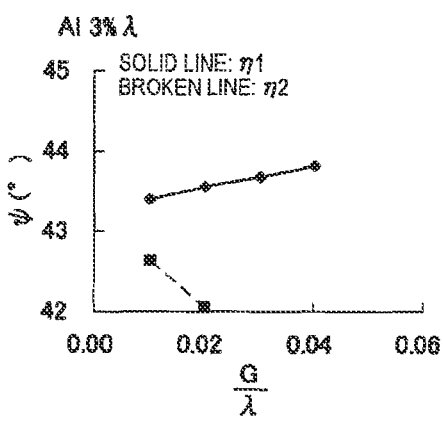
Figure 34F:
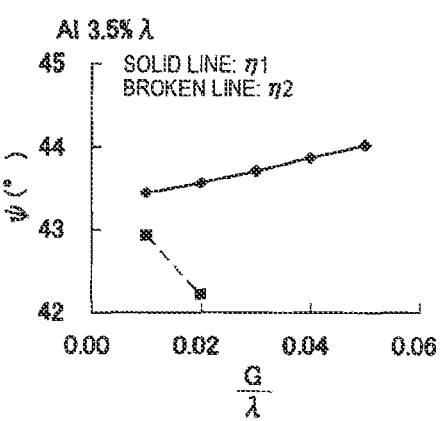

FIG. 33(B) is a graph showing the relationship between η2 which satisfies the heretofore described range of β and the groove depth G, when the electrode film thickness H is 0.030λ<H≤0.035λ, and Table 16 is a table showing the coordinates (G/λ, η) of principal measurement points for fixing the range shown in FIG. 33(B), and the value of β at the measurement points.

TABLE 16

| Point | G/λ | η | β |
|-------|-----|---|---|
| a | 0.010 | 0.655 | 0.0080 |
| b | 0.020 | 0.590 | 0.0081 |
| c | 0.030 | 0.540 | 0.0092 |
| d | 0.040 | 0.495 | 0.0099 |
| e | 0.050 | 0.435 | 0.0090 |
| f | 0.060 | 0.395 | 0.0061 |
| g | 0.070 | 0.500 | 0.0090 |
| h | 0.070 | 0.550 | −0.0100 |
| i | 0.060 | 0.380 | −0.0090 |
| j | 0.050 | 0.330 | −0.0100 |
| k | 0.040 | 0.410 | −0.0095 |
| l | 0.030 | 0.470 | −0.0099 |
| m | 0.020 | 0.520 | −0.0100 |
| n | 0.010 | 0.590 | −0.0100 |

From FIG. 33(B) and Table 16, it can be seen that when the electrode film thickness H at η2 is within the heretofore described range, and when the groove depth G is in the range of 0.01λ≤G≤0.07λ, β satisfies the heretofore described requirement in the area surrounded by the measurement points a to n.

Figure 35:
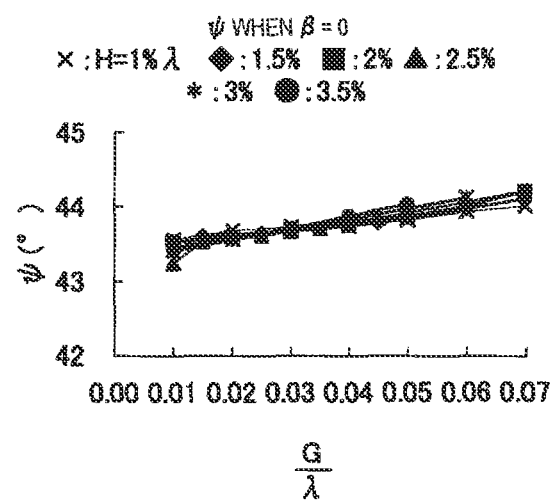
FIG. 35 is a diagram in which the relationships between the inter-electrode finger groove depth G and Euler angle ψ for each electrode film thickness H are summarized in a graph.

The relationship between ψ and the groove depth G obtained from η1 in the graphs shown in FIG. 34 is summarized in FIG. 35. The reason for selecting η1 is as heretofore described. As shown in FIG. 35, there is hardly any change in the angle ψ, even though the thickness of the electrode film changes, and it is seen that the optimum angle ψ changes in accordance with the fluctuation of the groove depth G. It can be said that this too is proof that a high proportion of the change in the secondary temperature coefficient β is due to the form of the quartz crystal substrate 30.

Figure 36:
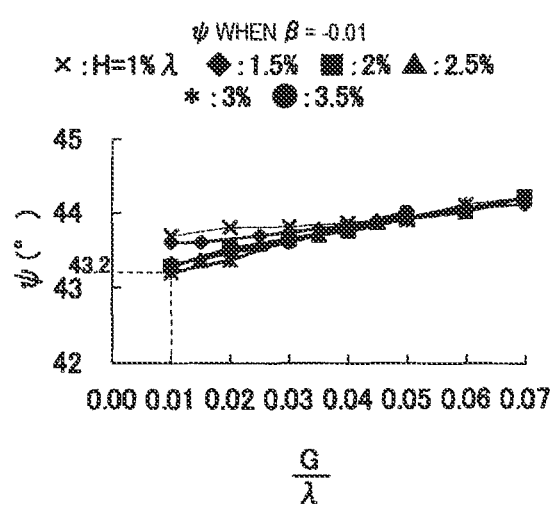
FIG. 36 is a graph showing a relationship between an inter-electrode finger groove depth at which the secondary temperature coefficient β is $-0.01$ (ppm/° $C.^2$) and the Euler angle ψ.
Figure 37:
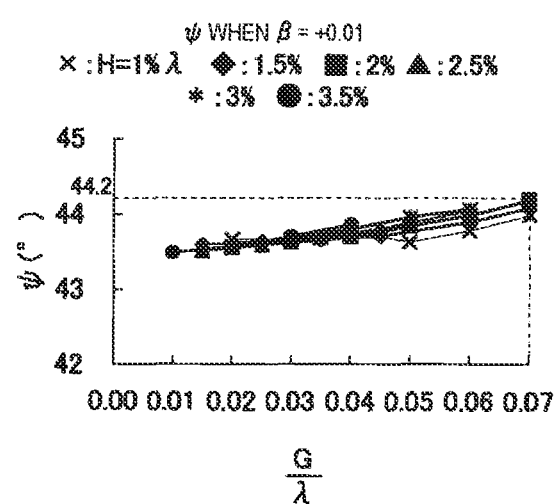
FIG. 37 is a graph showing a relationship between an inter-electrode finger groove depth at which the secondary temperature coefficient β is $+0.01$ (ppm/° $C.^2$) and the Euler angle ψ.

In the same way as heretofore described, the relationships between the groove depth G and ψ when the secondary temperature coefficient β=−0.01 (ppm/° C.$^2$), and ψ when β=+0.01 (ppm/° C.$^2$), are obtained, and summarized in FIGS. 36 and 37. By obtaining from these graphs (FIGS. 35 to 37) the angles ψ at which it is possible to achieve −0.01≤β≤+0.01, it is possible to fix the preferable ψ angle range under the heretofore described conditions at 43°<ψ<45°, and it is possible to more preferably fix the range at 43.2°≤ψ≤44.2.

A simulation is carried out for the range of ψ which satisfies the requirement |β|≤0.01 when changing the groove depth G, in the case of changing the electrode film thickness H. The results of the simulation are shown in FIGS. 38 to 44.

The quartz crystal substrates used are all ones with Euler angles (0°, 123°, and ψ), and with regard to ψ, an angle at which ΔF is smallest is appropriately selected.

Figure 38A:
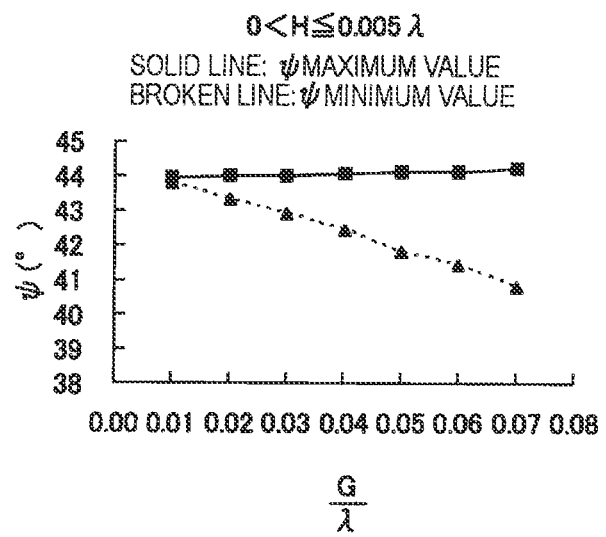
FIGS. 38A-38B are graphs showing a range of ψ which satisfies the requirement of $|\beta| \leq 0.01$ (ppm/° $C.^2$) when the range of the electrode film thickness H is $0<H \leq 0.005\lambda$, where

FIG. 38(A) is a graph showing the range of ψ which satisfies the requirement |β|≤0.01 when the range of the electrode film thickness H is 0<H≤0.005λ. Herein, the range sandwiched by the straight line connecting the plots indicating the maximum value of ψ and the broken line connecting the plots indicating the minimum value of ψ is the range which satisfies the heretofore described condition.

Figure 38B:
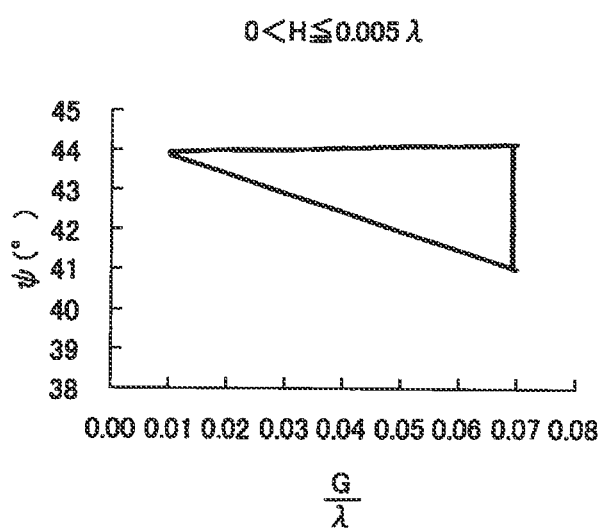

With the groove depth G in the range of 0.01λ≤G≤0.0695λ, when approximating the range of the solid line and broken line shown in FIG. 38(A) as a polygon, it can be shown as in FIG. 38(B), and it can be said that β satisfies the heretofore described condition in a range corresponding to the interior of the polygon shown by the solid lines in FIG. 38(B). When expressing the range of the polygon shown in FIG. 38(B) in an approximate equation, it can be expressed by Equations (14) and (15).

[Expression 29]

$$\psi \leq 3.0 \times G/\lambda + 43.92$$

provided that $$0.0100\lambda \leq G \leq 0.0695\lambda \quad (14)$$

[Expression 30]

$$\psi \geq -48.0 \times G/\lambda + 44.35$$

provided that $$0.0100\lambda \leq G \leq 0.0695\lambda \quad (15)$$

Figure 39A:
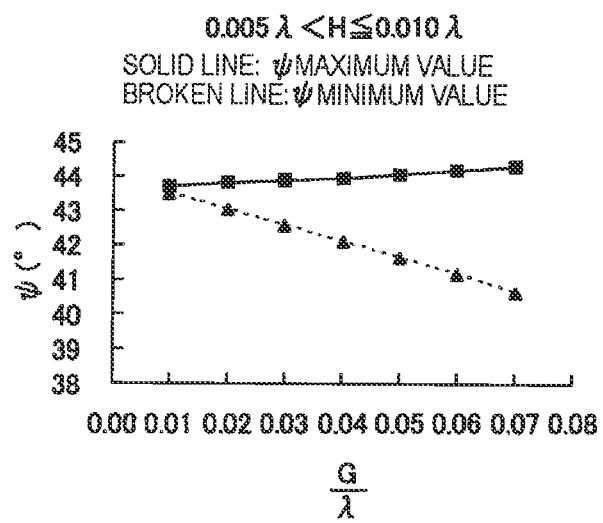
FIGS. 39A-39B are graphs showing a range of ψ which satisfies the requirement of $|\beta| \leq 0.01$ (ppm/° $C.^2$) when the range of the electrode film thickness H is $0.005\lambda<H \leq 0.010\lambda$, where

FIG. 39(A) is a graph showing the range of ψ which satisfies the requirement |β|≤0.01 when the range of the electrode film thickness H is 0.005λ<H≤0.010λ. Herein, the range sandwiched by the straight line connecting the plots indicating the maximum value of ψ and the broken line connecting the plots indicating the minimum value of ψ is the range which satisfies the heretofore described condition.

Figure 39B:
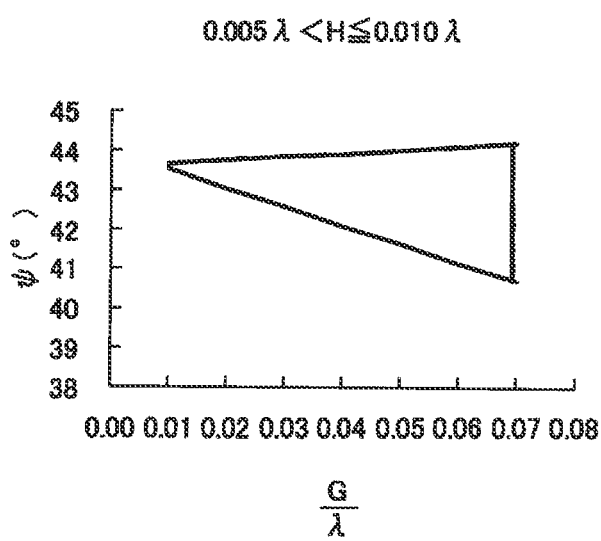

With the groove depth G in the range of 0.01λ≤G≤0.0695λ, when approximating the range of the solid line and broken line in FIG. 39(A) as a polygon, it can be shown as in FIG. 29(B), and it can be said that β satisfies the heretofore described condition in a range corresponding to the interior of the polygon shown by the solid lines in FIG. 39(B). When expressing the range of the polygon shown in FIG. 39(B) in an approximate equation, it can be expressed by Equations (16) and (17).

[Expression 31]

$$\psi \leq 8.0 \times G/\lambda + 43.60$$

provided that $$0.010\lambda \leq G \leq 0.06952 \quad (16)$$

[Expression 32]

$$\psi \geq -48.0 \times G/\lambda + 44.00$$

provided that $$0.0100\lambda \leq G \leq 0.0695\lambda \quad (17)$$

Figure 40A:
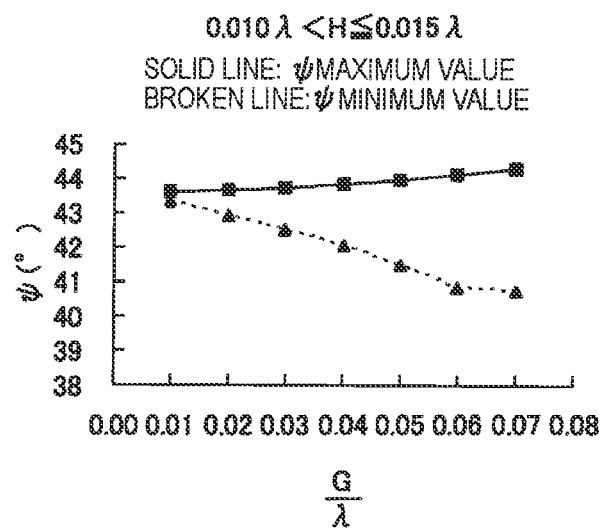
FIGS. 40A-40B are graphs showing a range of ψ which satisfies the requirement of $|\beta| \leq 0.01$ (ppm/° $C.^2$) when the range of the electrode film thickness H is $0.010\lambda<H \leq 0.015\lambda$, where

FIG. 40(A) is a graph showing the range of ψ which satisfies the requirement |β|≤0.01 when the range of the electrode film thickness H is 0.010λ<H≤0.015λ. Herein, the range sandwiched by the straight line connecting the plots indicating the maximum value of ψ and the broken line connecting the plots indicating the minimum value of ψ is the range which satisfies the heretofore described condition.

Figure 40B:
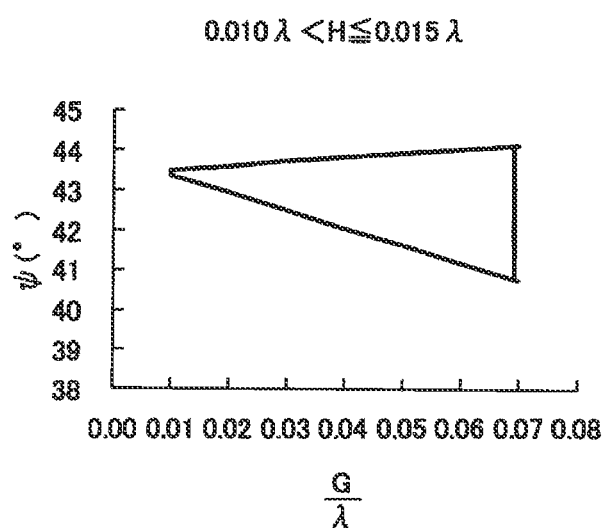

With the groove depth G in the range of 0.01λ≤G≤0.0695λ, when approximating the range of the solid line and broken line in FIG. 40(A) as a polygon, it can be shown as in FIG. 40(B), and it can be said that β satisfies the heretofore described condition in a range corresponding to the interior of the polygon shown by the solid lines in FIG. 40(B). When expressing the range of the polygon shown in FIG. 40(B) in an approximate equation, it can be expressed by Equations (18) and (19).

[Expression 33]

$$\psi \leq 10.0 \times G/\lambda + 43.40$$

provided that $$0.0100\lambda \leq G \leq 0.0695\lambda \quad (18)$$

[Expression 34]

$$\psi \geq -44.0 \times G/\lambda + 43.80$$

provided that $$0.0100\lambda \leq G \leq 0.0695\lambda \quad (19)$$

Figure 41A:
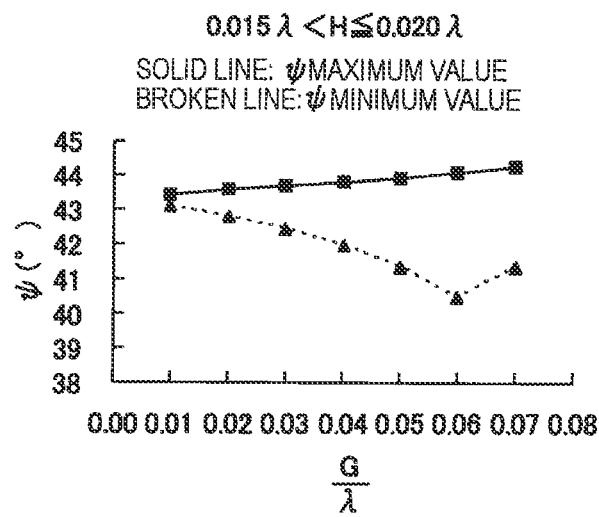
FIGS. 41A-41B are graphs showing a range of ψ which satisfies the requirement of $|\beta| \leq 0.01$ (ppm/° $C.^2$) when the range of the electrode film thickness H is $0.015\lambda<H \leq 0.020\lambda$, where

FIG. 41(A) is a graph showing the range of ψ which satisfies the requirement |β|≤0.01 when the range of the electrode film thickness H is 0.015<H≤0.020λ. Herein, the range sandwiched by the straight line connecting the plots indicating the maximum value of ψ and the broken line connecting the plots indicating the minimum value of ψ is the range which satisfies the heretofore described condition.

Figure 41B:
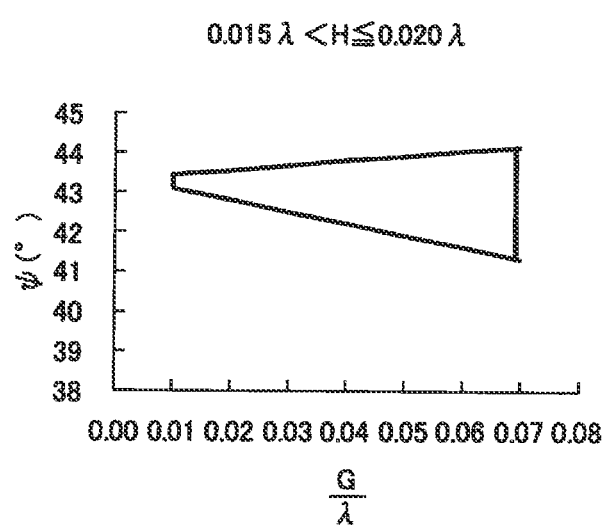

With the groove depth G in the range of 0.01λ≤G≤0.0695λ, when approximating the range of the solid line and broken line in FIG. 41(A) as a polygon, it can be shown as in FIG. 41(B), and it can be said that β satisfies the heretofore described condition in a range corresponding to the interior of the polygon shown by the solid lines in FIG. 41(B). When expressing the range of the polygon shown in FIG. 41(B) in an approximate equation, it can be expressed by Equations (20) and (21).

[Expression 35]

$$\psi \leq 12.0 \times G/\lambda + 43.31$$

provided that $$0.0100\lambda \leq G \leq 0.0695\lambda \quad (20)$$

[Expression 36]

$$\psi \geq -30.0 \times G/\lambda + 44.40$$

provided that $$0.0100\lambda \leq G \leq 0.0695\lambda \quad (21)$$

Figure 42A:
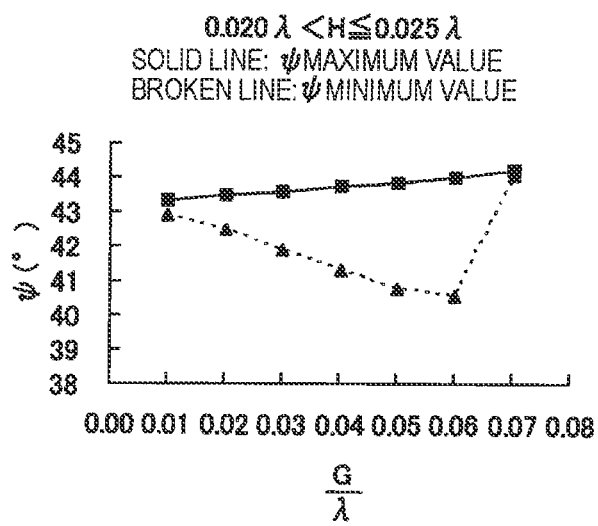
FIGS. 42A-42B are graphs showing a range of ψ which satisfies the requirement of $|\beta| \leq 0.01$ (ppm/° $C.^2$) when the range of the electrode film thickness H is $0.020\lambda<H \leq 0.025\lambda$, where

FIG. 42(A) is a graph showing the range of ψ which satisfies the requirement |β|≤0.01 when the range of the electrode film thickness H is 0.020λ<H≤0.025λ. Herein, the range sandwiched by the straight line connecting the plots indicating the maximum value of ψ and the broken line connecting the plots indicating the minimum value of ψ is the range which satisfies the heretofore described condition.

Figure 42B:
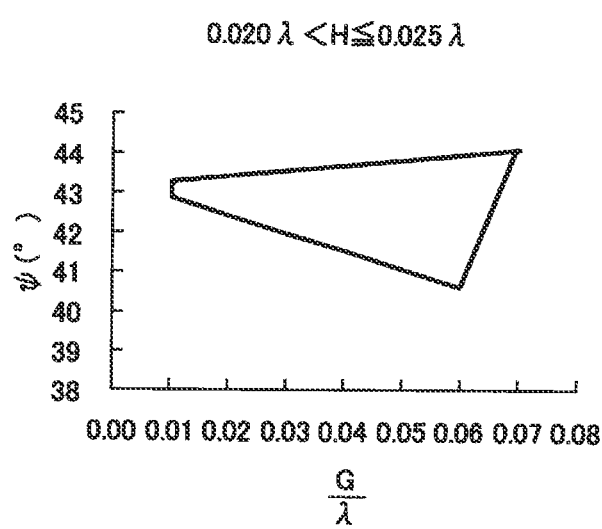

With the groove depth G in the range of 0.01λ≤G≤0.0695λ, when approximating the range of the solid line and broken line in FIG. 42(A) as a polygon, it can be shown as in FIG. 42(B), and it can be said that β satisfies the heretofore described condition in a range corresponding to the interior of the polygon shown by the solid lines in FIG. 42(B). When expressing the range of the polygon shown in FIG. 42(B) in an approximate equation, it can be expressed by Equations (22) to (24).

[Expression 37]

$$\psi \leq 14.0 \times G/\lambda + 43.16$$

provided that $$0.0100\lambda \leq G \leq 0.0695\lambda \quad (22)$$

[Expression 38]

$$\psi \geq -45.0 \times G/\lambda + 43.35$$

provided that $$0.0100\lambda \leq G \leq 0.0600\lambda \quad (23)$$

[Expression 39]

$$\psi \geq 367.368 \times G/\lambda + 18.608$$

provided that $$0.0600\lambda \leq G \leq 0.06952\lambda \quad (24)$$

Figure 43A:
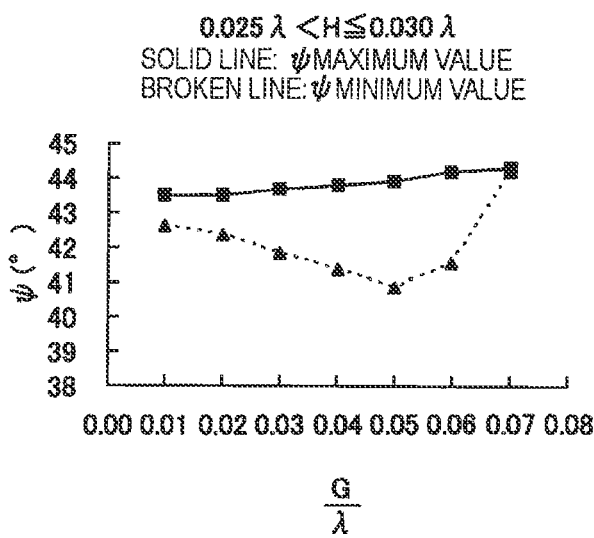
FIGS. 43A-43B are graphs showing a range of ψ which satisfies the requirement of $|\beta| \leq 0.01$ (ppm/° $C.^2$) when the range of the electrode film thickness H is $0.025\lambda<H \leq 0.030\lambda$, where

FIG. 43(A) is a graph showing the range of ψ which satisfies the requirement |β|≤0.01 when the range of the electrode film thickness H is 0.025λ<H≤0.030λ. Herein, the range sandwiched by the straight line connecting the plots indicating the maximum value of ψ and the broken line connecting the plots indicating the minimum value of ψ is the range which satisfies the heretofore described condition.

Figure 43B:
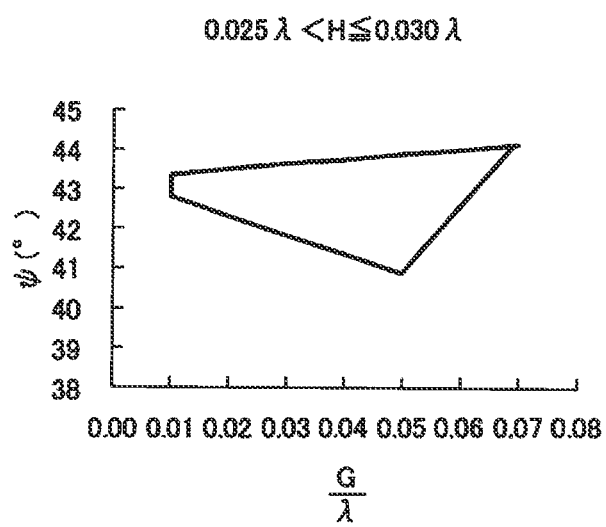

With the groove depth G in the range of 0.01λ≤G≤0.0695λ, when approximating the range of the solid line and broken line in FIG. 43(A) as a polygon, it can be shown as in FIG. 43(B), and it can be said that β satisfies the heretofore described condition in a range corresponding to the interior of the polygon shown by the solid lines in FIG. 43(B). When expressing the range of the polygon shown in FIG. 43(B) in an approximate equation, it can be expressed by Equations (25) to (27).

[Expression 40]

$$\psi \leq 12.0 \times G/\lambda + 43.25$$

provided that $$0.0100\lambda \leq G \leq 0.0695\lambda \quad (25)$$

[Expression 41]

$$\psi \geq -50.0 \times G/\lambda + 43.32$$

provided that $$0.0100\lambda \leq G \leq 0.0500\lambda \quad (26)$$

[Expression 42]

$$\psi \geq 167.692 \times G/\lambda + 32.435$$

provided that $$0.0500\lambda \leq G \leq 0.0695\lambda \quad (27)$$

Figure 44A:
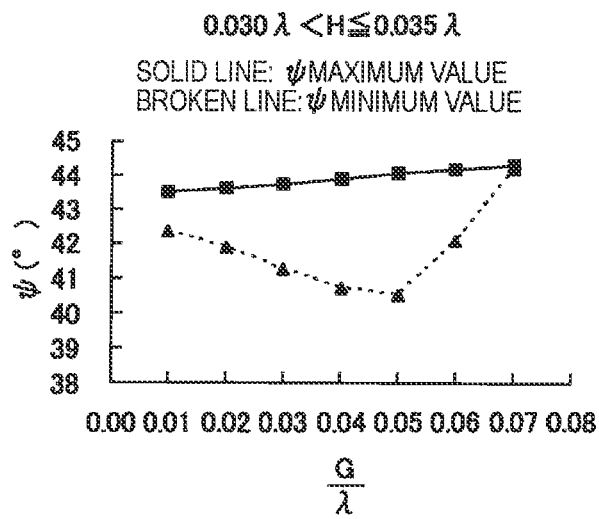
FIGS. 44A-44B are graphs showing a range of ψ which satisfies the requirement of $|\beta| \leq 0.01$ (ppm/° $C.^2$) when the range of the electrode film thickness H is $0.030\lambda<H \leq 0.035\lambda$, where

FIG. 44(A) is a graph showing the range of ψ which satisfies the requirement |β|≤0.01 when the range of the electrode film thickness H is 0.030λ<H≤0.035λ. Herein, the range sandwiched by the straight line connecting the plots indicating the maximum value of ψ and the broken line connecting the plots indicating the minimum value of ψ is the range which satisfies the heretofore described condition.

Figure 44B:
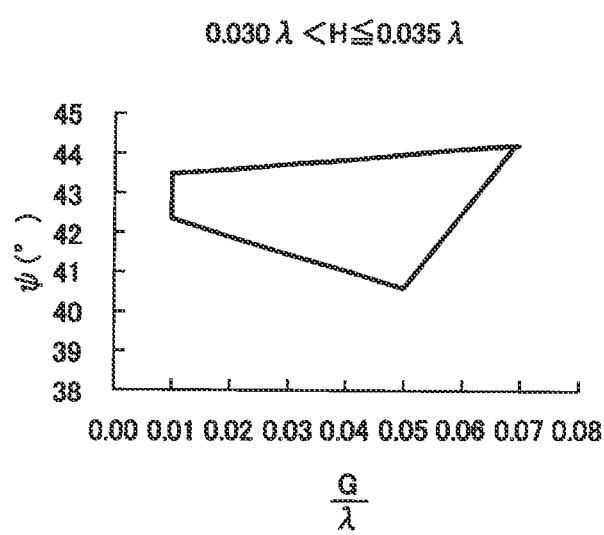

With the groove depth G in the range of 0.01λ≤G≤0.0695λ, when approximating the range of the solid line and broken line in FIG. 44(A) as a polygon, it can be shown as in FIG. 44(B), and it can be said that β satisfies the heretofore described condition in a range corresponding to the interior of the polygon shown by the solid lines in FIG. 44(B). When expressing the range of the polygon shown in FIG. 44(B) in an approximate equation, it can be expressed by Equations (28) to (30).

[Expression 43]

$$\psi \leq 12.0 \times G/\lambda + 43.35$$

provided that $$0.0100\lambda \leq G \leq 0.0695\lambda \quad (28)$$

[Expression 44]

$$\psi \geq -45.0 \times G/\lambda + 42.80$$

provided that $$0.0100\lambda \leq G \leq 0.0500\lambda \quad (29)$$

[Expression 45]

$$\psi \geq 186.667 \times G/\lambda + 31.217$$

provided that $$0.0500\lambda \leq G \leq 0.0695\lambda \quad (30)$$

Figure 45:
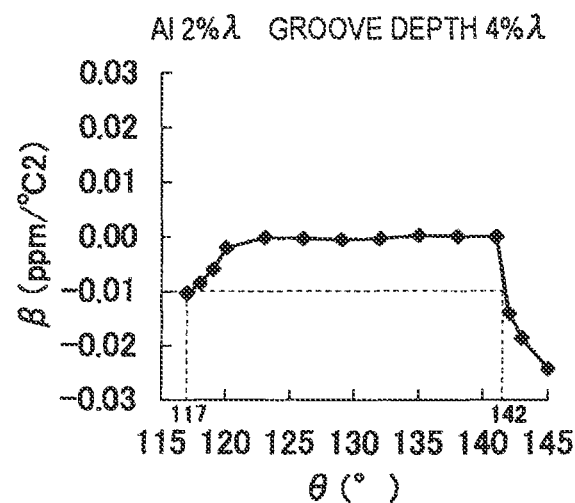
FIG. 45 is a graph showing a relationship between an Euler angle θ and the secondary temperature coefficient β when the electrode film thickness is 0.02λ and the inter-electrode finger groove depth 0.04λ.

Next, the change in the secondary temperature coefficient β when the angle θ is altered, that is, the relationship between θ and the secondary temperature coefficient β, is shown in FIG. 45. Herein, the SAW device used in the simulation is a quartz crystal substrate with cut angles and SAW propagation direction of (0, θ, and ψ) in Euler angle representation, with a groove depth G of 0.04λ, and the electrode film thickness H is 0.02λ. With regard to ψ, a value at which the absolute value of the secondary temperature coefficient β is smallest in the heretofore described angle range is appropriately selected, based on the θ setting angle. Also, with regard to η, it is 0.6383, in accordance with Equation (8).

Under these kinds of condition, from FIG. 45, which shows the relationship between θ and the secondary temperature coefficient β, it can be seen that, provided that θ is within the range of 117° or more to 142° or less, the absolute values of the secondary temperature coefficient β are within a range of 0.01 (ppm/° C.$^2$). Therefore, it can be said that, with the heretofore described kinds of setting value, by fixing θ in the range of 117°≤θ≤142°, it is possible to configure a SAW resonator 10 which has good frequency-temperature characteristics.

Tables 17 to 19 are shown as simulation data proving the relationship between θ and the secondary temperature coefficient β.

TABLE 17

| H/λ % | G/λ % | θ ° | β ppm/° C.$^2$ |
|---|---|---|---|
| 0.01 | 4.00 | 117 | −0.009 |
| 0.01 | 4.00 | 142 | 0.005 |
| 3.50 | 4.00 | 117 | −0.009 |
| 3.50 | 4.00 | 142 | −0.008 |

Table 17 being a table showing the relationship between θ and the secondary temperature coefficient β when the electrode film thickness H is changed, it shows the values of the secondary temperature coefficient β at the critical values (117° and 142°) of θ when the electrode film thickness H is 0.01% λ, and when the electrode film thickness H is 3.50% λ. The groove depths G in the simulation are all 4% λ. From Table 17, it can be seen that, in the range of 117°≤θ≤142°, even though the thickness of the electrode film thickness H is changed (0≈0.01% λ and 3.5% λ stipulated as critical values of the electrode film thickness), |β|≤0.01 is satisfied regardless of the thickness.

TABLE 18

| H/λ % | G/λ % | θ ° | β ppm/° C.$^2$ |
|---|---|---|---|
| 2.00 | 1.00 | 117 | −0.009 |
| 2.00 | 1.00 | 142 | −0.008 |
| 2.00 | 6.95 | 117 | −0.009 |
| 2.00 | 6.95 | 142 | −0.009 |

Table 18 being a table showing the relationship between θ and the secondary temperature coefficient β when the groove depth G is changed, it shows the values of the secondary temperature coefficient β at the critical values (117° and 142°) of θ when the groove depth G is 1.00% λ and 6.95% λ. The electrode film thicknesses H in the simulation are all 2.00% λ. From Table 18, it can be seen that, in the range of 117°≤θ≤142°, even though the groove depth G is changed (1.00% λ and 6.95% λ stipulated as critical values of the groove depth G), |β|≤0.01 is satisfied regardless of the depth.

TABLE 19

| H/λ % | G/λ % | η | θ ° | β ppm/° C.$^2$ |
|---|---|---|---|---|
| 2.00 | 4.00 | 0.62 | 117 | −0.010 |
| 2.00 | 4.00 | 0.62 | 142 | −0.003 |
| 2.00 | 4.00 | 0.76 | 117 | −0.009 |
| 2.00 | 4.00 | 0.76 | 142 | −0.009 |

Table 19 being a table showing the relationship between θ and the secondary temperature coefficient β when the line occupation rate η is changed, it shows the values of the secondary temperature coefficient β at the critical values (117° and 142°) of θ when the line occupation rate η is 0.62 and 0.76. The electrode film thicknesses H in the simulation are all 2.00% λ, and the groove depths G are all 4.00% λ. From Table 19, it can be seen that, in the range of 117°≤θ≤142°, even though the line occupation rate η is changed (η=0.62 and 0.76 are the minimum value and maximum value of η when the groove depth is 4% λ in FIG. 31(A), which shows the relationship between the line occupation rate η (η1) and groove depth G with the electrode film thickness H in the range of 0.020λ to 0.025), |β|≤0.01 is satisfied regardless of the value.

Figure 46:
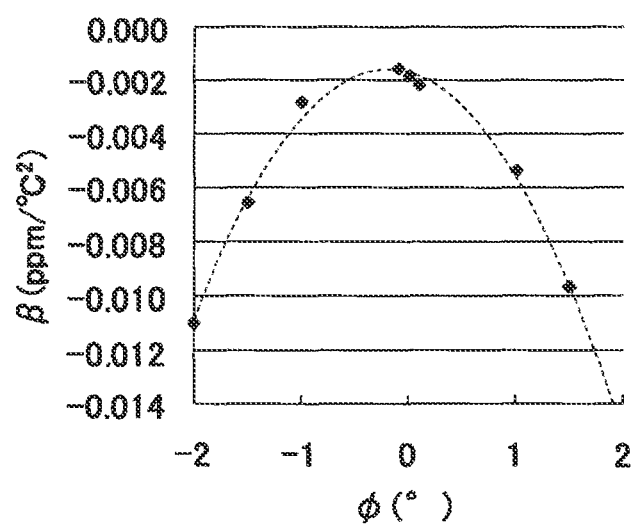
FIG. 46 is a graph showing a relationship between an Euler angle φ and the secondary temperature coefficient β.

FIG. 46 is a graph showing the relationship between the angle φ and the secondary temperature coefficient β in the case of using a quartz crystal substrate 30 of (φ, 123°, and 43.77°) in Euler angle representation, with a groove depth G of 0.04λ, an electrode film thickness H of 0.02λ, and a line occupation rate η of 0.65.

From FIG. 46, it can be seen that when φ is −2° and +2°, the secondary temperature coefficient β is lower than −0.01 in each case, but provided that φ is in the range of −1.5° to +1.5°, the absolute values of the secondary temperature coefficient β are consistently within a range of 0.01. Therefore, with the heretofore described kinds of setting value, by fixing φ in the range of −1.5°≤φ≤+1.5°, or preferably −1°≤φ≤+1°, it is possible to configure a SAW resonator 10 which has good frequency-temperature characteristics.

Figure 47:
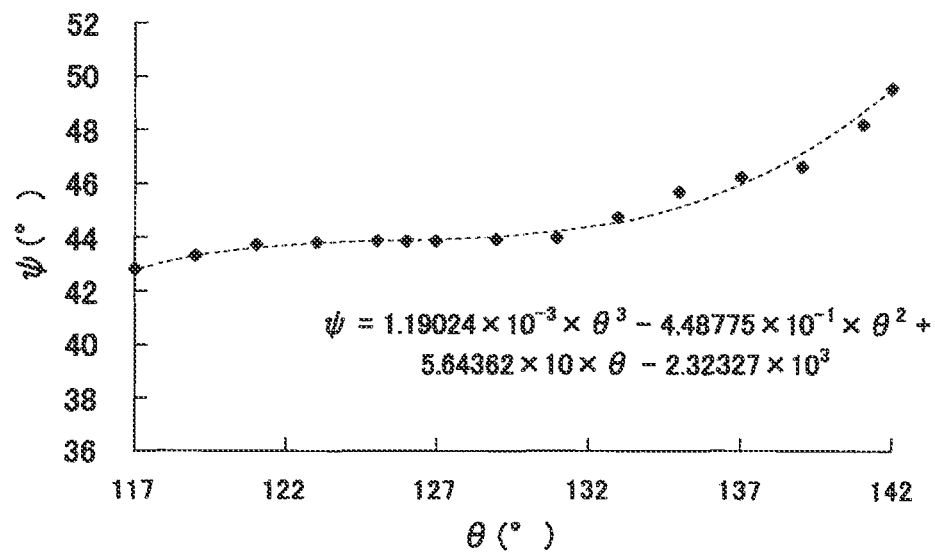
FIG. 47 is a graph showing a relationship between the Euler angle θ and Euler angle ψ when the frequency-temperature characteristics are good.

In the above description, the range of optimum values of each of φ, θ, and ψ is derived for the relationship with the groove depth G under constant conditions. In contrast to this, an extremely preferable relationship between θ and ψ, wherein the frequency fluctuation amount at −40° C. to +85° C. is smallest, is shown in FIG. 47, and an approximate equation is obtained. According to FIG. 47, the angle ψ changes along with an increase of the angle θ, increasing in such a way as to describe a tertiary curve. In the example of FIG. 47, ψ is 42.79° when θ=117°, and ψ is 49.57° when θ=142°. When showing these plots as an approximate curve, they become the curve shown by the broken line in FIG. 47, and can be expressed as an approximate equation by Equation (31).

[Expression 46]

$$\psi = 1.19024 \times 10^{-3} \times \theta^3 - 4.48775 \times 10^{-1} \times \theta^2 + 5.64362 \times 10^1 \times \theta - 2.32327 \times 10^3 \pm 1.0 \quad (31)$$

Because of this, it is possible to fix ψ by θ being fixed, and it is possible to make the range of ψ 42.79°≤ψ≤49.57° when the range of θ is 117°≤θ≤142°. The groove depth G and electrode film thickness H in the simulation are G=0.04λ and H=0.02λ.

Due to the heretofore described kinds of reason, by configuring the SAW resonator 10 in accordance with the various conditions fixed in the embodiment, it is possible to obtain a SAW resonator which can realize good frequency-temperature characteristics fulfilling the target values.

Figure 54:
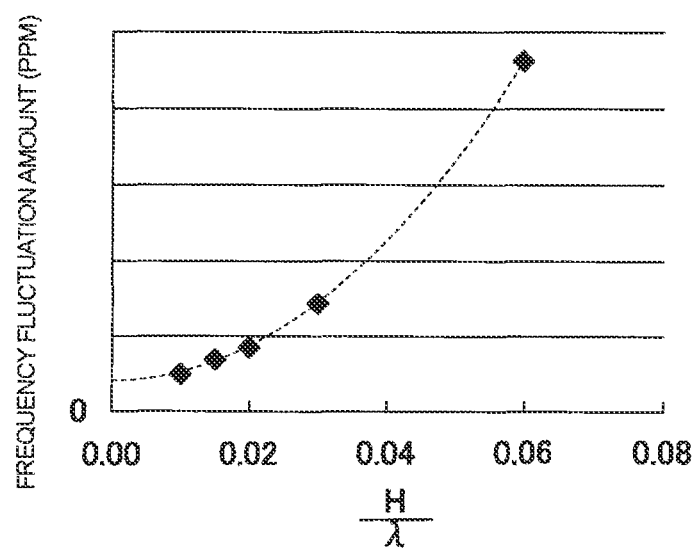
FIG. 54 is a graph showing a relationship between the electrode film thickness H and frequency fluctuation in a heat cycle test.

Also, with the SAW resonator 10 according to the embodiment, the improvement in the frequency-temperature characteristics is sought by having the film thickness H of the electrode film in the range of 0<H≤0.035λ, as shown in Equation (7) and FIGS. 15 to 26. This, differing from the heretofore known way of seeking improvement in the frequency-temperature characteristics by making the film thickness H extremely large, realizes the improvement in the frequency-temperature characteristics while still maintaining environmental resistance characteristics. The relationship between the electrode film thickness (Al electrode film thickness) and frequency fluctuation in a heat cycle test is shown in FIG. 54. The results of the heat cycle test shown in FIG. 54 are taken after a cycle in which the SAW resonator is exposed to an ambience of −55° C. for 30 minutes, then exposed for 30 minutes with the ambient temperature raised to +125° C., is repeated eight times. From FIG. 54, it can be seen that the frequency fluctuation (F fluctuation) in the range of the electrode film thickness H of the SAW resonator 10 according to the embodiment is ⅓ or less in comparison with that of a case in which the electrode film thickness H is 0.06λ, and in which no inter-electrode finger groove is provided. For every plot in FIG. 54, H+G=0.06λ.

Also, on carrying out a high temperature storage test on a SAW resonator manufactured under the same conditions as those in FIG. 54, exposing it to an ambience of 125° C. for 1,000 hours, it is confirmed that the frequency fluctuation amount of the SAW resonator according to the embodiment before and after testing (the four conditions H=0.03λ and G=0.03λ, H=0.02λ and G=0.04λ, H=0.015λ and G=0.045λ, and H=0.01λ and G=0.05λ) is ⅓ or less in comparison with that of the heretofore known SAW resonator (H=0.06λ and G=0).

Figure 48:
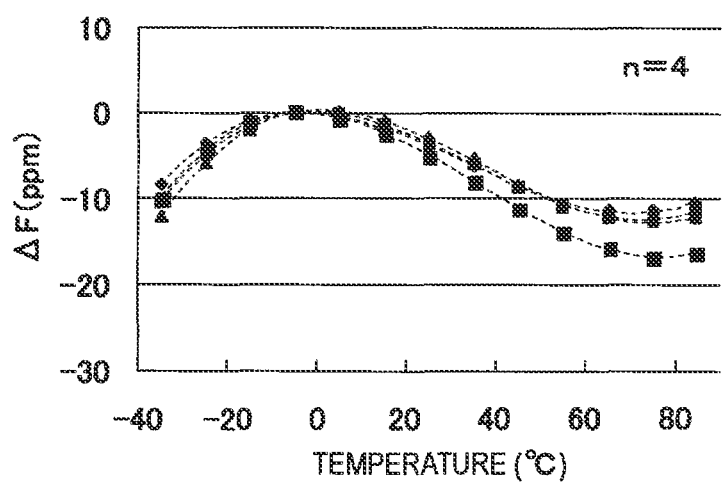
FIG. 48 is a diagram showing an example of frequency-temperature characteristic data from four test specimens under conditions at which the frequency-temperature characteristics are best.

With the SAW resonator 10 manufactured under the heretofore described kinds of condition, conditions wherein H+G=0.067λ (aluminum film thickness 2,000 Å, groove depth 4,700 Å), the IDT line occupation rate ηi=0.6, the reflector line occupation rate ηr=0.8, the Euler angles are (0°, 123°, and 43.5°), the IDT pair number is 120, the intersection width is 40λ (λ=10 μm), the number of reflectors (per side) is 72 (36 pairs), and the electrode fingers have no angle of tilt (the electrode finger array direction and SAW phase velocity direction correspond), frequency-temperature characteristics like those shown in FIG. 48 are exhibited.

In FIG. 48, the frequency-temperature characteristics are plotted for n=4 test specimens. According to FIG. 48, it can be seen that the frequency fluctuation amount ΔF in the operating temperature range of the test specimens is kept to 20 ppm or less.

In the embodiment, a description has been given of the effect on the frequency-temperature characteristics of the groove depth G, electrode film thickness H, and the like. However, the combined depth of the groove depth G and electrode film thickness H (the level difference) also has an effect on static characteristics such as the equivalent circuit constant and CI value, and on the Q value. For example, FIG. 49 is a graph showing the relationship between the level difference and CI value when changing the level difference from 0.062λ to 0.071λ. According to FIG. 49, it can be seen that the CI value converges when the level difference is 0.067λ, and does not improve (does not become lower) even when increasing the level difference further.

The frequency, equivalent circuit constant, and static characteristics of the SAW resonator 10 exhibiting frequency-temperature characteristics like those shown in FIG. 48 are collected in FIG. 50. Herein, F represents the frequency, Q the Q value, γ the capacity ratio, CI the CI (crystal impedance) value, and M the figure of merit (figure of merit).

Figure 52:
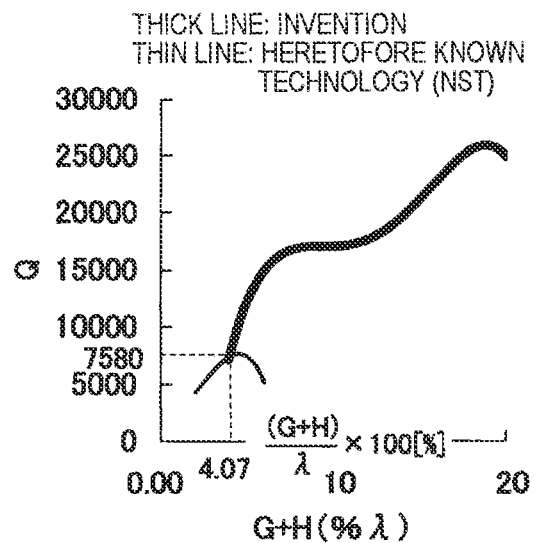
FIG. 52 is a graph for comparing a relationship between the level difference and a Q value for the heretofore known SAW resonator and a relationship between the level difference and the Q value for the SAW resonator according to the embodiment.

Also, FIG. 52 shows a graph for comparing the relationship between the level difference and Q value for the heretofore known SAW resonator and the SAW resonator 10 according to the embodiment. In FIG. 52, the graph shown with the thick line indicating the characteristics of the SAW resonator 10 according to the embodiment, grooves are provided between the electrode fingers, and the stop band upper end mode resonance is used. The graph shown with the thin line indicating the characteristics of the heretofore known SAW resonator, the stop band upper end mode resonance is used with no groove being provided between the electrode fingers. As is clear from FIG. 52, when providing the grooves between the electrode fingers, and using the stop band upper end mode resonance, a higher Q value is obtained in the area in which the level difference (G+H) is 0.0407λ (4.07% λ) or more than in the case of using the stop band lower end mode resonance with no groove being provided between the electrode fingers.

The basic data of the SAW resonators according to the simulation are as follows.

Basic Data of SAW Resonator 10 According to the Embodiment
H: 0.02λ
G: changes
IDT line occupation rate ηi: 0.6
Reflector line occupation rate ηr: 0.8
Euler angles (0°, 123°, and 43.5°)
Pair number: 120
Intersection width: 40λ (λ=10 μm)
Reflector number (per side): 60
No electrode finger tilt angle Basic Data of Heretofore Known SAW Resonator
H: changes
G: zero
IDT line occupation rate ηi: 0.4
Reflector line occupation rate ηr: 0.3
Euler angles (0°, 123°, and 43.5°)
Pair number: 120
Intersection width: 40λ (λ=10 μm)
Reflector number (per side): 60
No electrode finger tilt angle When referring to FIGS. 50 and 52 in order to compare the characteristics of the SAW resonators, it can be understood how much higher is the Q of the SAW resonator 10 according to the embodiment. It can be supposed that this kind of high Q is due to an energy confinement effect, for the following reasons.

Figure 53:
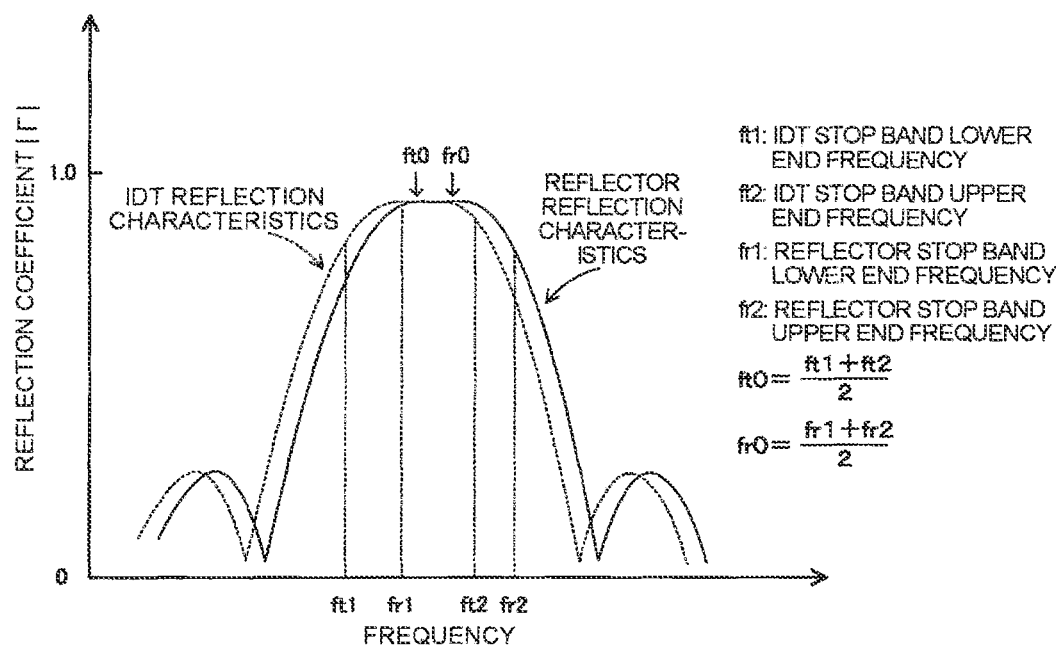
FIG. 53 is a diagram showing SAW reflection characteristics of the IDT and reflectors.

In order to efficiently confine the energy of a surface acoustic wave excited in the stop band upper end mode, a stop band upper end frequency ft2 of the IDT 12 should be set between a stop band lower end frequency fr1 of the reflectors 20 and a stop band upper end frequency fr2 of the reflectors 20, as in FIG. 53. That is, it should be set in such a way as to satisfy the relationship of

[Expression 47]

$$fr1 < ft2 < fr2 \qquad (32)$$

Because of this, a reflection coefficient Γ of the reflectors 20 at the stop band upper end frequency ft2 of the IDT 12 increases, and the stop band upper end mode SAW excited with the IDT 12 is reflected by the reflectors 20 to the IDT 12 side with a high reflection coefficient. Then, the stop band upper end mode SAW energy confinement becomes stronger, and it is possible to realize a low-loss resonator.

As opposed to this, in the event that the relationship between the stop band upper end frequency ft2 of the IDT 12 and the stop band lower end frequency fr1 of the reflectors 20 and stop band upper end frequency fr2 of the reflectors 20 is set to the condition of ft2<fr1, or the condition of fr2<ft2, the reflection coefficient Γ of the reflectors 20 at the stop band upper end frequency ft2 of the IDT 12 decreases, and it becomes difficult to realize a strong energy confinement condition.

Herein, in order to realize the condition of Equation (32), it is necessary to make a frequency shift of the stop band of the reflectors 20 to an area higher than the stop band of the IDT 12. Specifically, this can be realized by making the array cycle of the conductor strips 22 of the reflectors 20 shorter than that of the array cycle of the electrode fingers 18 of the IDT 12. Also, as other methods, it can be realized by making the thickness of the electrode film formed as the conductor strips 22 of the reflectors 20 less than the thickness of the electrode film formed as the electrode fingers 18 of the IDT 12, or by making the depth of the inter-conductor strip grooves of the reflectors 20 less than the depth of the inter-electrode finger grooves of the IDT 12. Also, a plurality of these methods may be employed in combination.

According to FIG. 50, it can be said that, apart from the high Q, it is possible to obtain a high figure of merit M. Also, FIG. 51 is a graph showing the relationship between an impedance Z and the frequency for the SAW resonator from which FIG. 50 is obtained. From FIG. 51, it can be seen that no unnecessary spurious response exists in the vicinity of the resonance point.

In the heretofore described embodiment, the IDT 12 configuring the SAW resonator 10 is shown in such a way that all the electrode fingers intersect alternately. However, the SAW resonator 10 according to the invention can also achieve a considerable advantage with only the quartz crystal substrate thereof. For this reason, even in the event that the electrode fingers 18 in the IDT 12 are thinned out, it is possible to achieve the same kind of advantage.

Also, regarding the grooves 32 too, they may be partially provided between the electrode fingers 18 and between the conductor strips 22 of the reflectors 20. In particular, as the central portion of the IDT 12, which has a high oscillatory displacement, has a dominant effect on the frequency-temperature characteristics, a structure may be adopted wherein the grooves 32 are provided only in that portion. With this kind of structure too, it is possible to achieve a SAW resonator 10 with good frequency-temperature characteristics.

Also, in the heretofore described embodiment, it is noted that Al or an Al-based alloy is used as the electrode film. However, the electrode film may be configured using another metal material, provided that it is a metal which can achieve the same advantage as the embodiment.

Also, although the heretofore described embodiment is a one-terminal pair SAW resonator in which only one IDT is provided, the invention is also applicable to a two-terminal pair SAW resonator in which a plurality of IDTs are provided, and is also applicable to a longitudinally coupled or transversally coupled double mode SAW filter or multiple mode SAW filter.

Figure 55A:
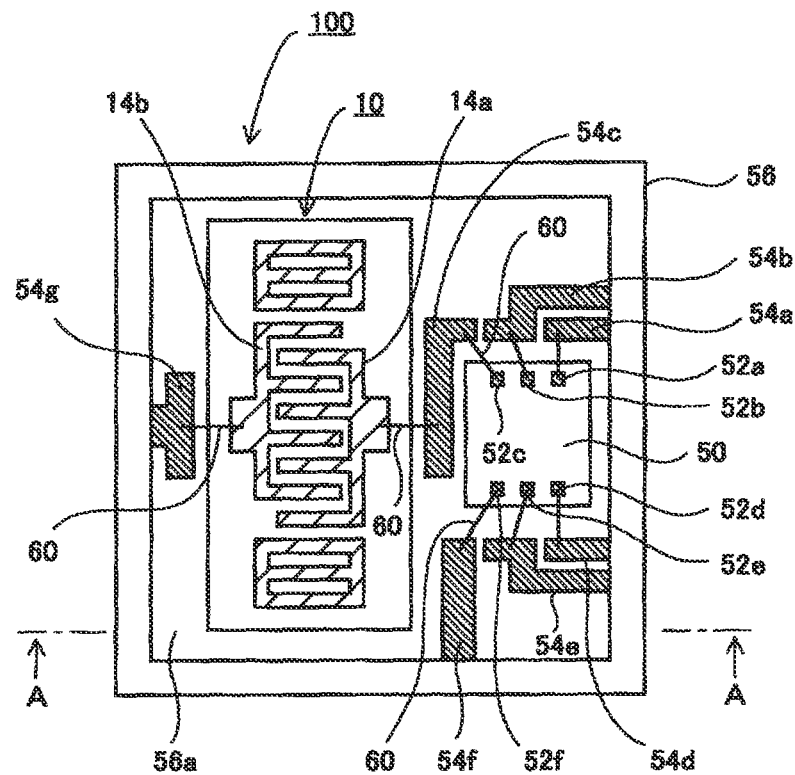
FIGS. 55A-55B are diagrams showing a configuration of a SAW oscillator according to the embodiment.
Figure 55B:
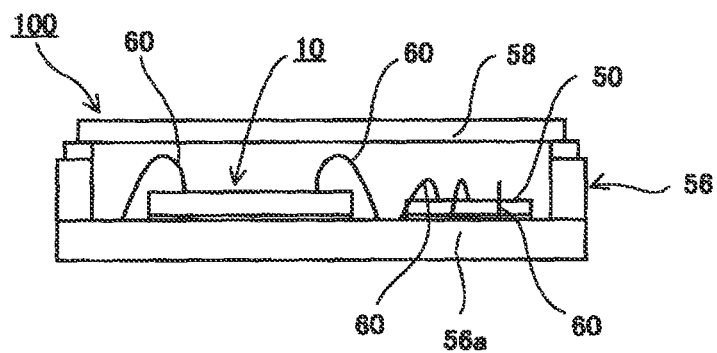

Next, a description will be given, referring to FIG. 55, of the SAW oscillator according to the invention. The SAW oscillator according to the invention, as shown in FIG. 55, is configured of the SAW resonator 10, an IC (integrated circuit) 50, which applies voltage to, and drive controls, the IDT 12 of the SAW resonator 10, and a package which houses them. In FIG. 55, FIG. 55(A) is a plan view with a lid removed, and FIG. 55(B) is a diagram showing a cross-section along A-A in FIG. 55(A).

In the SAW oscillator 100 according to the embodiment, the SAW resonator 10 and IC 50 are housed in the same package 56, and electrode patterns 54a to 54g formed on a bottom plate 56a of the package 56, and the pectinate electrodes 14a and 14b of the SAW resonator 10 and pads 52a to 52f of the IC 50, are connected by metal wires 60. Then, a cavity of the package 56 housing the SAW resonator 10 and IC 50 is hermetically sealed with a lid 58. By adopting this kind of configuration, it is possible to electrically connect the IDT 12 (refer to FIG. 1), the IC 50, and an unshown externally mounted electrode formed on the bottom surface of the package 56.

Therefore, in response to a demand for an expansion of operating temperature range and higher accuracy of internally mounted electronic devices, with the effect of internal heat generation increasing along with the miniaturization of blade servers and other packages, in addition to a higher reference clock frequency due to the speeding-up of information communication in recent years, and furthermore, in response to a market which needs long-term, stable operating in environments from low temperature to high temperature, such as wireless base stations installed outdoors, the SAW oscillator according to the invention is preferred, as it has extremely good frequency-temperature characteristics of a frequency fluctuation amount of approximately 20 (ppm) or less in its operating temperature range (service temperature range: −40° C. to +85° C.).

Furthermore, as the SAW resonator according to the invention, or SAW oscillator including the SAW resonator, realizes a significant improvement in frequency-temperature characteristics, it contributes largely to realizing a product with, as well as extremely good frequency-temperature characteristics, excellent jitter characteristics and phase noise characteristics, for example, a mobile telephone, a hard disc, a personal computer, a tuner receiving a BS and CS broadcast, an instrument processing a high frequency signal transmitted through a coaxial cable or an optical signal transmitted through an optical cable, or an electronic instrument such as a server network instrument or wireless communication instrument which needs a high frequency, high accuracy clock (low jitter, low phase noise) in a wide temperature range, and it goes without saying that it contributes greatly to further system reliability and quality improvement.

As heretofore described, as the SAW resonator according to the invention has inflection points within the operating temperature range (service temperature range: −40° C. to +85° C.), as shown in FIG. 48, it is possible to realize frequency-temperature characteristics which describe a tertiary curve, or an approximate tertiary curve, with an extremely small frequency fluctuation amount of approximately 20 ppm or less.

Figure 56A:
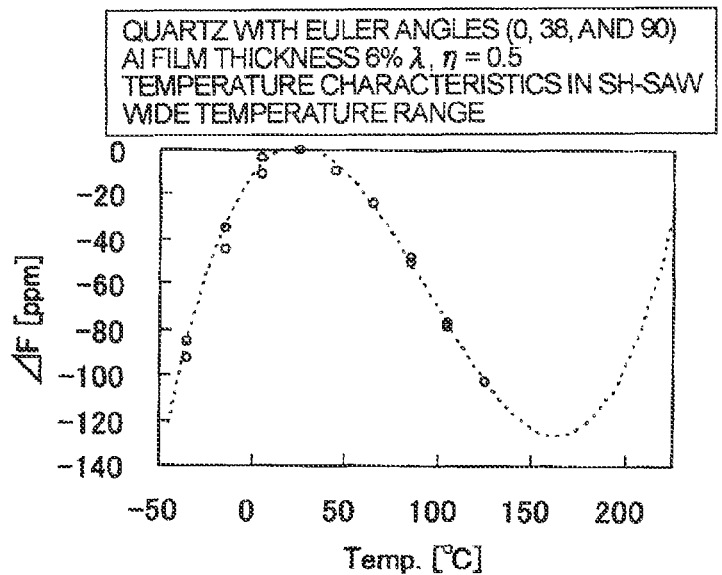
FIGS. 56A-56B are graphs showing frequency-temperature characteristics of a SAW resonator, where (A) is a graph showing the frequency-temperature characteristics of the SAW resonator disclosed in JP-A-2006-203408, and (B) is a graph showing a range of the frequency-temperature characteristics in an essential operating temperature range.
Figure 56B:
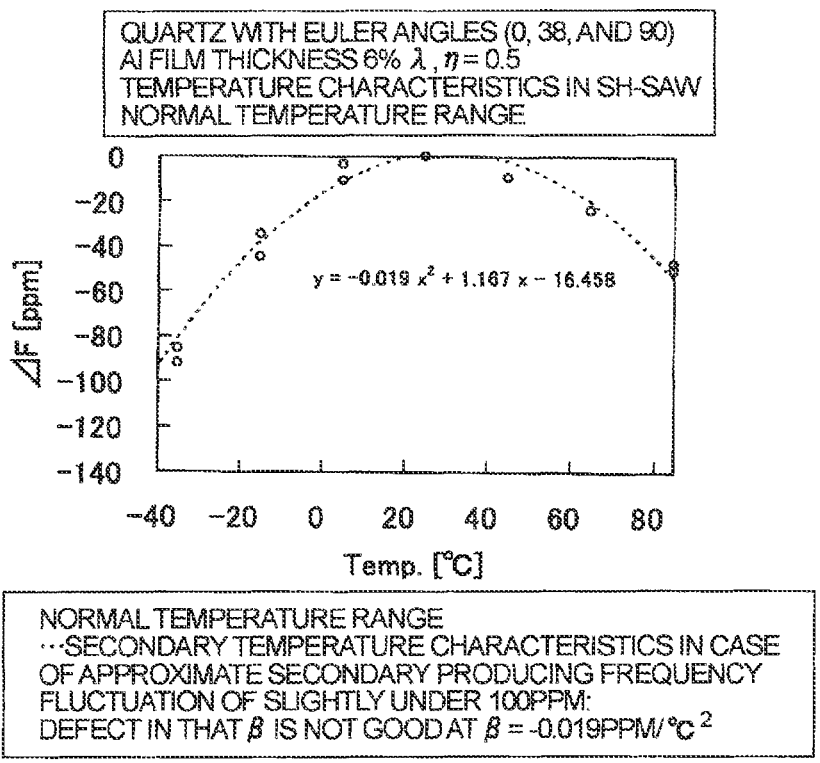

FIG. 56(A) is a graph showing the frequency-temperature characteristics of the SAW resonator disclosed in JP-A-2006-203408. Although the frequency-temperature characteristics describe a tertiary curve, as an inflection point exists in an area beyond the operating temperature range (service temperature range: −40° C. to +85° C.), as can be seen, it is essentially a quadratic curve which has an upwardly convex peak, as shown in FIG. 56(B). For this reason, the frequency fluctuation amount has an extremely high value of 100 (ppm).

As opposed to this, the SAW resonator according to the invention, with the frequency fluctuation amount describing a tertiary curve, or an approximate tertiary curve, within the operating temperature range, realizes a dramatic reduction of the frequency fluctuation amount. Changes in the frequency fluctuation amount within the operating range for a SAW resonator whose IDT and reflectors are covered in a protective film are shown in FIGS. 57 and 58.

Figure 57:
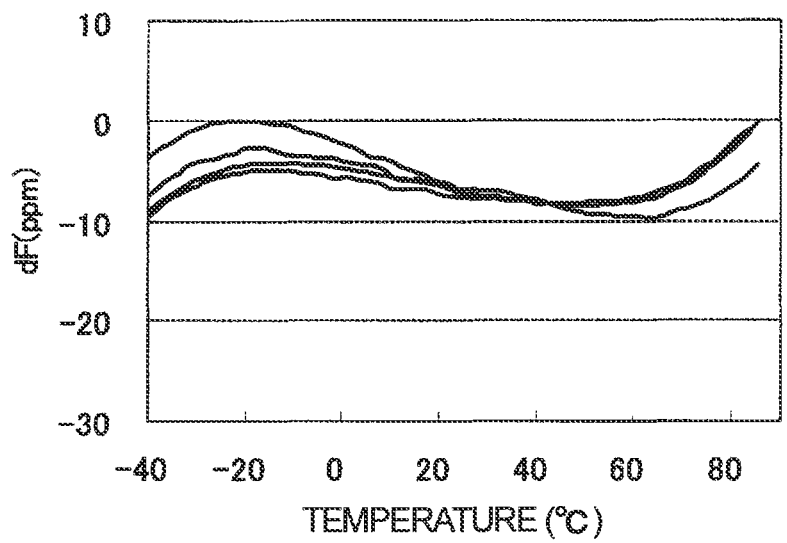
FIG. 57 is a graph showing changes in the frequency fluctuation amount in the operating range for a SAW resonator of which the IDT and reflectors are covered in alumina as a protective film.

The example shown in FIG. 57 is a diagram showing the frequency fluctuation amount within the operating temperature range when the electrodes are coated with alumina as a protective film. According to FIG. 57, it can be seen that it is possible to keep the frequency fluctuation amount within the operating temperature range at 10 (ppm) or less.

Basic Data of SAW Resonator According to Example Shown in FIG. 57
H: (material: aluminum): 2,000 (Å)
G: 4,700 (Å)
(H+G=0.067)
IDT line occupation rate ηi: 0.6
Reflector line occupation rate ηr: 0.8
In-plane rotation ST cut substrate with Euler angles (0°, 123°, and 43.5°)
Pair number: 120
Intersection width: 40λ (λ=10 (μm))
Reflector number (per side): 36
No electrode finger tilt angle
Protective film (alumina) thickness 400 (Å)
Secondary temperature coefficient β=+0.0007 (ppm/° C.$^2$)

Figure 58:
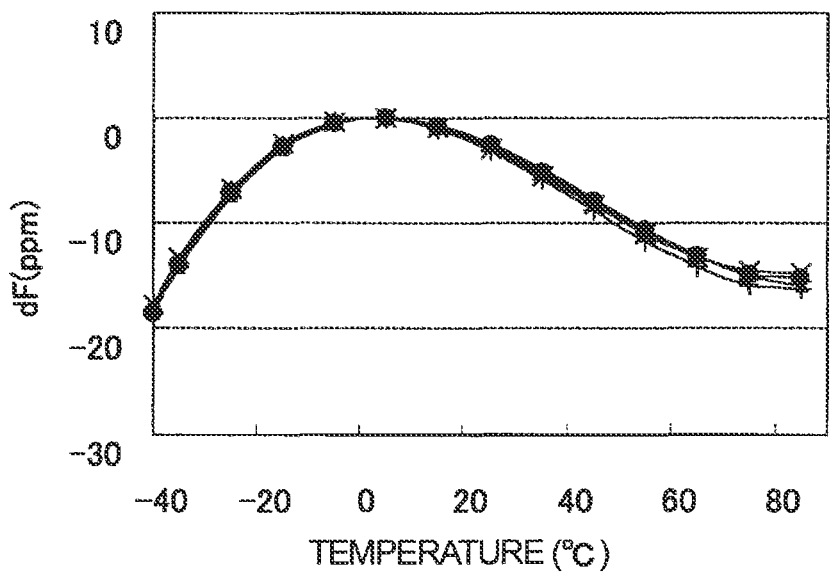
FIG. 58 is a graph showing changes in the frequency fluctuation amount in the operating range for a SAW resonator of which the IDT and reflectors are covered in $SiO_2$ as a protective film.

The example shown in FIG. 58 is a diagram showing the frequency fluctuation amount within the operating temperature range when the electrodes are coated with SiO$_2$ as a protective film. According to FIG. 58, it can be seen that it is possible to keep the frequency fluctuation amount within the operating temperature range at 20 (ppm) or less.

Basic Data of SAW Resonator According to Example Shown in FIG. 58
H: (material: aluminum): 2,000 (Å)
G: 4,700 (Å)
(H+G=0.067)
IDT line occupation rate ηi: 0.6
Reflector line occupation rate ηr: 0.8
In-plane rotation ST cut substrate with Euler angles (0°, 123°, and 43.5°)
Pair number: 120
Intersection width: 40λ (λ=10 (μm))
Reflector number (per side): 36
No electrode finger tilt angle
Protective film (SiO$_2$) thickness 400 (Å)
Secondary temperature coefficient β=+0.0039 (ppm/° C.$^2$)

The entire disclosure of Japanese Patent Application No. 2009-045359, filed Feb. 27, 2009 and Japanese Patent Application No. 2009-050112, filed Mar. 4, 2009 are expressly incorporated by reference herein.

The invention claimed is:

1. A surface acoustic wave resonator provided on a quartz crystal substrate with Euler angles (−1.5°≤φ≤1.5°, 117°≤θ≤142°, and 41.9°≤|ψ|≤49.57°), comprising:
    an interdigital transducer (IDT) that excites a stop band upper end mode surface acoustic wave; and
    an inter-electrode finger groove provided between electrode fingers configuring the IDT, wherein
    when a wavelength of the surface acoustic wave is λ, a first depth of the inter-electrode finger groove is G, a line occupation rate of the IDT is η, and an electrode film thickness of the IDT is H, λ, G, η and H satisfy the relationship of
0<H≤0.005λ,
0.01λ≤G≤0.09λ, and
0.18≤η≤0.71.

2. The surface acoustic wave resonator according to claim 1, wherein
    η further satisfies the relationship of 0.42≤η≤0.71.

3. The surface acoustic wave resonator according to claim 1, wherein
    η further satisfies the relationship of 0.18≤η≤0.59.

4. A surface acoustic wave resonator provided on a quartz crystal substrate with Euler angles (−1.5°≤φ≤1.5°, 117°≤θ≤142°, and 41.9°≤|ψ|≤49.57°), comprising:
    an interdigital transducer (IDT) that excites a stop band upper end mode surface acoustic wave; and
    an inter-electrode finger groove having a first depth provided between electrode fingers configuring the IDT, wherein
    when a secondary temperature coefficient β having a frequency temperature characteristic which shows a frequency change of a temperature of the surface acoustic wave resonator, β satisfies the relationship of |β|≤0.01 ppm/° C.$^2$.

5. The surface acoustic wave resonator according to claim 1, wherein
    when a stop band upper end mode frequency in the IDT is ft2, a stop band lower end mode frequency in reflectors disposed in such a way as to sandwich the IDT in a propagation direction of the surface acoustic wave is fr1, and a stop band upper end mode frequency of the reflectors is fr2, ft2, fr1, and fr2 satisfy the relationship of fr1<ft2<fr2.

6. The surface acoustic wave resonator according to claim 4, wherein
when a stop band upper end mode frequency in the IDT is ft2, a stop band lower end mode frequency in reflectors disposed in such a way as to sandwich the IDT in a propagation direction of the surface acoustic wave is fr1, and a stop band upper end mode frequency of the reflectors is fr2, ft2, fr1, and fr2 satisfy the relationship of fr1<ft2<fr2.

7. The surface acoustic wave resonator according to claim 1, further comprises
reflectors disposed in such a way as to sandwich the IDT in a propagation direction of the surface acoustic wave, and
an inter-conductor strip groove provided between conductor strips configuring the reflectors, wherein
a second depth of the inter-conductor strip groove is less than the first depth of the inter-electrode finger groove.

8. The surface acoustic wave resonator according to claim 4, further comprises
reflectors disposed in such a way as to sandwich the IDT in a propagation direction of the surface acoustic wave, and
an inter-conductor strip groove provided between conductor strips configuring the reflectors, wherein
a second depth of the inter-conductor strip groove is less than the first depth of the inter-electrode finger groove.

9. A surface acoustic wave oscillator comprising:
the surface acoustic wave resonator according to claim 1; and
an IC for driving the IDT.

10. A surface acoustic wave oscillator comprising:
the surface acoustic wave resonator according to claim 4; and
an IC for driving the IDT.

11. An electronic equipment comprising the surface acoustic wave resonator according to claim 1.

12. An electronic equipment comprising the surface acoustic wave resonator according to claim 4.

13. An electronic equipment comprising the surface acoustic wave oscillator according to claim 9.

14. An electronic equipment comprising the surface acoustic wave oscillator according to claim 10.

* * * * *